US006900881B2

(12) United States Patent
Sreenivasan et al.

(10) Patent No.: US 6,900,881 B2
(45) Date of Patent: May 31, 2005

(54) STEP AND REPEAT IMPRINT LITHOGRAPHY SYSTEMS

(75) Inventors: Sidlgata V. Sreenivasan, Austin, TX (US); Michael P. C. Watts, Austin, TX (US); Byung Jin Choi, Round Rock, TX (US); Mario J. Meissl, Austin, TX (US); Norman E. Schumaker, Austin, TX (US); Ronald D. Voisin, Fremont, CA (US)

(73) Assignee: Molecular Imprints, Inc., Austin, TX (US)

(*) Notice: Subject to any disclaimer, the term of this patent is extended or adjusted under 35 U.S.C. 154(b) by 234 days.

(21) Appl. No.: 10/194,414

(22) Filed: Jul. 11, 2002

(65) Prior Publication Data

US 2004/0008334 A1 Jan. 15, 2004

(51) Int. Cl.[7] .................... G03B 27/58; G03B 27/02; G03B 27/20
(52) U.S. Cl. .................... 355/72; 355/78; 355/87
(58) Field of Search .................... 355/72, 78, 87, 355/91; 396/428; 430/322, 324, 22, 30; 264/401; 427/458; 700/240

(56) References Cited

U.S. PATENT DOCUMENTS

| | | |
|---|---|---|
| 3,783,520 A | 1/1974 | King |
| 4,070,116 A | 1/1978 | Frosch et al. |
| 4,119,688 A | 10/1978 | Hiraoka |
| 4,201,800 A | 5/1980 | Alcorn et al. |
| 4,426,247 A | 1/1984 | Tamamura et al. |
| 4,451,507 A | 5/1984 | Beltz et al. |
| 4,507,331 A | 3/1985 | Hiraoka |
| 4,552,833 A | 11/1985 | Ito et al. |
| 4,600,309 A | 7/1986 | Fay |
| 4,610,442 A | 9/1986 | Oku et al. |
| 4,657,845 A | 4/1987 | Frechet et al. |
| 4,692,205 A | 9/1987 | Sachdev et al. |
| 4,707,218 A | 11/1987 | Giammarco et al. |
| 4,737,425 A | 4/1988 | Lin et al. |
| 4,763,886 A | 8/1988 | Takei |
| 4,808,511 A | 2/1989 | Holmes |
| 4,826,943 A | 5/1989 | Ito et al. |
| 4,848,911 A | 7/1989 | Uchida et al. |
| 4,857,477 A | 8/1989 | Kanamori |

(Continued)

FOREIGN PATENT DOCUMENTS

| | | |
|---|---|---|
| JP | 55-88332 | 12/1978 |
| JP | 57-7931 | 1/1982 |
| JP | 63-138730 | 12/1986 |
| JP | 02-24848 | 1/1990 |
| JP | 02-92603 | 4/1990 |
| WO | WO 00/21689 | 4/2000 |
| WO | WO 01/47003 A2 | 6/2001 |

OTHER PUBLICATIONS

Chou et al., "Imprint of Sub–25 nm vias and Trenches in Polymers", Applied Physics Letters, Nov. 20, 1995, pp. 3114–3116, vol. 67(21).

Chou et al., "Imprint Lithography with 25–Nanometer Resolution", Science, Apr. 5, 1996, pp. 85–87, vol. 272.

Chou et al., "Imprint Lithography with Sub–10nm Feature Size and High Throughput", Microelectronic Engineering, 1997, pp. 237–240, vol. 35.

(Continued)

Primary Examiner—Peter B. Kim
(74) Attorney, Agent, or Firm—Kenneteh C. Brooks

(57) ABSTRACT

Described are systems for patterning a substrate by imprint lithography. Imprint lithography systems include an imprint head configured to hold a template in a spaced relation to a substrate. The imprint lithography system is configured to dispense an activating light curable liquid onto a substrate or template. The system includes a light source that applies activating light to cure the activating light curable liquid.

84 Claims, 37 Drawing Sheets

U.S. PATENT DOCUMENTS

| | | | |
|---|---|---|---|
| 4,891,303 | A | 1/1990 | Garza et al. |
| 4,908,298 | A | 3/1990 | Hefferon et al. |
| 4,919,748 | A | 4/1990 | Bredbenner et al. |
| 4,921,778 | A | 5/1990 | Thackeray et al. |
| 4,931,351 | A | 6/1990 | McColgin et al. |
| 4,964,945 | A | 10/1990 | Calhoun |
| 4,976,818 | A | 12/1990 | Hashimoto et al. |
| 4,980,316 | A | 12/1990 | Huebner |
| 4,999,280 | A | 3/1991 | Hiraoka |
| 5,053,318 | A | 10/1991 | Gulla et al. |
| 5,071,694 | A | 12/1991 | Uekita et al. |
| 5,074,667 | A | 12/1991 | Miyatake |
| 5,108,875 | A | 4/1992 | Thackeray et al. |
| 5,148,036 | A | 9/1992 | Matsugu et al. |
| 5,148,037 | A | 9/1992 | Suda et al. |
| 5,151,754 | A | 9/1992 | Ishibashi et al. |
| 5,169,494 | A | 12/1992 | Hashimoto et al. |
| 5,173,393 | A | 12/1992 | Sezi et al. |
| 5,179,863 | A | 1/1993 | Uchida et al. |
| 5,198,326 | A | 3/1993 | Hashimoto et al. |
| 5,212,147 | A | 5/1993 | Sheats |
| 5,234,793 | A | 8/1993 | Sebald et al. |
| 5,240,878 | A | 8/1993 | Fitzsimmons et al. |
| 5,242,711 | A | 9/1993 | DeNatale et al. |
| 5,244,818 | A | 9/1993 | Jokerst et al. |
| 5,314,772 | A | 5/1994 | Kozicki et al. |
| 5,318,870 | A | 6/1994 | Hartney |
| 5,324,683 | A | 6/1994 | Fitch et al. |
| 5,328,810 | A | 7/1994 | Lowrey et al. |
| 5,330,881 | A | 7/1994 | Sidman et al. |
| 5,362,606 | A | 11/1994 | Hartney et al. |
| 5,366,851 | A | 11/1994 | Novembre |
| 5,374,454 | A | 12/1994 | Bickford et al. |
| 5,376,810 | A | 12/1994 | Hoenk et al. |
| 5,380,474 | A | 1/1995 | Rye et al. |
| 5,417,802 | A | 5/1995 | Obeng |
| 5,421,981 | A | 6/1995 | Leader et al. |
| 5,422,295 | A | 6/1995 | Choi et al. |
| 5,424,549 | A | 6/1995 | Feldman |
| 5,431,777 | A | 7/1995 | Austin et al. |
| 5,439,766 | A | 8/1995 | Day et al. |
| 5,453,157 | A | 9/1995 | Jeng |
| 5,458,520 | A | 10/1995 | DeMercurio et al. |
| 5,468,542 | A | 11/1995 | Crouch |
| 5,527,662 | A | 6/1996 | Hashimoto et al. |
| 5,654,238 | A | 8/1997 | Cronin et al. |
| 5,670,415 | A | 9/1997 | Rust |
| 5,700,626 | A | 12/1997 | Lee et al. |
| 5,736,424 | A | 4/1998 | Prybyla et al. |
| 5,743,998 | A | 4/1998 | Park |
| 5,747,102 | A | 5/1998 | Smith et al. |
| 5,760,500 | A | 6/1998 | Kondo et al. |
| 5,855,686 | A | 1/1999 | Rust |
| 5,895,263 | A | 4/1999 | Carter et al. |
| 5,907,782 | A | 5/1999 | Wu |
| 5,912,049 | A | 6/1999 | Shirley |
| 5,926,690 | A | 7/1999 | Toprac et al. |
| 5,948,219 | A | 9/1999 | Rohner |
| 5,948,570 | A | 9/1999 | Kornblit et al. |
| 6,033,977 | A | 3/2000 | Gutsche et al. |
| 6,035,805 | A | 3/2000 | Rust |
| 6,096,655 | A | 8/2000 | Lee et al. |
| 6,150,231 | A | 11/2000 | Muller et al. |
| 6,150,680 | A | 11/2000 | Eastman et al. |
| 6,245,581 | B1 | 6/2001 | Bonser et al. |
| 6,274,294 | B1 * | 8/2001 | Hines .................. 430/322 |
| 6,326,627 | B1 | 12/2001 | Putvinski et al. |
| 6,329,256 | B1 | 12/2001 | Ibok |
| 6,334,960 | B1 | 1/2002 | Willson et al. |
| 6,383,928 | B1 | 5/2002 | Eissa |
| 6,387,783 | B1 | 5/2002 | Furukawa et al. |
| 6,388,253 | B1 | 5/2002 | Su |
| 6,391,798 | B1 | 5/2002 | DeFelice et al. |
| 6,455,411 | B1 | 9/2002 | Jiang et al. |
| 6,482,742 | B1 | 11/2002 | Chou |
| 6,489,068 | B1 | 12/2002 | Kye |
| 6,514,672 | B2 | 2/2003 | Tsai et al. |
| 6,534,418 | B1 | 3/2003 | Plat et al. |
| 6,541,360 | B1 | 4/2003 | Lyons et al. |
| 6,561,706 | B2 | 5/2003 | Singh et al. |
| 6,565,928 | B2 | 5/2003 | Sakamoto et al. |
| 6,632,742 | B2 | 10/2003 | Yang et al. |
| 6,635,581 | B2 | 10/2003 | Wong |
| 6,646,662 | B1 | 11/2003 | Nebashi et al. |
| 6,677,252 | B2 | 1/2004 | Marsh |
| 6,703,190 | B2 | 3/2004 | Elian et al. |
| 6,716,767 | B2 | 4/2004 | Shih et al. |
| 6,730,256 | B1 | 5/2004 | Bloomstein et al. |
| 6,737,202 | B2 | 5/2004 | Gehoski et al. |
| 6,743,713 | B2 | 6/2004 | Mukherjee-Roy et al. |
| 6,676,983 | B2 | 7/2004 | Malfait |
| 6,770,852 | B1 | 8/2004 | Steger |
| 6,776,094 | B1 | 8/2004 | Whitesides et al. |
| 6,777,170 | B1 | 8/2004 | Bloomstein et al. |
| 2002/0132482 | A1 | 9/2002 | Chou |
| 2002/0167117 | A1 | 11/2002 | Chou |
| 2003/0080471 | A1 | 5/2003 | Chou |
| 2003/0081193 | A1 | 5/2003 | White et al. |
| 2003/0113638 | A1 | 6/2003 | Mancini et al. |
| 2003/0129542 | A1 | 7/2003 | Shih et al. |
| 2004/0029041 | A1 | 2/2004 | Shih et al. |
| 2004/0036201 | A1 | 2/2004 | Chou et al. |

OTHER PUBLICATIONS

Kim et al., "High Precision Magnetic Levitation Stage for Photolithography", Precision Engineering, 1998, pp. 66–77, vol. 22, Elsevier Science Inc., 655 Avenue of the Americas, NY, NY 10010.

Choi et al., "High Precision Orientation Alignment and Gap Control Stages for Imprint Lithography Processes," U.S. Appl. No. 09/698,317, Filed Oct. 27, 2000.

Sreenivasan et al., "High–Resolution Overlay Alignment Methods and Systems for Imprint Lithography," U.S. Appl. No. 09/907,512, Filed Jul. 16, 2001.

Choi et al., "Method and System of Automatic Fluid Dispensing for Imprint Lithography Processes," U.S. Appl. No. 09/908,455, Filed Jul. 17, 2001.

Choi et al., "Methods for High–Precision Gap and Orientation Sensing Between a Transparent Template and Substrate for Imprint Lithography," U.S. Appl. No. 09/920,341, Filed Aug. 1, 2001.

Choi et al., "Flexture Based Macro Motion Translation Stage," U.S. Appl. No. 09/934,248, Filed Auguts 21, 2001.

Bailey et al., "Template for Room Temperature Low Pressure Micro–and Nano–Imprint Lithography,", U.S. Appl. No. 09/976,681, Filed Oct. 12, 2001.

Voisin, "Methods of Manufacturing a Lithography Template," U.S. Appl. No. 10/136,188, Filed May 1, 2002.

Willson et al., "Method and System for Fabricating Nanoscale Patterns in Light Curable Compositions Using an Electric Field," U.S. Appl. No. 09/905,718, Filed May 16, 2002.

Watts et al., "Low Viscosity High Resolution Patterning Material," U.S. Appl. No. 10/178,947, Filed Jun. 24, 2002.

Watts et al., "System and Method for Dispensing Liquids," U.S. Appl. No. 10/191,749, Filed Jul. 9, 2002.

Sreenivasan et al., "Step and Repeat Imprint Lithography Processes," U.S. Appl. No. 10/194,991, Filed Jul. 11, 2002.

Sreenivasan et al., "Method and System for Imprint Lithography Using an Electric Field," U.S. Appl. No. 10/194,410, Filed Jul. 11, 2002.

Abstract of Japanese Patent 63–138730.

Abstract of Japanese Patent 55–88332.

Abstract of Japanese Patent 57–7931.

Abstract of Japanese Patent 02–92603.

Translation of Japanese Patent 02–92603.

Abstract of Japanese Patent 02–24848.

Translation of Japanese Patent 02–24848.

Heidari et al., "Nanoimprint Lithography at the 6 in. Wafer Scale," Journal of Vacuum Science Technology, Nov/Dec 2000, pp. 3557–3560, vol. 8, No. 18(6).

Nerac.Com Retro Search, "Reduction of Dimension of Contact Holes", Aug. 31, 2004.

Nerac.Com Retro Search, "Trim Etching of Features Formed on an Organic Layer", Sep. 2, 2004.

Nerac.Com Retro Search, "Multi–Layer Resists", Sep. 2, 2004.

Hu et al., "Flourescence Probe Technicques (FPT) for Measuring the Relative Efficiencies of Free–Radical Photoinitiators", s0024–9297(97)01390–9;"Macromolecules" 1998, vol. 31, No. 13 , pp. 4107–4113, 1998 American Chemical Society, Published on Web May 29, 1998.

Feynman, Richard P., "There's Plenty of Room at the Bottom—An Invitation to Enter a New Field of Physics," 12 pp [online] Retreived Sep. 23, 2004 from URI:http://www.zyvec.com/nanotech/feynman.html.

CIBA Specialty Chemicals Business Line Coatings, "What is UV Curing?", 45 pp [online] Retreived Sep. 24, 2004 from URL:http//www.cibasc.com/Image.asp?id=4040.

Communication Relating to the Results of the Partial International Search; International Appl. No. PCT/US2002/015551.

Papirer et al., "The Graftijng of Perfluorinated Silanes onto the Surface of Silica: Characterization by Inverse Gas Chromatography," Aug. 1993, pp238–242, vol. 159, Issue 1.

Abstract of Parirer et al., "The Graftijng of Perfluorinated Silanes onto the Surface of Silica: Characterization by Inverse Gas Chromatography," Aug. 1993, pp238–242, vol. 159, Issue 1.

Hirai et al., "Mold Surface Treatment for Imprint Lithography," Aug. 2001, pp 457–462, vol 14, No. 3.

Abstract of Hirai et al., "Mold Surface Treatment for Imprint Lithography," Aug. 2001, pp 457–462, vol 14, No. 3.

Sung et al., "Micro/nano–tribological Characteristics of Self–Assembled Monoloayer and its Application in Nano–Structure Fabrication," Jul. 2003, pp. 808–818, vol. 255, No. 7.

Abstract of Sung et al., "Micro/nano–tribological Characteristics of Self–Assembled Monoloayer and its Application in Nano–Structure Fabrication," Jul. 2003, pp. 808–818, vol. 255, No. 7.

Roos et al., "Nanoimprint Lithography with a Commercial 4 Inch Bond System for Hot Embossing," Oct. 2001, pp. 427–435, vol. 4343.

Abstract of Roos et al., "NanoImprint Lithography with a Commerical 4 Inch Bond System for Hot Embossing," Oct. 2001, pp. 427–435, vol. 4343.

* cited by examiner

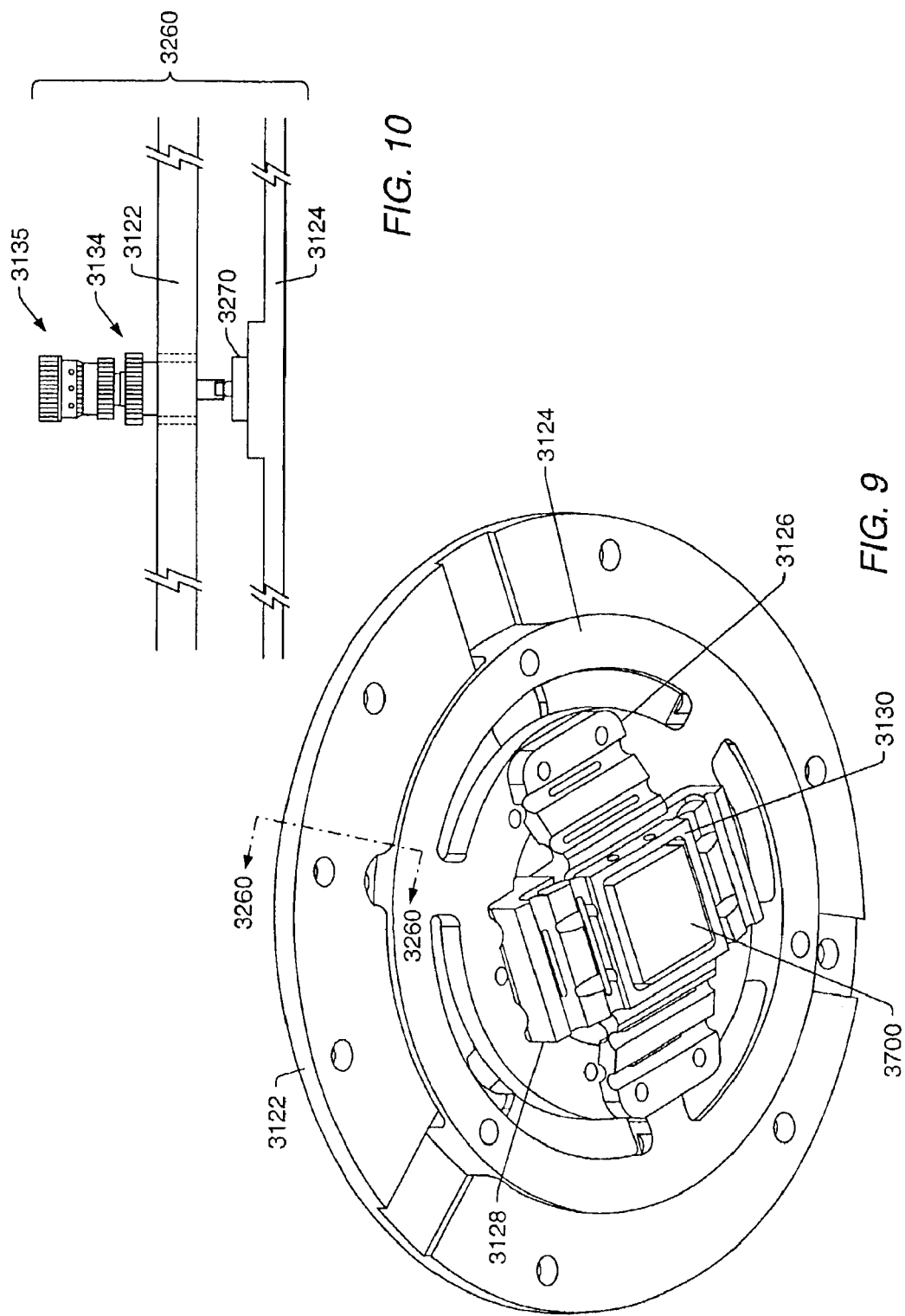

STEP AND REPEAT IMPRINT LITHOGRAPHY SYSTEMS

BACKGROUND OF THE INVENTION

1. Field of the Invention

Embodiments presented herein relate to methods and systems for imprint lithography. More particularly, embodiments relate to methods and systems for micro- and nano-imprint lithography processes.

2. Description of the Relevant Art

Optical lithography techniques are currently used to make most microelectronic devices. However, it is believed that these methods are reaching their limits in resolution. Sub-micron scale lithography has been a critical process in the microelectronics industry. The use of sub-micron scale lithography allows manufacturers to meet the increased demand for smaller and more densely packed electronic circuits on chips. It is expected that the microelectronics industry will pursue structures that are as small or smaller than about 50 nm. Further, there are emerging applications of nanometer scale lithography in the areas of opto-electronics and magnetic storage. For example, photonic crystals and high-density patterned magnetic memory of the order of terabytes per square inch may require sub-100 nanometer scale lithography.

For making sub-50 nm structures, optical lithography techniques may require the use of very short wavelengths of light (e.g., about 13.2 nm). At these short wavelengths, many common materials are not optically transparent and therefore imaging systems typically have to be constructed using complicated reflective optics. Furthermore, obtaining a light source that has sufficient output intensity at these wavelengths is difficult. Such systems lead to extremely complicated equipment and processes that may be prohibitively expensive. It is also believed that high-resolution e-beam lithography techniques, though very precise, are too slow for high-volume commercial applications.

Several imprint lithography techniques have been investigated as low cost, high volume manufacturing alternatives to conventional photolithography for high-resolution patterning. Imprint lithography techniques are similar in that they use a template containing topography to replicate a surface relief in a film on the substrate. One form of imprint lithography is known as hot embossing.

Hot embossing techniques face several challenges: i) pressure greater than 10MPa are typically required to imprint relief structures, ii) temperatures must be greater than the $T_g$ of the polymer film, iii) patterns (in the substrate film) have been limited to isolation trenches or dense features similar to repeated lines and spaces. Hot embossing is unsuited for printing isolated raised structures such as lines and dots. This is because the highly viscous liquids resulting from increasing the temperature of the substrate films require extremely high pressures and long time durations to move the large volume of liquids needed to create isolated structures. This pattern dependency makes hot embossing unattractive. Also, high pressures and temperatures, thermal expansion, and material deformation generate severe technical challenges in the development of layer-to-layer alignment at the accuracies needed for device fabrication.

SUMMARY OF THE INVENTION

In one embodiment, a patterned layer is formed by curing a curable liquid disposed on a substrate in the presence of a patterned template. In an embodiment, a system for forming a patterned layer on a substrate includes an imprint head and a motion stage. The imprint head is configured to hold a patterned template. The imprint head also includes a fine orientation system. The fine orientation system allows motion of the patterned template with respect to a substrate to achieve a substantially parallel orientation of the patterned template. In one embodiment, the fine orientation system is a passive system that allows the template to self-correct for non-planarity when the template contacts a liquid disposed on the substrate. The imprint head further includes a force detector. The force detector is coupled to the template and is configured to determine a resistive force applied to the template by the curable liquid disposed on the substrate. The substrate is coupled to a motion stage. The motion stage is configured to support the substrate and to move the substrate in a plane substantially parallel to the template. The imprint lithography system also includes a liquid dispenser. The liquid dispenser may be coupled to the imprint head or a portion of the system body. The liquid dispenser is configured to dispense an activating light curable liquid onto the substrate. The imprint lithography system also includes a light source optically coupled to the patterned template. The light source is configured to direct activating light through the patterned template and onto the curable liquid during use.

Imprint lithography systems for forming features having a feature size below 100 nm are typically sensitive to changes in temperature. As the temperature of the system increases, the supports (i.e., components that support the template, substrate and other components of the imprint lithography system) may expand. Expansion of the supports may contribute to errors due to misalignment of the template with the substrate. In one embodiment, supports are formed from a material that has a low coefficient of thermal expansion (e.g., less than about 20 ppm/° C.). In addition, the imprint lithography system may be placed in an enclosure. The enclosure is configured to inhibit temperature variations of greater than about 1° C. within the enclosure.

In an alternate embodiment, an imprint lithography system includes an imprint head, a motion stage, a liquid dispenser, a force detector and an activating light source. In this embodiment, a fine orientation system is coupled to the motion stage instead of the imprint head. Thus, fine orientation is achieved by altering the orientation of the substrate until the portion of the substrate to be imprinted and the template are substantially parallel. In this embodiment, imprint head is coupled to a support in a fixed position, while motion stage is configured to move a substrate about an X-Y plane under the template. The other components of the imprint lithography system are substantially the same as described previously for other embodiments.

In another embodiment, an imprint lithography system includes an imprint head, a motion stage, a substrate support, a liquid dispenser, a force detector and an activating light source. The imprint head is configured to hold a patterned template. The imprint head also includes a fine orientation system. In one embodiment, the fine orientation system is a passive system that allows the template to self-correct for non-planarity when the template contacts a liquid disposed on the substrate. The imprint head is coupled to a motion stage. The motion stage is configured to move the imprint head in a plane substantially parallel to the substrate. The substrate is coupled to a substrate support. Substrate support is configured to hold the substrate in a fixed position during use. The other components of the imprint lithography system are substantially the same as described previously for other embodiments.

In another embodiment, an imprint lithography system includes an imprint head, a motion stage, a substrate support, a liquid dispenser, a force detector and an activating light source. The imprint head is configured to hold a patterned template. The imprint head is coupled to a motion stage. The motion stage is configured to move the imprint head in a plane substantially parallel to the substrate. The substrate is coupled to a substrate support. Substrate support is configured to hold the substrate in a fixed position during use. Substrate support also includes a fine orientation system. The fine orientation system is configured to alter the orientation of the substrate until the portion of the substrate to be imprinted and the template are substantially parallel. The other components of the imprint lithography system are substantially the same as described previously for other embodiments.

In some embodiments, a patterned template may be designed to allow improved liquid control. When a template is brought into contact with a liquid disposed on a substrate, the liquid will tend to expand to cover a larger area of the substrate than the liquid originally covered. In some processes it is advantageous that the liquid remains within an area defined by the template. Proper design of a template will, in some embodiments, inhibit flow of liquid substantially beyond a perimeter of the template. A patterned template includes a first surface and a plurality of recesses formed in one or more patterning areas of the template extending from the first surface toward an opposed second surface. The recesses define a plurality of features that are to be imprinted onto the substrate. The template also includes a border formed about the perimeter of the patterning areas. The border is formed as a recess that extends from the first surface toward the second surface. The depth of the border is substantially greater than the depth of the recesses that define the features of the template. Patterned templates that include borders may be used in any of the herein described systems.

During use, the template is brought into contact with a curable liquid disposed on the surface of the substrate. The force applied to the substrate by the template may cause the substrate to tilt, particularly when the template is positioned near an edge of the substrate. In one embodiment, the substrate is coupled to a substrate support that includes a substrate tilt module. The substrate tilt module is configured to calibrate the tilt of the substrate surface during use. Additionally, the substrate tilt module is configured to inhibit tilt of the substrate due to compliance of the tilt module when pressure is exerted on the substrate. The substrate tilt module may be incorporated into either a motion stage that allows motion of the substrate during use or a fixed substrate support.

BRIEF DESCRIPTION OF THE DRAWINGS

Other objects and advantages of the invention will become apparent upon reading the following detailed description and upon reference to the accompanying drawings in which:

FIG. 9 depicts a projection view of a fine orientation system coupled to a pre-calibration system of an imprint head;

FIG. 10 depicts a cross-sectional view of a pre-calibration system;

Figure 1:
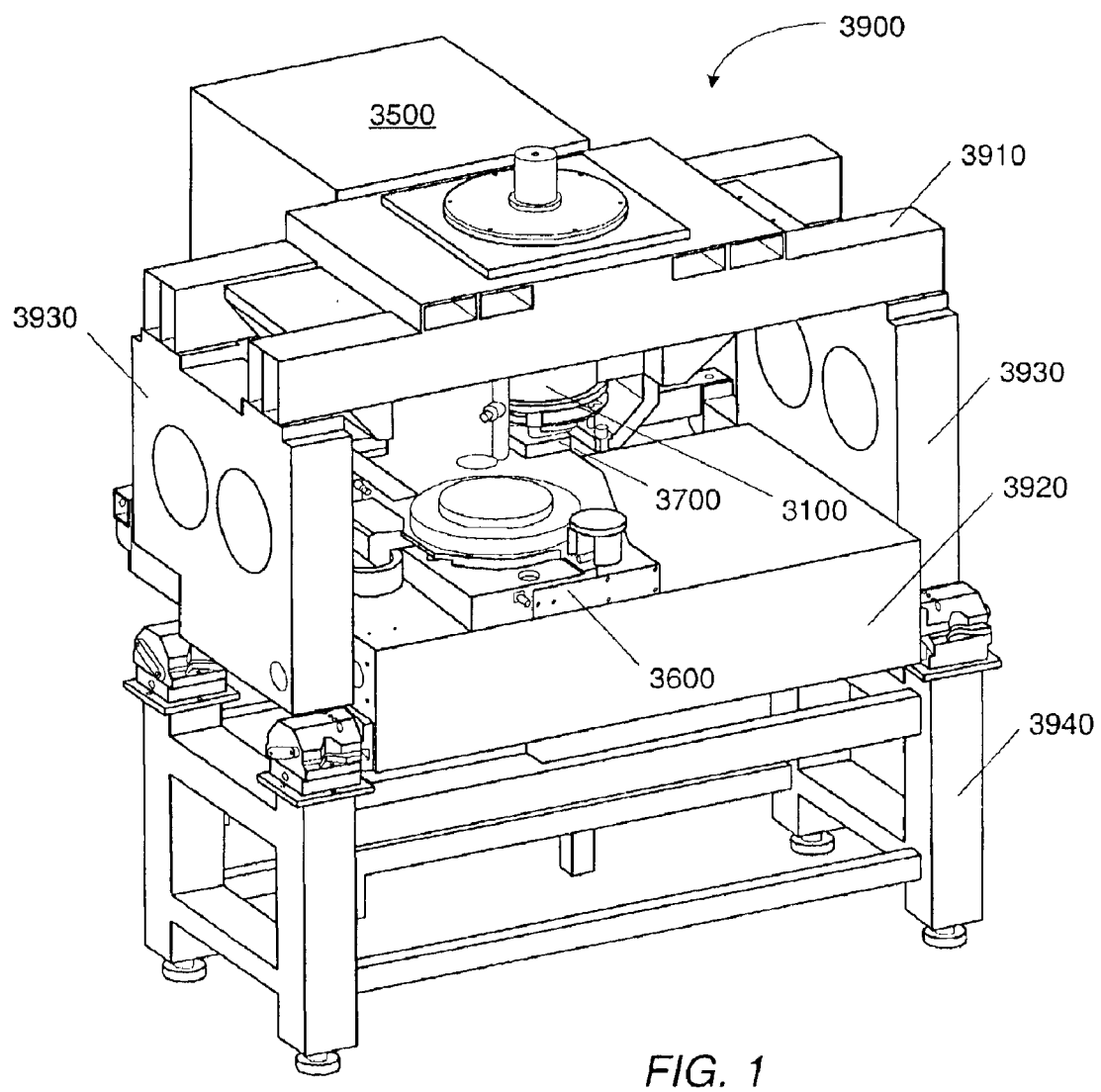
FIG. 1 depicts an embodiment of a system for imprint lithography.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Embodiments presented herein generally relate to systems, devices, and related processes of manufacturing small devices. More specifically, embodiments presented herein relate to systems, devices, and related processes of imprint lithography. For example, these embodiments may be used for imprinting sub 100 features on a substrate, such as a semiconductor wafer. It should be understood that these embodiments may also be used to manufacture other kinds of devices including, but not limited to: patterned magnetic media for data storage, micro-optical devices, micro-electromechanical system, biological testing devices, chemical testing and reaction devices, and X-ray optical devices.

Imprint lithography processes have demonstrated the ability to replicate high-resolution (sub-50 nm) images on substrates using templates that contain images as topography on their surfaces. Imprint lithography may be used in patterning substrates in the manufacture of microelectronic devices, optical devices, MEMS, opto-electronics, patterned magnetic media for storage applications, etc. Imprint lithography techniques may be superior to optical lithography for making three-dimensional structures such as micro lenses and T-gate structures. Components of an imprint lithography system, including the template, substrate, liquid and any other materials that may affect the physical properties of the system, including but not limited to surface energy, interfacial energies, Hamacker constants, Van der Waals'0 forces, viscosity, density, opacity, etc., are engineered to properly accommodate a repeatable process.

Methods and systems for imprint lithography are discussed in U.S. Pat. No. 6,334,960 to Willson et al. entitled "Step and Flash Imprint Lithography" which is incorporated herein by reference. Additional methods and systems for imprint lithography are further discussed in U.S. Patent Applications: U.S. Ser. No. 09/908,455 filed Jul. 17, 2001, entitled "Method and System of Automatic Fluid Dispensing for Imprint Lithography Processes"; U.S. Ser. No. 09/907,512 filed Jul. 16, 2001 entitled "High-Resolution Overlay Alignment Methods and Systems for Imprint Lithography"; U.S. Ser. No. 09/920,341 filed Aug. 1, 2001 entitled "Methods for High-Precision Gap Orientation Sensing Between a Transparent Template and Substrate for Imprint Lithography"; U.S. Ser. No. 09/934,248 filed Aug. 21, 2001 entitled "Flexure Based Macro Motion Translation Stage"; U.S. Ser. No. 09/698,317 filed Oct. 27, 2000 entitled "High-Precision Orientation Alignment and Gap Control Stages for Imprint Lithography Processes"; U.S. Ser. No. 09/976,681 filed Oct. 12, 2001 entitled "Template Design for Room Temperature, Low Pressure Micro- and Nano-Imprint Lithography"; U.S. Ser. No. 10/136,188 filed May 1, 2002 entitled "Methods of Manufacturing a Lithography Template" to Voison; and U.S. patent application entitled "Method and System for Fabricating Nanoscale Patterns in Light Curable Compositions Using an Electric Field to Willson, et al. filed May 16, 2001 all of which are incorporated herein by reference. Further methods and systems are discussed in the following publications, all of which are incorporated herein by reference, "Design of Orientation Stages for Step and Flash Imprint Lithography," B. J. Choi, S. Johnson, M. Colburn, S. V. Sreenivasan, C. G. Willson, To appear in J. of Precision Engineering; "Large area high density quantized magnetic disks fabricated using nanoimprint lithography," W. Wu, B. Cui, X. Y. Sun, W. Zhang, L. Zhunag, and S. Y. Chou., J. Vac Sci Technol B 16 (6) 3825–3829 November-December 1998; "Lithographically-induced Self-assembly of Periodic Polymer Micropillar Arrays," S. Y. Chou, L. Zhuang, J Vac Sci Tech B 17 (6), 3197–3202, 1999 and "Large Area Domain Alignment in Block Copolymer Thin Films Using Electric Fields," P. Mansky, J. DeRouchey, J. Mays, M. Pitsikalis, T. Morkved, H. Jaeger and T. Russell, Macromolecules 13, 4399 (1998).

System for Imprint Lithography
Overall System Description

FIG. 1 depicts an embodiment of a system for imprint lithography 3900. System 3900 includes an imprint head 3100. Imprint head 3100 is mounted to an imprint head support 3910. Imprint head 3100 is configured to hold a patterned template 3700. Patterned template 3700 includes a plurality of recesses that define a pattern of features to be imprinted into a substrate. Imprint head 3100 or motion stage 3600 is further configured to move patterned template 3700 toward and away from a substrate to be imprinted during use. System 3900 also includes a motion stage 3600. Motion stage 3600 is mounted to motion stage support 3920. Motion stage 3600 is configured to hold a substrate and move the substrate in a generally planar motion about motion stage support 3920. System 3900 further includes a curing light system 3500 coupled to imprint head 3100. Activating light system 3500 is configured to produce a curing light and direct the produced curing light through patterned template 3700 coupled to imprint head 3100. Curing light includes light at an appropriate wavelength to cure a polymerizable liquid. Curing light includes ultraviolet light, visible light, infrared light, x-ray radiation and electron beam radiation.

Imprint head support 3910 is coupled to motion stage support 3920 by bridging supports 3930. In this manner imprint head 3100 is positioned above motion stage 3600. Imprint head support 3910, motion stage support 3920 and bridging supports 3930 are herein collectively referred to as the system "body." The components of the system body may be formed from thermally stable materials. Thermally stable materials have a thermal expansion coefficient of less than about 10 ppm deg. C. at about room temperature (e.g. 25 deg C.). In some embodiments, the material of construction may have a thermal expansion coefficient of less than about 10 ppm deg. C., or less than 1 ppm deg. C. Examples of such materials include silicon carbide, certain alloys of iron, including but not limited to: certain alloys of steel and nickel (e.g., alloys commercially available under the name INVAR®), and certain alloys of steel, nickel and cobalt (e.g., alloys commercially available under the name SUPER INVAR™). Additional examples of such materials include certain ceramics, including but not limited to: ZERODUR® ceramic. Motion stage support 3920 and bridging supports 3930 are coupled to a support table 3940. Support table 3940 provides a substantially vibration free support for the components of system 3900. Support table 3940 isolates system 3900 from ambient vibrations (e.g., due to works, other machinery, etc.). Motion stages and vibration isolation support tables are commercially available from Newport Corporation of Irvine, Calif.

As used herein, the "X-axis" refers to the axis that runs between bridging supports 3930. As used herein the "Y-axis" refers to the axis that is orthogonal to the X-axis. As used herein the "X-Y plane" is a plane defined by the X-axis and the Y-axis. As used herein the "Z-axis" refers to an axis running from motion stage support 3920 to imprint head support 3910, orthogonal to the X-Y plane. Generally an imprint process involves moving the substrate, or the imprint head, along an X-Y plane until the proper position of the substrate with respect to the patterned template is achieved. Movement of the template, or motion stage, along the Z-axis, will bring the patterned template to a position that allows contact between the patterned template and a liquid disposed on a surface of the substrate.

Figure 2:
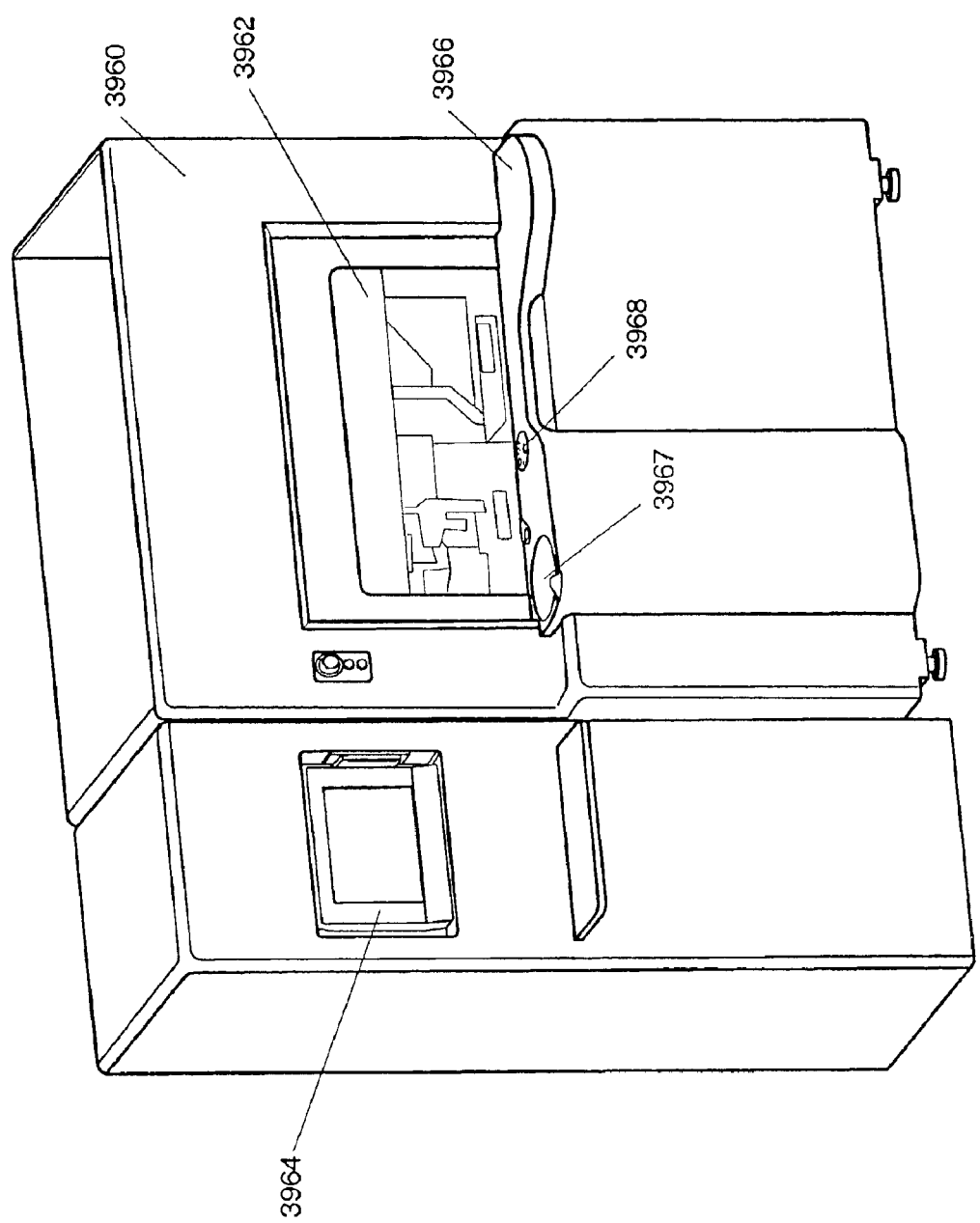
FIG. 2 depicts an imprint lithography system enclosure.

System 3900 may be placed in an enclosure 3960, as depicted in FIG. 2. Enclosure 3960 encompasses imprint lithography system 3900 and provides a thermal and air barrier to the lithography components. Enclosure 3960 includes a movable access panel 3962 that allows access to the imprint head and motion stage when moved to an "open" position, as depicted in FIG. 2. When in a "closed" position, the components of system 3900 are at least partially isolated from the room atmosphere. Access panel 3962 also serves as a thermal barrier to reduce the effects of temperature changes within the room on the temperature of the components within enclosure 3960. Enclosure 3960 includes a temperature control system. A temperature control system is used to control the temperature of components with enclosure 3960. In one embodiment, temperature control system is configured to inhibit temperature variations of greater than about 1° C. within enclosure 3960. In some embodiments, a temperature control system inhibits variations of greater than about 0.1° C. In one embodiment, thermostats or other temperature measuring devices in combination with one or more fans may be used to maintain a substantially constant temperature with enclosure 3960.

Various user interfaces may also be present on enclosure 3960. A computer controlled user interface 3964 may be coupled to enclosure 3960. User interface 3964 may depict the operating parameters, diagnostic information, job progress and other information related to the functioning of the enclosed imprint system 3900. User interface 3964 may also be configured to receive operator commands to alter the operating parameters of system 3900. A staging support 3966 may also be coupled to enclosure 3960. Staging support 3966 is used by an operator to support substrates, templates and other equipment during an imprint lithography process. In some embodiments, staging support 3966 may include one or more indentations 3967 configured to hold a substrate (e.g., a circular indentation for a semiconductor wafer). Staging support 3966 may also include one or more indentations 3968 for holding a template.

Additional components may be present depending on the processes that the imprint lithography system is designed to implement. For example, for semiconductor processing equipment including, but not limited to, an automatic wafer loader, an automatic template loader and an interface to a cassette loader (all not shown) may be coupled to imprint lithography system 3900.

Imprint Head

Figure 3:
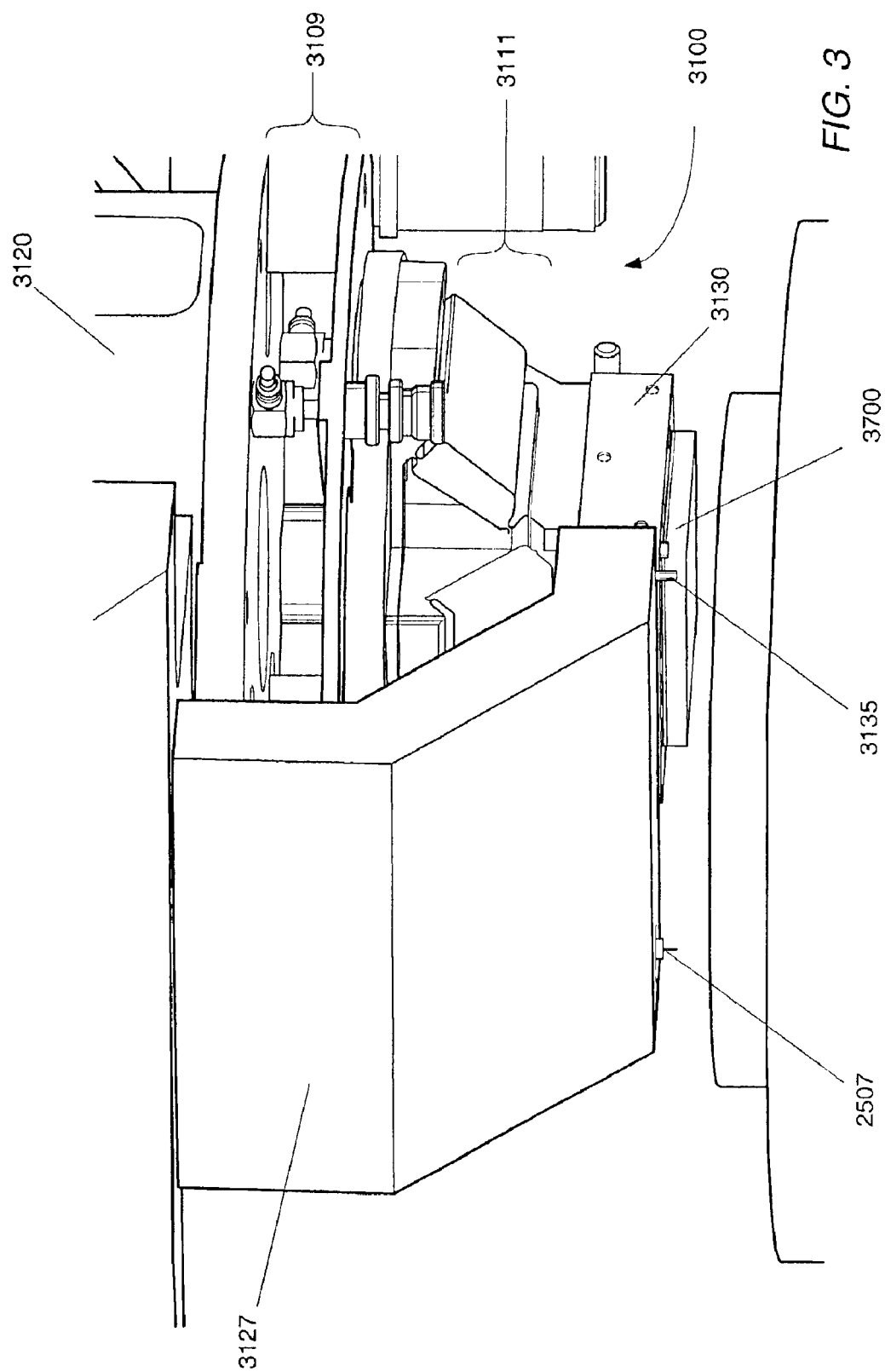
FIG. 3 depicts an embodiment of an imprint lithography head coupled to an imprint lithography system.

FIG. 3 depicts an embodiment of a portion of an imprint head 3100. Imprint head 3100 includes a pre-calibration system 3109 and a fine orientation system 3111 coupled to the pre-calibration system. Template support 3130 is coupled to fine orientation system 3111. Template support 3130 is designed to support and couple a template 3700 to fine orientation system 3111.

Figure 4:
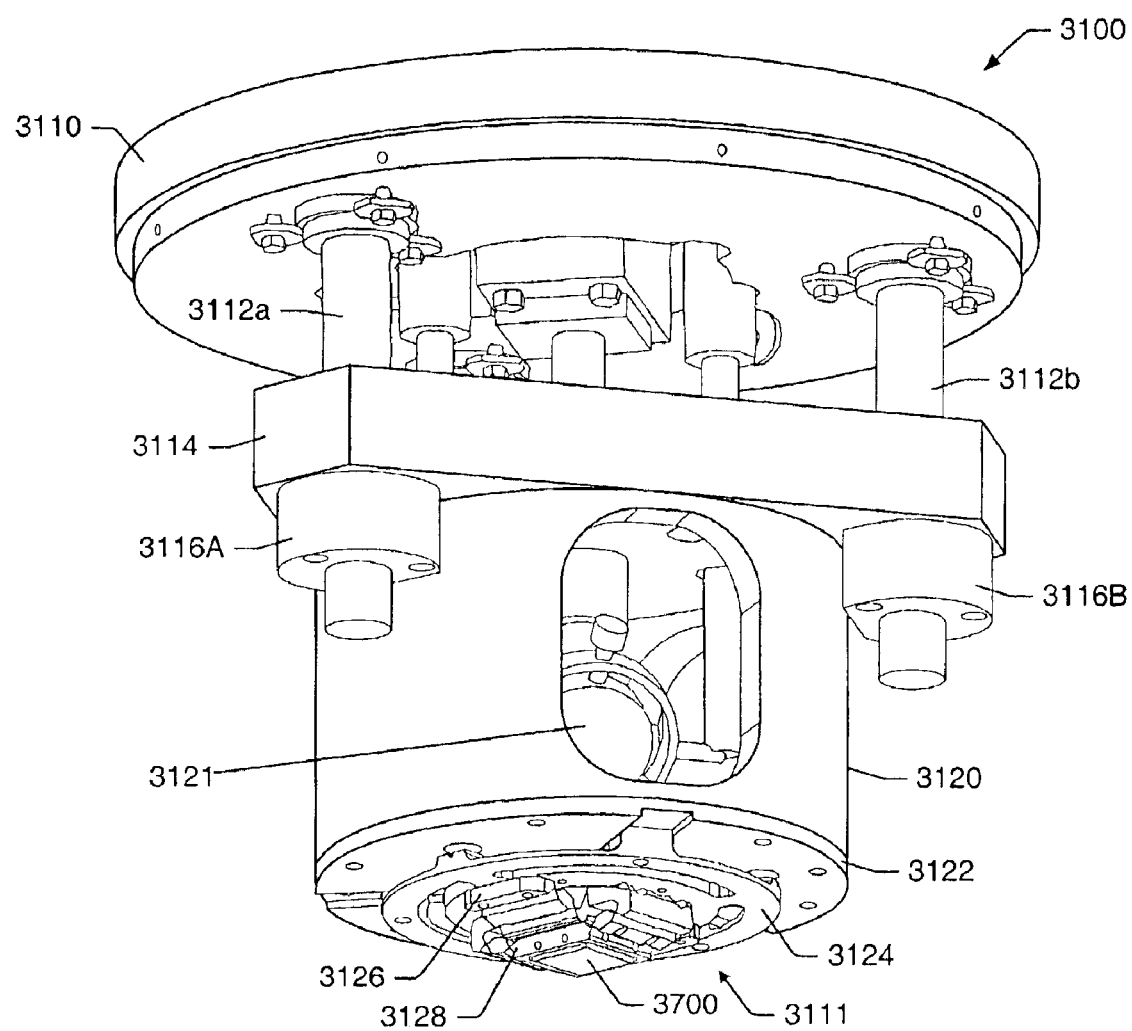
FIG. 4 depicts a projection view of an imprint head.

Referring to FIG. 4, a disk-shaped flexure ring 3124, which makes up a portion of the pre-calibration system 3109 is coupled to imprint head housing 3120. Imprint head housing 3120 is coupled to a middle frame 3114 with guide shafts 3112a, 3112b. In one embodiment, three (3) guide shafts may be used (the back guide shaft is not visible in FIG. 4) to provide a support for housing 3120. Sliders 3116a and 3116b coupled to corresponding guide shafts 3112a, 3112b about middle frame 3114 are used to facilitate the up and down motion of housing 3120. A disk-shaped base plate 3122 is coupled to the bottom portion of housing 3120. Base plate 3122 may be coupled to flexure ring 3124. Flexure ring 3124 supports the fine orientation system components that include first flexure member 3126 and second flexure member 3128. The operation and configuration of the flexure members 3126, 3128 are discussed in detail below.

Figure 5:
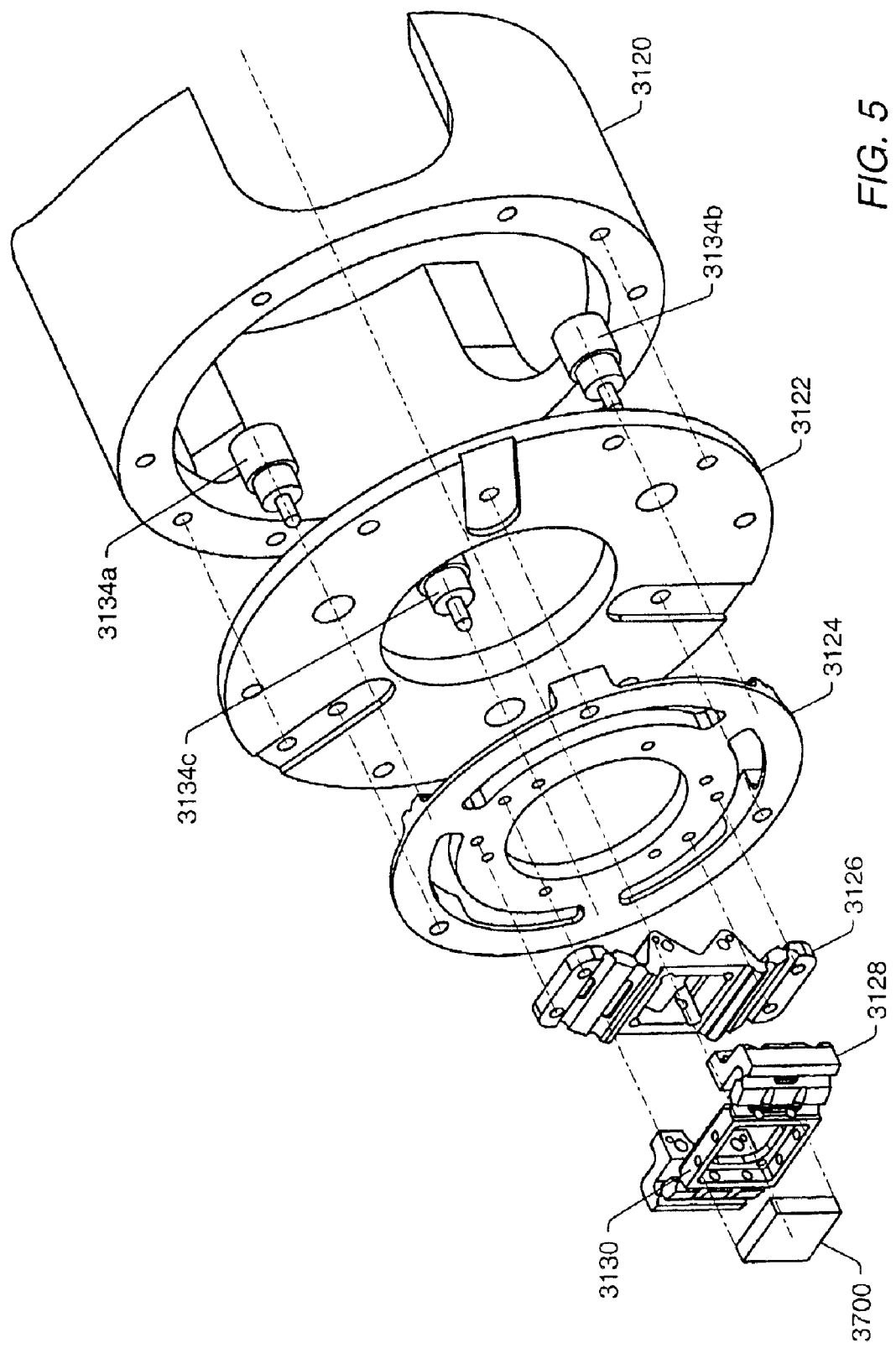
FIG. 5 depicts an exploded view of an imprint head.

FIG. 5 depicts an exploded view of imprint head 3700. As shown in FIG. 5, actuators 3134a, 3134b, 3134c are fixed within housing 3120 and coupled to base plate 3122 and flexure ring 3124. In operation, motion of actuators 3134a, 3134b, and 3134c controls the movement of flexure ring 3124. Motion of actuators 3134a, 3134b, and 3134c may allow for a coarse pre-calibration. In some embodiments, actuators 3134a, 3134b, and 3134c may be equally spaced around housing 3120. Actuators 3134a, 3134b, 3134c and flexure ring 3124 together form the pre-calibration system. Actuators 3134a, 3134b, 3134c allow translation of flexure ring 3124 along the Z-axis to control the gap accurately.

Imprint head 3100 also include a mechanism that enables fine orientation control of template 3700 so that proper orientation alignment may be achieved and a uniform gap may be maintained by the template with respect to a substrate surface. Alignment and gap control is achieved, in one embodiment, by the use of first and second flexure members, 3126 and 3128, respectively.

Figure 6:
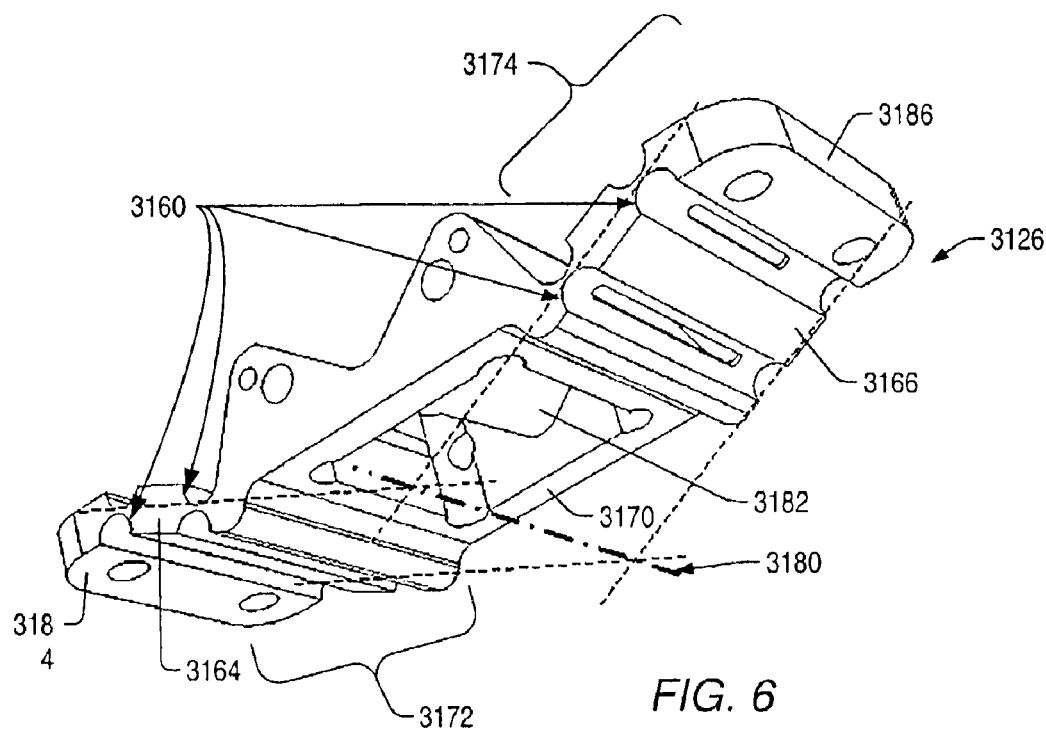
FIG. 6 depicts a projection view of a first flexure member.
Figure 7:
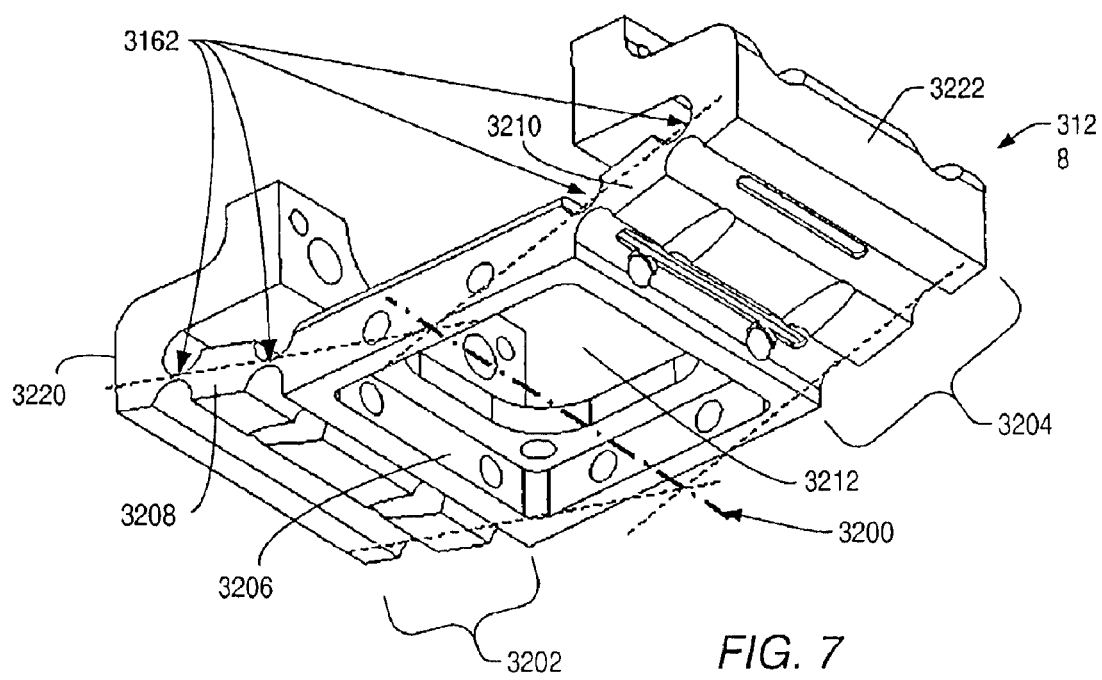
FIG. 7 depicts a projection view of a second flexure member.
Figure 8:
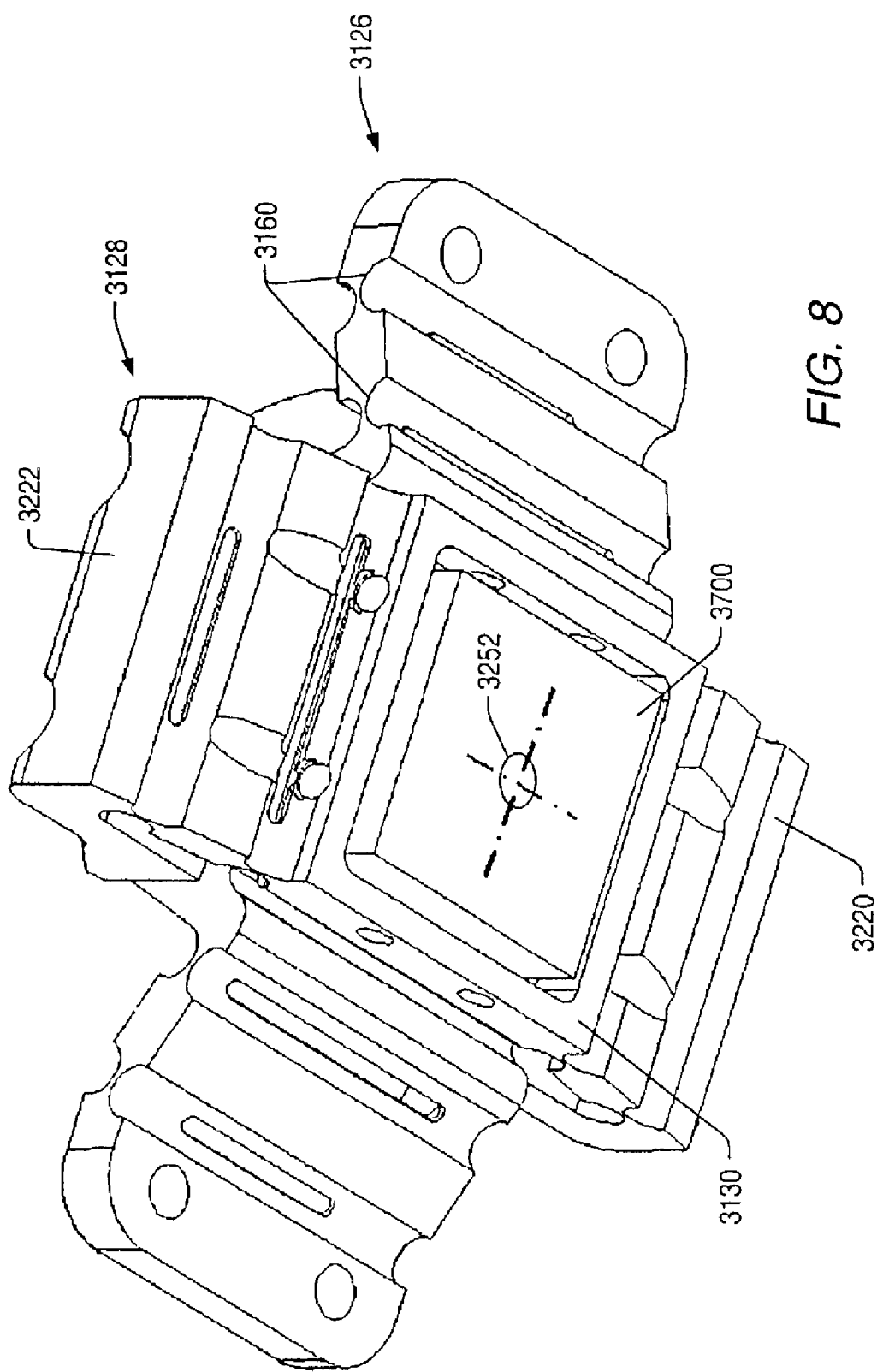
FIG. 8 depicts a projection view of first and second flexure members coupled together.

FIGS. 6 and 7 depicted embodiments of first and second flexure members, 3126 and 3128, respectively, in more detail. As depicted in FIG. 6, first flexure member 3126 includes a plurality of flexure joints 3160 coupled to corresponding rigid bodies 3164 and 3166. Flexure joints 3160 may be notch shaped to provide motion of rigid bodies 3164 and 3166 about pivot axes that are located along the thinnest cross section of the flexure joints. Flexure joints 3160 and rigid body 3164 together form arm 3172, while additional flexure joints 3160 and rigid body 3166 together form arm 3174. Arms 3172 and 3174 are coupled to and extend from first flexure frame 3170. First flexure frame 3170 has an opening 3182, which allows curing light (e.g., ultraviolet light) to pass through first flexure member 3126. In the depicted embodiment, four flexure joints 3160 allow motion of first flexure frame 3170 about a first orientation axis 3180. It should be understood, however, that more or less flexure joints may be used to achieve the desired control. First flexure member 3126 is coupled to second flexure member 3128 through fist flexure frame 3170, as depicted in FIG. 8. First flexure member 3126 also includes two coupling members 3184 and 3186. Coupling members 3184 and 3186 include openings that allow attachment of the coupling members to flexure ring 3124 using any suitable fastening means. Coupling members 3184 and 3186 are coupled to first flexure frame 3170 via arms 3172 and 3174 as depicted.

Second flexure member 3128 includes a pair of arms 3202 and 3204 extending from second flexure frame 3206, as depicted in FIG. 7. Flexure joints 3162 and rigid body 3208 together form arm 3202, while additional flexure joints 3162 and rigid body 3210 together form arm 3204. Flexure joints 3162 may be notch shaped to provide motion of rigid bodies 3210 and 3204 about pivot axes that are located along the thinnest cross section of the flexure joints. Arms 3202 and 3204 are coupled to and extend from template support 3130. Template support 3130 is configured to hold and retain at least a portion of a patterned template. Template support 3130 also has an opening 3212, which allows curing light (e.g., ultraviolet light) to pass through second flexure member 3128. In the depicted embodiment, four flexure joints 3162 allow motion of template support 3130 about a second orientation axis 3200. It should be understood, however, that more or less flexure joints may be used to achieve the desired control. Second flexure member 3128 also includes braces 3220 and 3222. Braces 3220 and 3222 include openings that allow attachment of the braces to portions of first flexure member 3126.

In one embodiment, first flexure member 3126 and second flexure member 3128 are joined as shown in FIG. 8 to form fine orientation section 3111. Braces 3220 and 3222 are coupled to first flexure frame 3170 such that the first orientation axis 3180 of first flexure member 3126 and second orientation axis 3200 of second flexure member are substantially orthogonal to each other. In such a configuration, first orientation axis 3180 and second orientation axis 3200 intersect at a pivot point 3252 at approximately the center region of a patterned template 3700 disposed in template support 3130. This coupling of the first and second flexure member allows fine alignment and gap control of patterned template 3700 during use. While the first and second flexure members are depicted as discrete elements, it should be understood that the first and second flexure member may be formed from a single machined part where the flexure members are integrated together. Flexure members 3126 and 3128 are coupled by mating of surfaces such that motion of patterned template 3700 occurs about pivot point 3252, substantially reducing "swinging" and other motions that may shear imprinted features following imprint lithography. Fine orientation section imparts negligible lateral motion at the template surface and negligible twisting motion about the normal to the template surface due to selectively constrained high structural stiffness of the flexure joints. Another advantage of using the herein described flexure members is that they do not generate substantial amounts of particles, especially when compared with frictional joints. This is offers an advantage for imprint lithography processes, as particles may be disrupt such processes.

FIG. 9 depicts the assembled fine orientation system coupled to the pre-calibration system. Patterned template 3700 is positioned within template support 3130 that is part of second flexure member 3128. Second flexure member 3128 is coupled to first flexure member 3126 in a substantially orthogonal orientation. First flexure member 3124 is coupled to flexure ring 3124 via coupling members 3186 and 3184. Flexure ring 3124 is coupled to base plate 3122, as has been described above.

FIG. 10 represents a cross-section of the pre-calibration system looking through cross-section 3260. As shown in FIG. 10, flexure ring 3124 is coupled to base plate 3122 with actuator 3134. Actuator 3134 includes an end 3270 coupled to a force detector 3135 that contacts flexure ring 3124. During use activation of actuator 3134 causes movement of end 3270 toward or away from flexure ring 3124. The movement of end 3270 toward flexure ring 3124 induces a deformation of the flexure ring and causes translation of the fine orientation system along the Z-axis toward the substrate. Movement of base 3270 away from flexure ring allows the flexure ring to move to its original shape and, in the process, moves the fine orientation stage away from the substrate.

In a typical imprint process the template is disposed in a template holder coupled to the fine orientation system, as depicted in previous figures. The template is brought into contact with a liquid on a surface of a substrate. Compression of the liquid on the substrate as the template is brought closer to the substrate causes a resistive force to be applied by the liquid onto the template. This resistive force is translated through the fine orientation system and to flexure ring 3124 as shown in both FIGS. 9 and 10. The force applied against flexure ring 3124 will also be translated as a resistive force to actuators 3134. The resistive force applied to an actuator 3134 may be determined using force sensor 3135. Force sensor 3135 may be coupled to actuator 3134 such that a resistive force applied to actuator 3135 during use may be determined and controlled.

Figure 11:
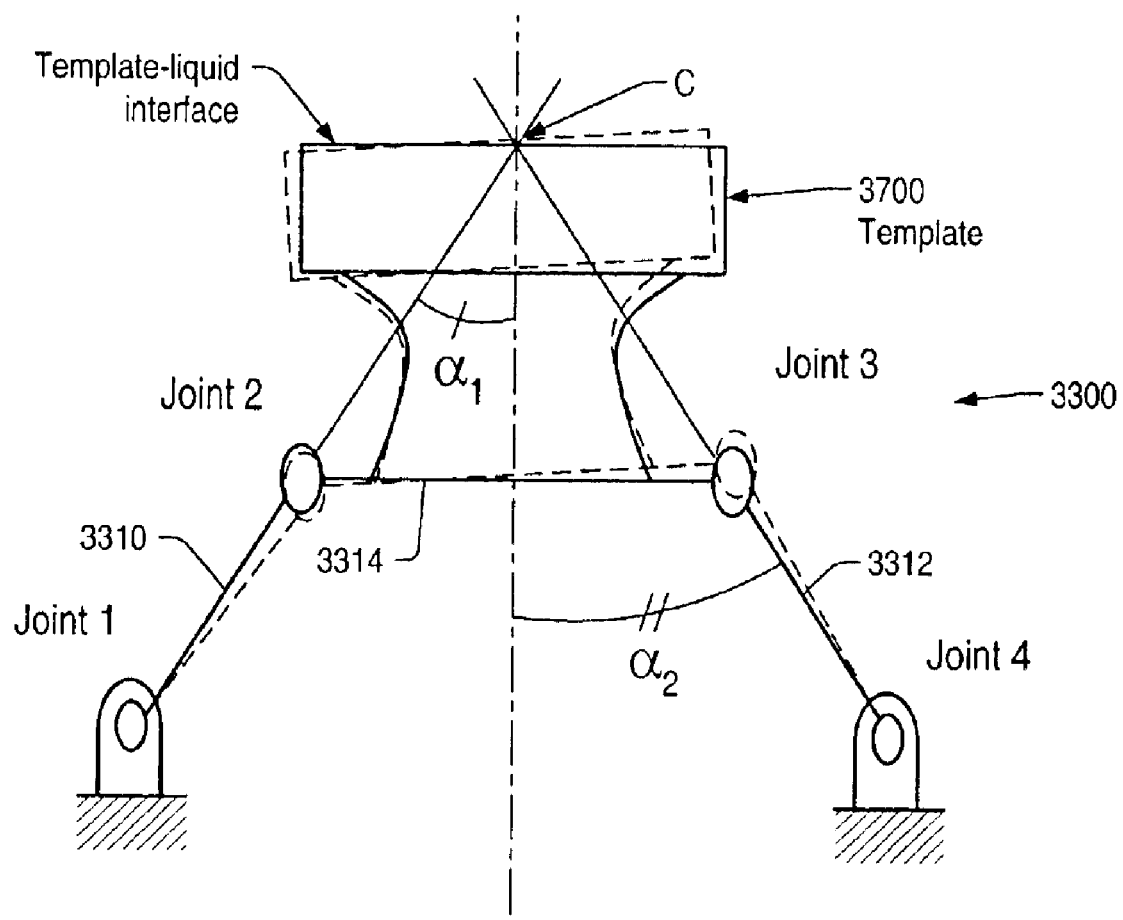
FIG. 11 depicts a schematic diagram of a flexure system.

FIG. 11 depicts a flexure model, denoted generally as 3300, useful in understanding the principles of operation of a fine decoupled orientation stage, such as the fine orientation section described herein. Flexure model 3300 may include four parallel joints: Joints 1, 2, 3 and 4, that provide a four-bar-linkage system in its nominal and rotated configurations. Line 3310 denotes an axis of alignment of Joints 1 and 2. Line 3312 denotes an axis of alignment of Joints 3 and 4. Angle $\alpha_1$ represents an angle between a perpendicular axis through the center of template 3700 and line 3310. Angles $\alpha_2$ represents a perpendicular axis through the center of template 3700 and line 3310. Angles $\alpha_1$ and $\alpha_2$, in some embodiments, are selected so that the compliant alignment axis (or orientation axis) lies substantially at the surface of template 3700. For fine orientation changes, rigid body 3314 between Joints 2 and 3 may rotate about an axis depicted by Point C. Rigid body 3314 may be representative of template support 3130 of second flexure member 3128.

Fine orientation system generates pure tilting motions with no substantial lateral motions at the surface of a template coupled to the fine orientation system. The use of flexure arms may provide fine orientation system with high stiffness in the directions where side motions or rotations are undesirable and lower stiffness in directions where necessary orientation motions are desirable. Fine orientation system, therefore allows rotations of the template support, and therefore the template, about the pivot point at the surface of template, while providing sufficient resistance in a direction perpendicular to the template and parallel to the template to maintain the proper position with respect to the substrate. In this manner a passive orientation system is used for orientation of the template to a parallel orientation with respect to a template. The term "passive" refers to a motion that occurs without any user or programmable controller intervention, i.e., the system self-corrects to a proper orientation by contact of the template with the liquid. Alternate embodiments in which the motion of the flexure arms is controlled by motors to produce an active flexure may also be implemented.

Motion of the fine orientation stage may be activated by direct or indirect contact with the liquid. If the fine orientation stage is passive, then it is, in one embodiment, designed to have the most dominant compliance about two orientation axes. The two orientation axes lie orthogonal to each other and lie on the imprinting surface of an imprinting member disposed on the fine orientation stage. The two orthogonal torsional compliance values are set to be the same for a symmetrical imprinting member. A passive fine orientation stage is designed to alter the orientation of the template when the template is not parallel with respect to a substrate. When the template makes contact with liquid on the substrate, the flexure members compensate for the resulting uneven liquid pressure on the template. Such compensation may be affected with minimal or no overshoot. Further, a fine orientation stage as described above may hold the substantially parallel orientation between the template and substrate for a sufficiently long period to allow curing of the liquid.

Imprint head 3100 is mounted to imprint head support 3910 as depicted in FIG. 1. In this embodiment, imprint head 3910 is mounted such that the imprint head remains in a fixed position at all times. During use, all movement along the X-Y plane is performed to the substrate by motion stage 3600.

Motion Stage

Figure 12:
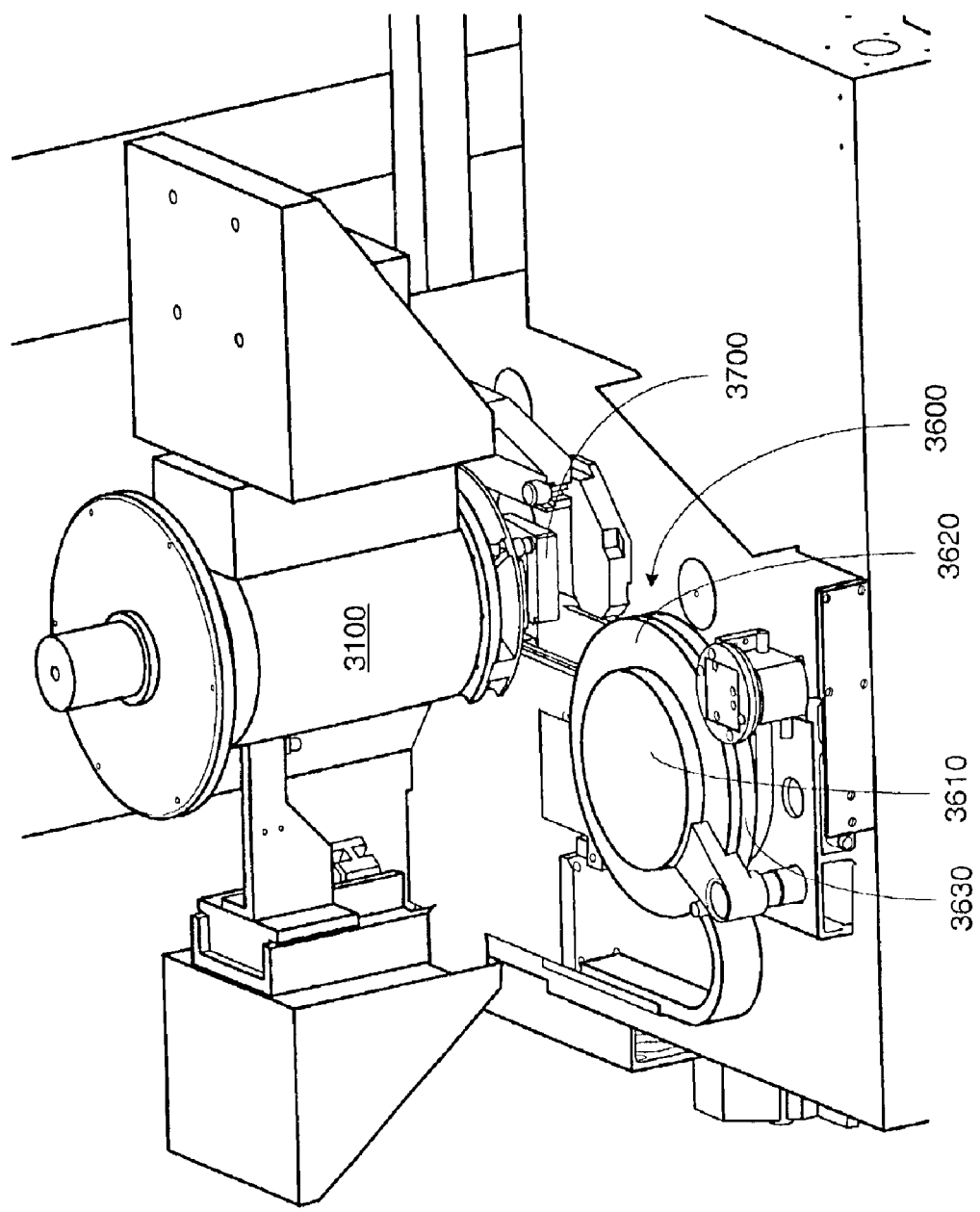
FIG. 12 depicts a projection view of a motion stage and an imprint head of an imprint lithography system.

Motion stage 3600 is used to support a substrate to be imprinted and move the substrate along an X-Y plane during use. Motion stage, in some embodiments, is capable of moving a substrate over distances of up to several hundred millimeters with an accuracy of at least±30 nm, preferably with an accuracy of about±10 nm. In one embodiment, motion stage includes a substrate chuck 3610 that is coupled to carriage 3620, as depicted in FIG. 12. Carriage 3620 is moved about a base 3630 on a frictional bearing system or a non-frictional bearing system. In one embodiment, a non-frictional bearing system that includes an air bearing is used. Carriage 3620 is suspended above base 3630 of motion stage using, in one embodiment, an air layer (i.e., the "air bearing"). Magnetic or vacuum systems may be used to provide a counter balancing force to the air bearing level. Both magnetic based and vacuum based systems are commercially available from a variety of suppliers and any such systems may be used in an imprint lithography process. One example of a motion stage that is applicable to imprint lithography processes is the Dynam YX motion stage commercially available from Newport Corporation, Irvine Calif. The motion stage also may include a tip tilt stage similar to the calibration stage, designed to approximately level the substrate to the X Y motion plane. It also may include one or more theta stages to orient the patterns on the substrate to the X Y motion axes.

Liquid Dispenser

System 3900 also includes a liquid dispense system which is used to dispense a curable liquid onto a substrate. Liquid dispense system is coupled to the system body. In one embodiment, a liquid dispense system is coupled to imprint head 3100. FIG. 3 depicts liquid dispenser head 2507 of a liquid dispense system extending out from cover 3127 of imprint head 3100. Various components of liquid dispense system 3125 may be disposed in cover 3127 of imprint head 3100.

Figure 13:
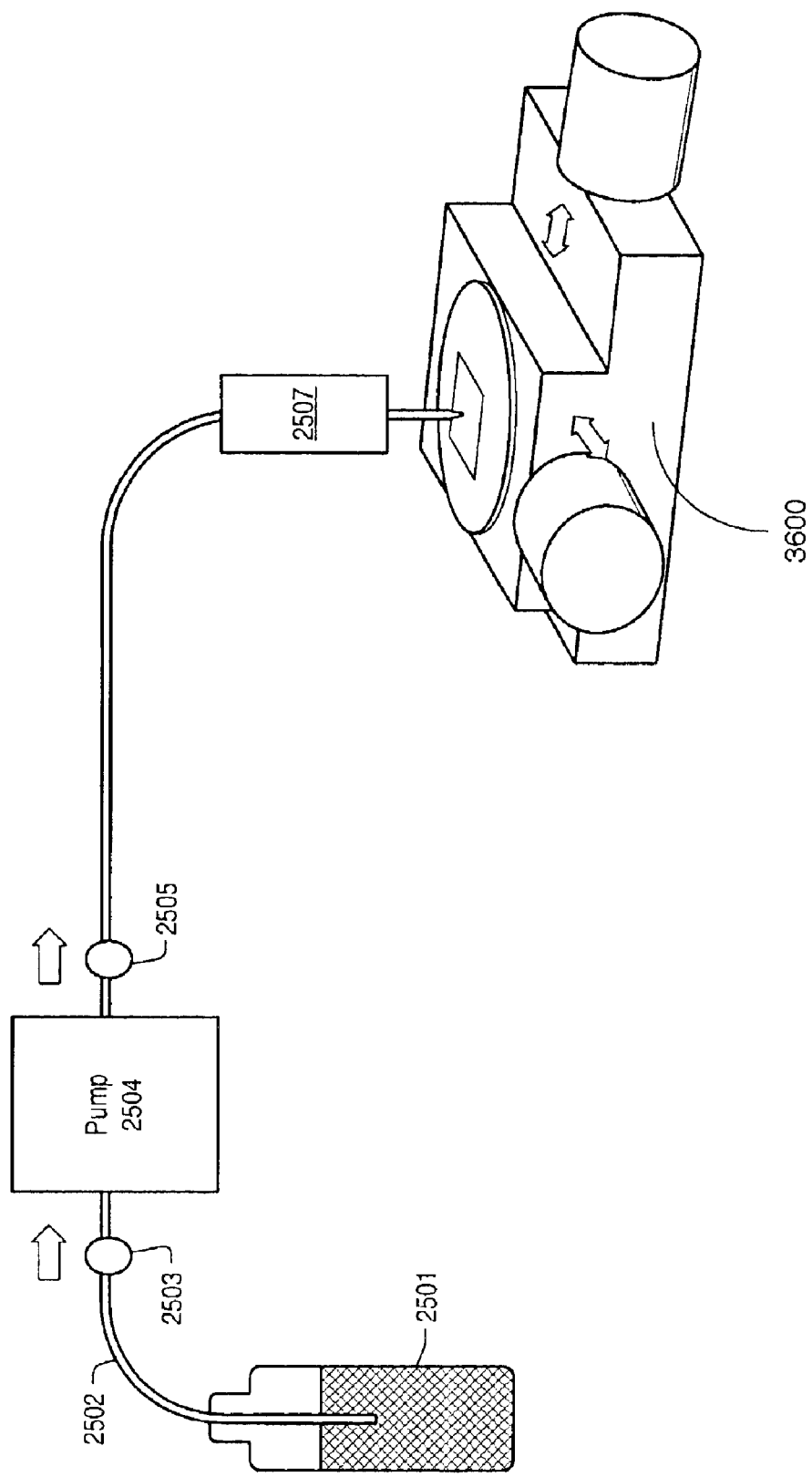
FIG. 13 depicts a schematic diagram of a liquid dispense system.

A schematic of a liquid dispense system is depicted in FIG. 13. In an embodiment, a liquid dispense system includes a liquid container 2501. Liquid container 2501 is configured to hold an activating light curable liquid. Liquid container 2501 is coupled to a pump 2504 via inlet conduit 2502. An inlet valve 2503 is positioned between liquid container 2501 and pump 2504 to control flow of through inlet conduit 2502. Pump 2504 is coupled to a liquid dispenser head 2507 via outlet conduit 2506.

Liquid dispense system is configured to allow precise volume control of the amount of liquid dispensed onto an underlying substrate. In one embodiment, liquid control is achieved using a piezoelectric valve as pump 2504. Piezoelectric valves are available commercially available from the Lee Company, Westbrook, Conn. During use, a curable liquid is drawn into pump 2504 through inlet conduit 2502. When a substrate is properly positioned below, pump 2504 is activated to force a predetermined volume of liquid through outlet conduit 2506. The liquid is then dispensed through liquid dispenser head 2507 onto the substrate. In this embodiment, liquid volume control is achieved by control of pump 2504. Rapid switching of the pump from an open to closed state allows a controlled amount of liquid to be sent to dispenser head 2507. Pump 2504 is configured to dispense liquid in volumes of less than about $1\mu L$. The operation of pump 2504 may allow either droplets of liquid or a continuous pattern of liquid to be dispensed onto the substrate. Droplets of liquid are applied by rapidly cycling the pump from an open to closed state. A stream of liquid is produced on the substrate by leaving the pump in an open state and moving the substrate under the liquid dispenser head.

In another embodiment, liquid volume control may be achieved by use of liquid dispenser head 2507. In such a system, pump 2504 is used to supply a curable liquid to liquid dispenser head 2507. Small drops of liquid whose volume may be accurately specified are dispensed using a liquid dispensing actuator. Examples of liquid dispensing actuators include micro-solenoid valves or piezo-actuated dispensers. Piezo-actuated dispensers are commercially available from MicroFab Technologies, Inc., Plano, Tex. Liquid dispensing actuators are incorporated into liquid dispenser head to allow control of liquid dispensing. Liquid dispensing actuators are configured to dispense between about 50 pL to about 1000 pL of liquid per drop of liquid dispensed. Advantages of a system with a liquid dispensing actuator include faster dispensing time and more accurate volume control. Liquid dispensing systems are further described in U.S. Ser. No. 09/908,455 filed Jul. 17, 2001, entitled "Method and System of Automatic Fluid Dispensing for Imprint Lithography Processes" which is incorporated herein by reference.

Coarse Measurement System

Coarse determination of the position of the template and the substrate is determined by the use of linear encoders (e.g., exposed linear encoders). Encoders offer a coarse measurement on the order of $0.01\mu m$. Linear encoders include a scale coupled to the moving object and a reader coupled to the body. The scale may be formed from a variety of materials including glass, glass ceramics, and steel. The scale includes a number of markings that are read by the reader to determine a relative or absolute position of the moving object. The scale is coupled to the motion stage by means that are known in the art. A reader is coupled to the body and optically coupled to the scale. In one embodiment, an exposed linear encoder may be used. Encoders may be configured to determine the position of the motion stage along either a single axis, or in a two-axis plane. An example of an exposed two-axis linear encoder is the PP model encoder available from Heidenhain Corporation, Schaumburg, Illinois. Generally, encoders are built into many commercially available X-Y motion stages. For example, the Dynam YX motion stage available from Newport Corp has a two-axis encoder built into the system.

The coarse position of the template along the Z-axis is also determined using a linear encoder. In one embodiment, an exposed linear encoder may be used to measure the position of the template. A scale of the linear encoder, in one embodiment, is coupled to the pre-calibration ring of the imprint head. Alternatively, the scale may be coupled directly to the template support 3130. The reader is coupled to the body and optically coupled to the scale. Position of the template is determined along the Z-axis by use of encoders.

Air Gauges

In an embodiment, an air gauge 3135 may be coupled to imprint head 3100, as depicted in FIG. 3. Air gauge 3135 is used to determine whether a substrate disposed on a motion stage is substantially parallel to a reference plane. As used herein, an "air gauge" refers to a device that measures the pressure of a stream of air directed toward a surface. When a substrate is disposed under an outlet of air gauge 3135, the distance the substrate is from the outlet of air gauge 3135 will influence the pressure the air gauge senses. Generally, the further away from the air gauge the substrate is, the lesser the pressure.

In such a configuration, air gauge 3135 may be used to determine differences in pressure resulting from changes in the distance between the substrate surface and the air gauge. By moving air gauge 3135 along the surface of the substrate, the air gauge determines the distance between the air gauge and the substrate surface at the various points measured. The degree of planarity of the substrate with respect to the air gauge is determined by comparing the distance between the air gauge and substrate at the various points measured. The distance between at least three points on the substrate and the air gauge is used to determine if a substrate is planar. If the distance is substantially the same, the substrate is considered to be planar. Significant differences in the distances measured between the substrate and the air gauge indicates a non-planar relationship between the substrate and the air gauge. This non-planar relationship may be caused by the non-planarity of the substrate or a tilt of the substrate. Prior to use, a tilt of the substrate is corrected to establish a planar relationship between the substrate and the template. template using the tip tilt stage attached to the X Y stage. Suitable air gauges may be obtained from Senex Inc.

During use of air gauges, the substrate or template is placed within the measuring range of the air gauge. Motion of the substrate toward the air gauge may be accomplished by either Z-axis motion of the imprint head or Z-axis motion of the motion stage.

Light Source

In an imprint lithography process, a light curable liquid is disposed on a surface of the substrate. A patterned template is brought into contact with the light curable liquid and activating light is applied to the light curable liquid. As used herein "activating light" means light that may affect a chemical change. Activating light may include ultraviolet light (e.g., light having a wavelength between about 200 nm to about 400 nm), actinic light, visible light or infrared light. Generally, any wavelength of light capable of affecting a chemical change may be classified as activating. Chemical changes may be manifested in a number of forms. A chemical change may include, but is not limited to, any chemical reaction that causes a polymerization or a cross-linking reaction to take place. The activating light, in one embodiment, is passed through the template prior to reaching the composition. In this manner the light curable liquid is cured to form structures complementary to the structures formed on the template.

In some embodiment, activating light source 3500 is an ultraviolet light source capable of producing light having a wavelength between about 200 nm to about 400 nm. Activating light source 3500 is optically coupled to the template as depicted in FIG. 1. In one embodiment, activating light source 3500 is positioned proximate to imprint head 3100. Imprint head 3100 includes a mirror 3121 (depicted in FIG. 4, which reflects light from the activating light source to the patterned template. Light passes through an opening in the body of imprint head 3100 and is reflected by mirror 3121 toward 3700. In this manner, activating light source irradiates a patterned template without being disposed in imprint head 3100.

Most activating light sources produce a significant amount of heat during use. If activating light source 3500 is too close to imprint system 3500, heat from the light source will radiate toward the body of the imprint system and may cause the temperature of portions of the body to increase. Since many metals expand when heated, the increase in temperature of a portion of the body of the imprint system may cause an expansion of the body to expand. This expansion may affect the accuracy of the imprint system when sub-100 features are being produced.

Figure 14:
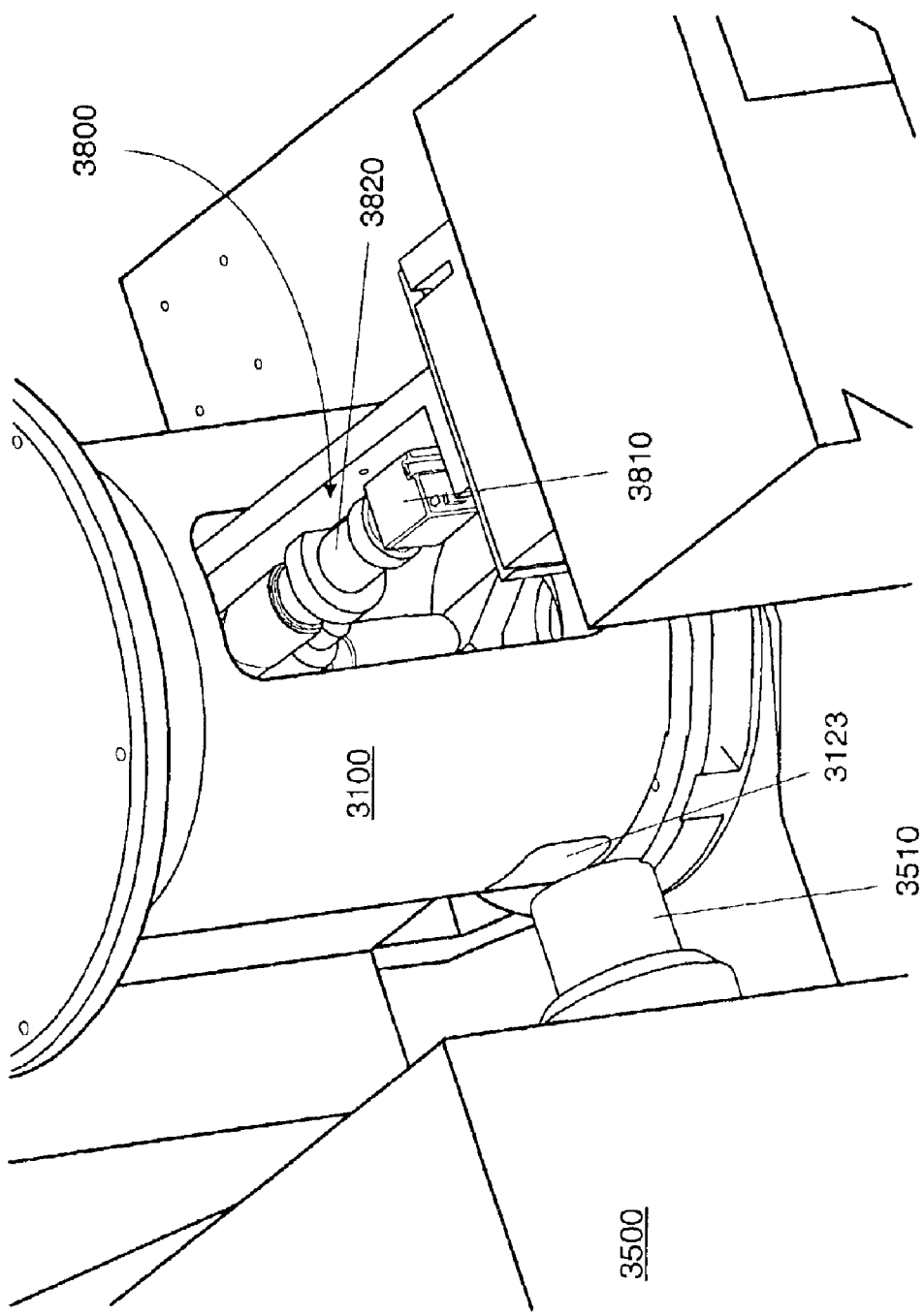
FIG. 14 depicts a projection view of an imprint head with a light source and camera optically coupled to the imprint head.

In one embodiment, activating light source is positioned at a sufficient distance from the body such that system body is insulated from heat produced by activating light source 3500 by the intervening air between activating light source 3500 and imprint head 3100. FIG. 14 depicts an activating light source 3500 optically coupled to imprint head 3100. Activating light source 3500 includes an optical system 3510 that projects light generated by a light source toward imprint head 3100. Light passes from optical system 3510 into imprint head 3100 via opening 3123. Light is then reflected toward a template coupled to imprint head 3110 by mirror 3121 disposed within the imprint head (see FIG. 4). In this manner, the light source is thermally insulated from the body. A suitable light source may be obtained from OAI Inc, Santa Clara Calif.

Optical Alignment Devices

One or more optical measuring devices may be coupled to imprint head 3910 and/or motion stage 3920. Generally, an optical measuring device is any device that allows the position and/or orientation of a template with respect to a substrate to be determined.

Turning to FIG. 14, a through the template optical imaging system 3800 is optically coupled to the imprint head. Optical imaging system 3800 includes an optical imaging device 3810 and an optical system 3820. Optical imaging device 3810, in one embodiment, is a CCD microscope. Optical imaging system 3800 is optically coupled to the template through imprint head. Optical imaging system 3800 is also optically coupled to a substrate, when the substrate is disposed under the patterned template. Optical imaging system 3800 is used to determine the placement error between a patterned template and an underlying substrate as described herein. In one embodiment, mirror 3121 (depicted in FIG. 4) is movable within the imprint head. During an alignment or optical inspection process, mirror 3121 is moved out of the optical path of the optical imaging system.

During use of an optical alignment device, the substrate or template is placed within the measuring range (e.g., the filed of view) of the air optical imaging system. Motion of the substrate toward the optical imagining system may be accomplished by either Z-axis motion of the imprint head or Z-axis motion of the motion stage.

Light Curable Liquid

As previously mentioned, a light curable liquid is placed on a substrate and a template is brought into contact with the liquid during an imprint lithography process. The curable liquid is a low viscosity liquid monomer solution. A suitable solution may have a viscosity ranging from about 0.01 cps to about 100 cps (measured at 25° C.). Low viscosities are especially desirable for high-resolution (e.g., sub-100 ) structures. Low viscosities also lead to faster gap closing. Additionally, low viscosities result in faster liquid filling of the gap area at low pressures. In particular, in the sub-50 nm regime, the viscosity of the solution should be at or below about 30 cps, or more preferably below about 5 cps (measured at 25° C.).

Many of the problems encountered with other lithography techniques may be solved by using a low viscosity light curable liquid in an imprint lithography process. Patterning of low viscosity light curable liquids solves each of the issues facing hot embossing techniques by utilizing a low-viscosity, light-sensitive liquid. Also use of a thick, rigid, transparent template offers the potential for easier layer-to-layer alignment. The rigid template is, in general, transparent to both liquid activating light and alignment mark measurement light.

The curable liquid may be composed of a variety of polymerizable materials. Generally, any photopolymerizable material may be used. Photopolymerizable materials may include a mixture of monomers and a photoinitiator. In some embodiments, the curable liquid may include one or more commercially available negative photoresist materials. The viscosity of the photoresist material may be reduced by diluting the liquid photoresist with a suitable solvent.

In an embodiment, a suitable curable liquid includes a monomer, a silylated monomer, and an initiator. A crosslinking agent and a dimethyl siloxane derivative may also be included. Monomers include, but are not limited to, acrylate and methacylate monomers. Examples of monomers include, but are not limited to, butyl acrylate, methyl acrylate, methyl methacrylate, or mixtures thereof. The monomer makes up approximately 25 to 50% by weight of the curable liquid. It is believed that the monomer ensures adequate solubility of the photoinitiator in the curable liquid. It is further believed that the monomer provides adhesion to an underlying organic transfer layer, when used.

The curable liquid may also include a silylated monomer. Silylated monomers in general are polymerizable compounds that include a silicon group. Classes of silylated monomers include, but are not limited to, silane acrylyl and silane methacrylyl derivatives. Specific examples include methacryloxypropyl tris(tri-methylsiloxy)silane and (3-acryloxypropyl)tris(tri-methoxysiloxy)-silane. Silylated monomers may be present in amounts from 25 to 50% by weight. The curable liquid may also include a dimethyl siloxane derivative. Examples of dimethyl siloxane derivatives include, but are not limited to, (acryloxypropyl) methylsiloxane dimethylsiloxane copolymer, acryloxypropyl methylsiloxane homopolymer, and acryloxy terminated polydimethylsiloxane. Dimethyl siloxane derivatives are present in amounts from about 0 to 50% by weight. It is believed that the silylated monomers and the dimethyl siloxane derivatives may impart a high oxygen etch resistance to the cured liquid. Additionally, both the silylated monomers and the dimethyl siloxane derivatives are believed to reduce the surface energy of the cured liquid, therefore increasing the ability of the template to release from the surface. The silylated monomers and dimethyl siloxane derivatives listed herein are all commercially available from Gelest, Inc.

Any material that may initiate a free radical reaction may be used as the initiator. For activating light curing of the curable material, it is preferred that the initiator is a photoinitiator. Examples of initiators include, but are not limited to, alpha-hydroxyketones (e.g., 1-hydroxycyclohexyl phenyl ketone, sold by Ciba-Geigy Specialty Chemical Division as Irgacure 184), and acylphosphine oxide initiators (e.g., phenylbis(2,4,6-trimethyl benzoyl) phosphine oxide, sold by Ciba-Geigy Specialty Chemical Division as Irgacure 819).

The curable liquid may also include a crosslinking agent. Crosslinking agents are monomers that include two or more polymerizable groups. In one embodiment, polyfunctional siloxane derivatives may be used as a crosslinking agent. An example of a polyfunctional siloxane derivative is 1,3-bis (3-methacryloxypropyl)-tetramethyl disiloxane.

In one example, a curable liquid may include a mixture of 50% by weight of n-butyl acrylate and 50% (3-acryloxypropyl) tris-trimethylsiloxane-silane. To this mixture 3% by weight mixture of a 1:1 Irgacure 819 and Irgacure 184 and 5% of the crosslinker 1,3-bis(3-methacryloxypropyl)-tetramethyl disiloxane may be added. The viscosity of this mixture is less than 30 cps measured at about 25° C.

Curable Liquid with Gas Release

In an alternate embodiment, the curable liquid may be formed of a monomer, an acid-generating photo-agent, and a base-generating photo-agent. Examples of the monomer include, but are not limited to, phenolic polymers and epoxy resins. The acid-generating photo-agent is a compound that releases acid when treated with activating light. The generated acid catalyzes polymerization of the monomer. Those of ordinary skill in the art know such acid-generating additives, and the specific acid-generating additive used depends on the monomer and the desired curing conditions. In general, the acid-generating additive is selected to be sensitive to radiation at the first wavelength $\lambda_1$, which, in some implementations, is in the visible or near ultraviolet (near UV) range. For example, in some implementations, the first wavelength $\lambda_1$, is selected to be approximately 400 nm or longer. A base generating photo-agent is also added to the monomer. The base-generating photo-agent may inhibit curing of the monomer near the interface of the template. The base generating photo-agent may be sensitive to radiation at a second wavelength $\lambda_2$, yet inert or substantially inert to radiation at the first wavelength $\lambda_1$. Moreover, the second wavelength $\lambda_2$. should be selected so that radiation at the second wavelength is primarily absorbed near the surface of the monomer at the interface with the template and does not penetrate very far into the curable liquid. For example, in some implementations, a base generating additive that is sensitive to radiation having a wavelength $\lambda_2$ in the deep UV range, in other words, radiation having a wavelength in the range of about 190–280 nm, may be used.

According to an embodiment, a curable liquid that includes a monomer, an acid-generating photo-agent and a base-generating photo-agent is deposited onto a substrate. A template is brought into contact with the curable liquid. The curable liquid is then exposed to radiation at a first wavelength $\lambda_1$ and a second wavelength $\lambda_2$ of light at substantially the same time. Alternatively, the curing liquid may be exposed to the radiation at the second wavelength $\lambda_2$ and subsequently to the radiation at the first wavelength $\lambda_1$. Exposure of the curable liquid to radiation at the second wavelength $\lambda_2$ produces an excess of base near the interface with the template. The excess base serves to neutralize the acid that is produced by exposure of the curable liquid to radiation at the first wavelength $\lambda_1$, thereby inhibiting the acid from curing the curable liquid. Since the radiation at the second wavelength $\lambda_2$ has a shallow penetration depth into the curable liquid, the base produced by that radiation only inhibits curing of the curable liquid at or near the interface with the template. The remainder of the curable liquid is cured by exposure to the longer wavelength radiation $(\lambda_1)$ which penetrates throughout the curable liquid. U.S. Pat. No. 6,218,316 entitled "Planarization of Non-Planar Surfaces in Device Fabrication" describes additional details concerning this process and is incorporated herein by reference.

In another embodiment, the curable liquid may include a photosensitive agent which, when exposed, for example, to deep UV radiation, decomposes to produce one or more gases such as hydrogen ($H_2$), nitrogen ($N_2$), nitrous oxide ($N_2O$), sulfur tri-oxide ($SO_3$), acetylene ($C_2H_2$), carbon dioxide ($CO_2$), ammonia ($NH_3$) or methane ($CH_4$). Radiation at a first wavelength $\lambda_1$, such as visible or near UV, may be used to cure the curable liquid, and the deep UV radiation ($\lambda_2$) may be used to produce one or more of the foregoing gases. The generation of the gases produces localized pressure near the interface between the cured liquid and the template to facilitate separation of the template from the cured liquid. U.S. Pat. No. 6,218,316 describes additional details concerning this process and is incorporated herein by reference.

In another embodiment, a curable liquid may be composed of a monomer that cures to form a polymer that may be decomposed by exposure to light. In one embodiment, a polymer with a doubly substituted carbon backbone is deposited on the substrate. After the template is brought into contact with the curable liquid, the curable liquid is exposed to radiation at a first wavelength $\lambda_1$ (e.g., greater than 400 nm) and radiation at the second wavelength $\lambda_2$ in the deep UV range. Radiation at the first wavelength serves to cure the curable liquid. When the curable liquid is exposed to the second wavelength $\lambda 2$, scission occurs at the substituted carbon atoms. Since deep UV radiation does not penetrate deeply into the curable liquid, the polymer decomposes only near the interface with the template. The decomposed surface of the cured liquid facilitates separation from the template. Other functional groups which facilitate the photodecomposition of the polymer also can be used. U.S. Pat. No. 6,218,316 describes additional details concerning this process and is incorporated herein by reference.

Patterned Templates

In various embodiments, an imprint lithography template is manufactured using processes including, but not limited to: optical lithography, electron beam lithography, ion-beam lithography, x-ray lithography, extreme ultraviolet lithography, scanning probe lithography, focused ion beam milling, interferometric lithography, epitaxial growth, thin film deposition, chemical etch, plasma etch, ion milling, reactive ion etch or a combination of the above. Methods for making patterned templates are described in U.S. patent application Ser. No. 10/136,188 filed May 1, 2002 entitled "Methods of Manufacturing a Lithography Template" to Voison which is incorporated herein by reference.

In an embodiment, the imprint lithography template is substantially transparent to activating light. The template includes a body having a lower surface. The template further includes a plurality of recesses on the lower surface extending toward the top surface of the body. The recesses may be of any suitable size, although typically at least a portion of the recesses has a feature size of less than about 250 nm.

With respect to imprint lithography processes, the durability of the template and its release characteristics may be of concern. In one embodiment, a template is formed from quartz. Other materials may be used to form the template and include, but are not limited to: silicon germanium carbon, gallium nitride, silicon germanium, sapphire, gallium arsinide, epitaxial silicon, poly-silicon, gate oxide, silicon dioxide or combinations thereof. Templates may also include materials used to form detectable features, such as alignment markings. For example, detectable features may be formed of $SiO_x$, where X is less than 2. In some embodiments, X is about 1.5. In another example, detectable features may be formed of a molybdenum silicide. Both SiOx and molybdenum silicide are optically transparent to light used to cure the polymerizable liquid. Both materials, however, are substantially opaque to visible light. Use of these materials allows alignment marks to be created on the template that will not interfere with curing of the underlying substrate.

As previously mentioned, the template is treated with a surface treatment material to form a thin layer on the surface of the template. A surface treatment process is optimized to yield a low surface energy coating. Such a coating is used in preparing imprint templates for imprint lithography. Treated templates have desirable release characteristics relative to untreated templates. Untreated template surfaces possess surface free energies of about 65 dynes/cm or more. A treatment procedure disclosed herein yields a surface treatment layer that exhibits a high level of durability. Durability of the surface treatment layer allows a template to be used for numerous imprints without having to replace the surface treatment layer. The surface treatment layer, in some embodiments, reduces the surface free energy of the lower surface measured at 25° C. to less than about 40 dynes/cm, or in some cases, to less than about 20 dynes/cm.

A surface treatment layer, in one embodiment, is formed by the reaction product of an alkylsilane, a fluoroalkylsilane, or a fluoroalkyltrichlorosilane with water. This reaction forms a silinated coating layer on the surface of the patterned template. For example, a silinated surface treatment layer is formed from a reaction product of tridecafluoro-1,1,2,2-tetrahydrooctyl trichlorosilane with water. A surface treatment layer may be formed using either a liquid-phase process or a vapor-phase process. In a liquid-phase process, the substrate is immersed in a solution of precursor and solvent. In a vapor-phase process, a precursor is delivered via an inert carrier gas. It may be difficult to obtain a purely anhydrous solvent for use in a liquid-phase treatment. Water in the bulk phase during treatment may result in clump deposition, which will adversely affect the final quality or coverage of the coating. In an embodiment of a vapor-phase process, the template is placed in a vacuum chamber, after which the chamber is cycle-purged to remove excess water. Some adsorbed water, however, remains on the surface of the template. A small amount of water, however, is believed to be needed to initiate a surface reaction, which forms the coating. It is believed that the reaction may be described by the formula:

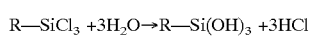

To facilitate the reaction, the template is brought to a desired reaction temperature via a temperature-controlled chuck.

The precursor is then fed into the reaction chamber for a prescribed time. Reaction parameters such as template temperature, precursor concentration, flow geometries, etc. are tailored to the specific precursor and template substrate combination. By controlling these conditions, the thickness of the surface treatment layer is controlled. The thickness of the surface treatment layer is kept at a minimal value to minimize the interference of the surface treatment layer with the feature size. In one embodiment, a monolayer of the surface treatment layer is formed.

Discontinuous Template

Figure 20A:
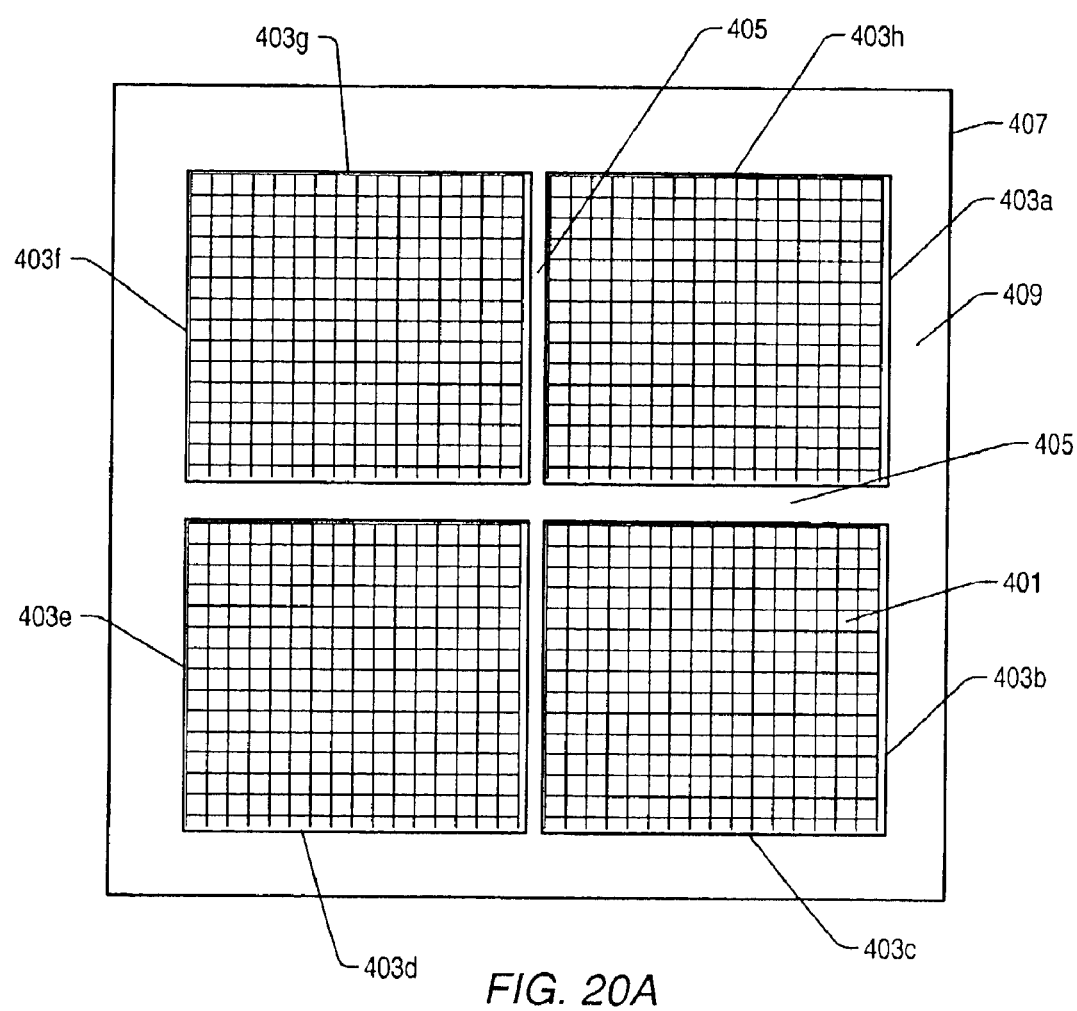
FIGS. 20 A–B depict top and cross-sectional views, respectively, of a template having a plurality of patterning areas.
Figure 20B:
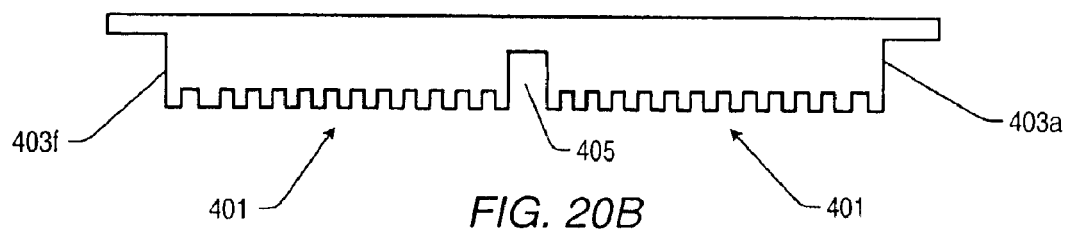

In an embodiment, there are at least two separate depths associated with the recesses on the lower surface of the template. FIGS. 20A and 20 B depict top and cross-sectional views, respectively, of a patterned template with recesses having two depths. Referring to FIGS. 20A and 20B, a template includes one or more patterning areas 401. In such embodiments, a first relatively shallow depth is associated with the recesses in the patterning areas of the template, as depicted in FIG. 20B. The patterning area includes the area replicated during patterning of the template. The patterning areas are positioned within a region defined by border 409 of the template. Border 409 is defined as the region that extends from an outer edge of any of the patterning areas to an edge 407 of the template. The border has a depth that is substantially greater than the depth of the recesses in the patterning areas. The perimeter of the template is herein defined as the boundary between the patterning areas and border 409. As depicted in FIG. 20A four patterning areas are positioned within the area defined by the template. The patterning areas are separated from edges 407 of the template by border 409. The "perimeter" of the template is defined by edges 403a, 403b, 403c, 403d, 403e, 403f, 403g, and 403h of the patterning areas.

The patterning areas may be separated from each other by channel regions 405. Channel regions are recesses that are positioned between the patterning areas that have a greater depth than the recesses of the pattering areas. As described below, both border regions and channel regions inhibit the flow of liquid between the patterning regions or beyond the perimeter of the patterning areas, respectively.

Figure 15:
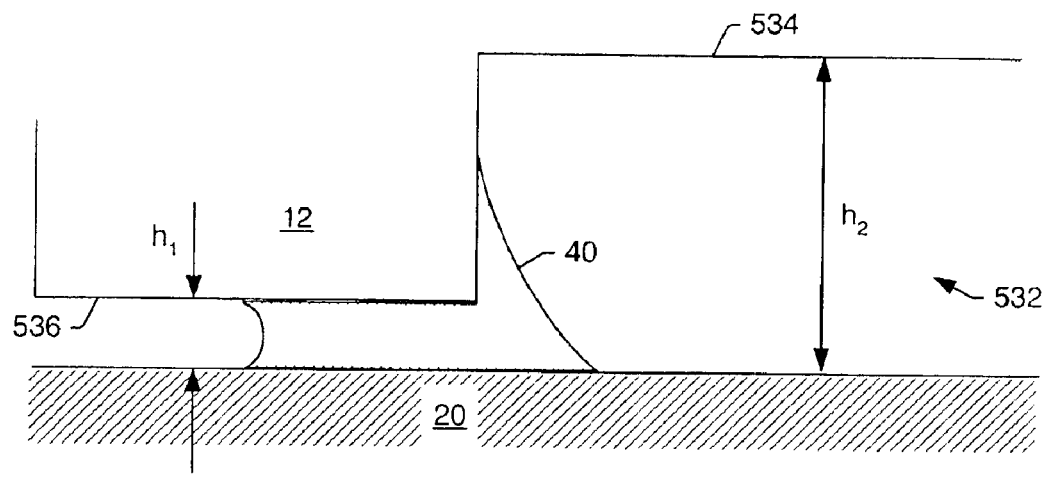
FIGS. 15 and 16 depict side views of an interface between a liquid droplet and a portion of a template.
Figure 16:
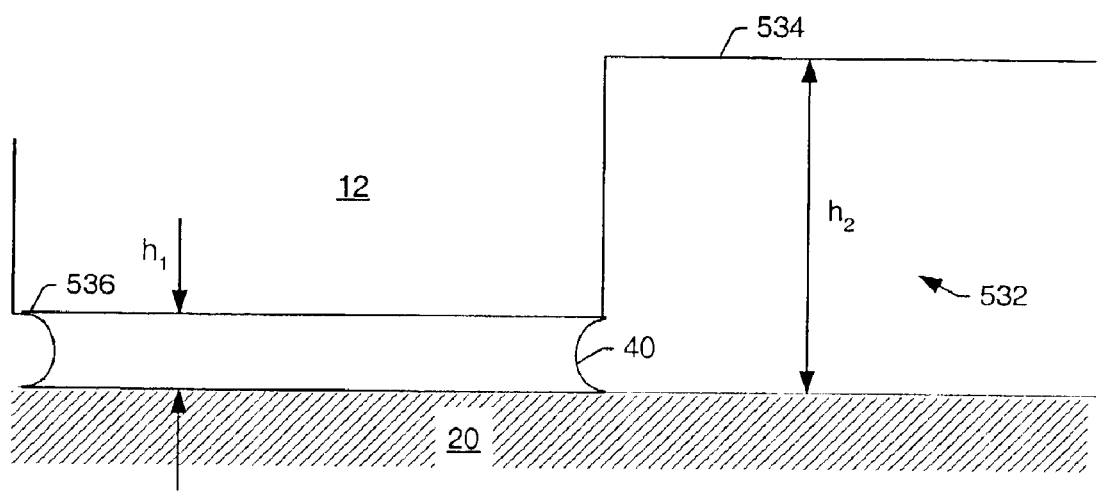

The design of the template is chosen based on the type of lithography process used. For example, a template for positive imprint lithography has a design that favors the formation of discontinuous films on the substrate. In one embodiment, a template 12 is formed such that the depth of one or more structures is relatively large compared to the depth of structures used to form the patterning region, as depicted in FIG. 15. During use, template 12 is placed in a desired spaced relationship to substrate 20. In such an embodiment, the gap ($h_1$) between the lower surface 536 of template 12 and substrate 20 is much smaller than the gap ($h_2$) between recessed surface 534 and substrate 20. For example, $h_1$ may be less than about 200 nm, while $h_2$ may be greater than about 10,000 nm. When the template is brought into contact with liquid 40 on substrate 20, liquid 40 leaves the region under recessed surface 534 and fills the gap between lower surface 536 and substrate 20 (as depicted in FIG. 16). It is believed that combinations of surface energies and capillary forces draw the liquid from the larger recess into the narrower region. As hi is decreased, forces applied to the liquid by template 12 may overcome capillary forces drawing the liquid under lower surface 536. These forces may cause spreading of the liquid into the area under recessed surface 534. The minimum value of $h_1$ at which the liquid is inhibited from spreading into a recess 532 is referred to herein as the "minimum film thickness."

Additionally, as $h_1$ increases, the capillary forces are reduced, eventually allowing the liquid to spread into the deeper recessed regions. The maximum value of $h_1$ at which the capillary forces are sufficient to inhibit flow of liquid into the deeper recessed region is herein known as the "maximum film thickness."

Figure 17:
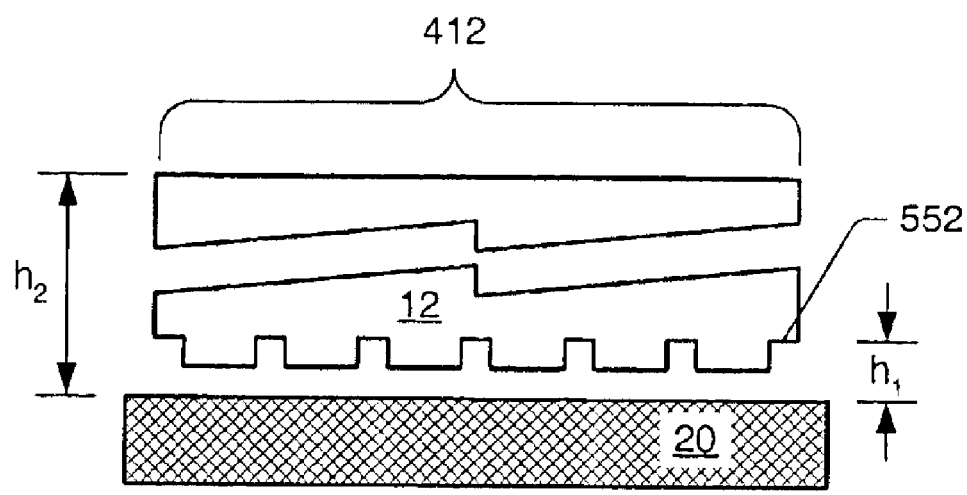
FIG. 17 depicts a cross-sectional view a first embodiment of template configured for liquid confinement at the perimeter of the template.
Figure 18:
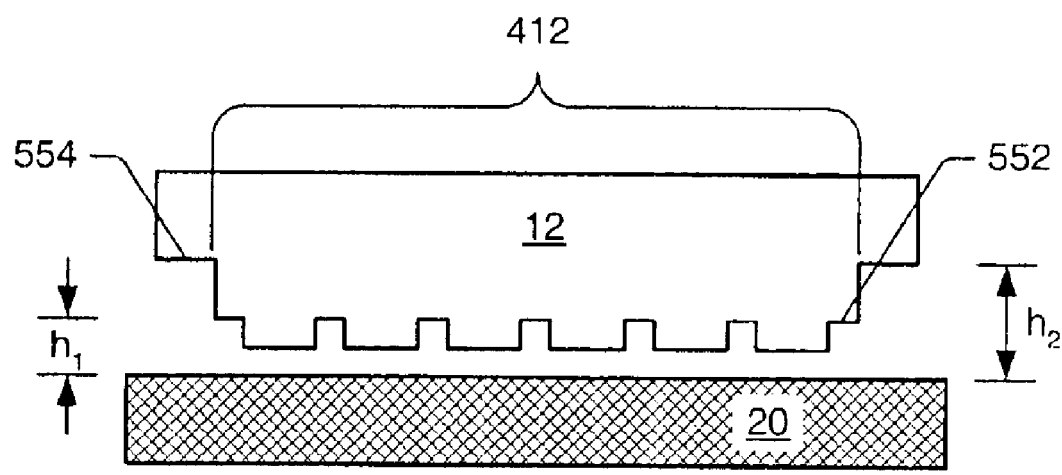
FIG. 18 depicts a cross-sectional view a second embodiment of template configured for liquid confinement at the perimeter of the template.
Figure 19A:
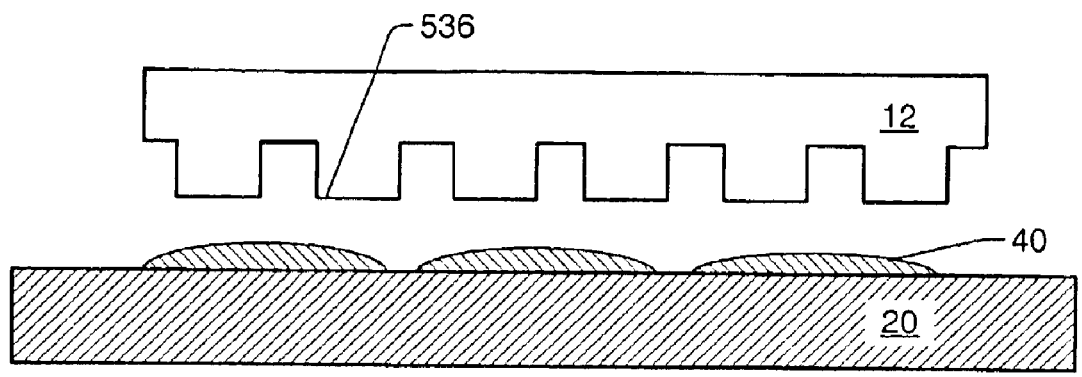
FIGS. 19 A–D depict cross-sectional views of a sequence of steps of a template contacting a liquid disposed on a substrate.
Figure 19B:
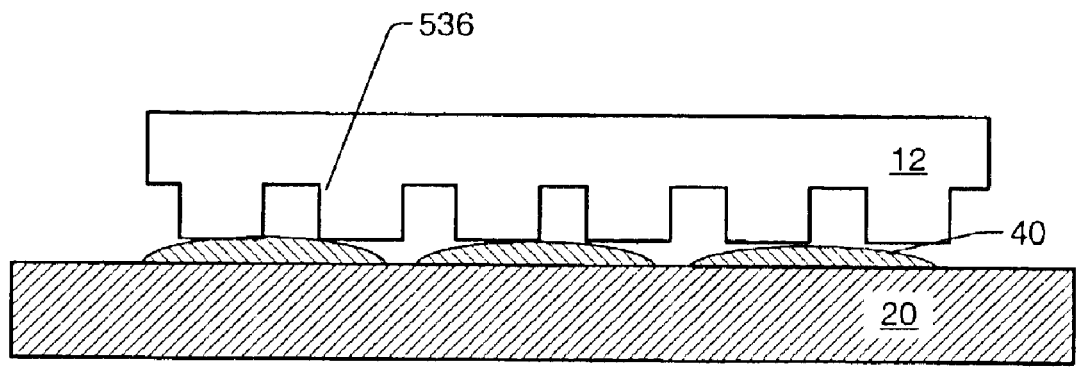
Figure 19C:
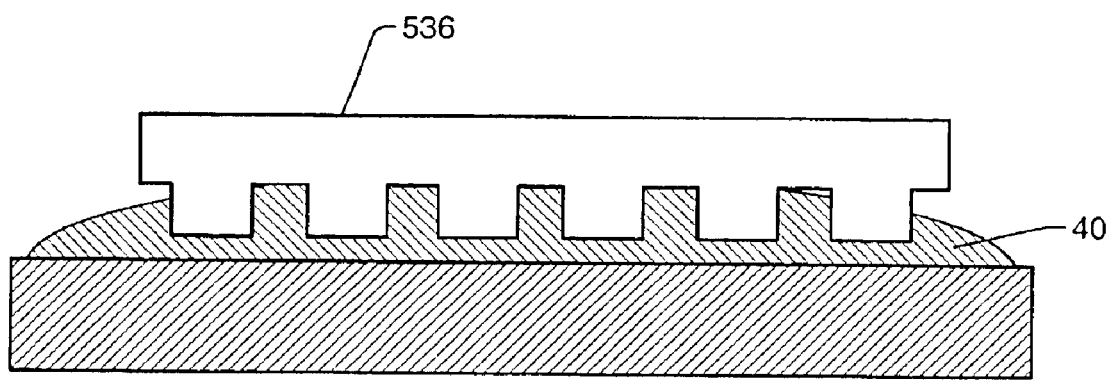
Figure 19D:
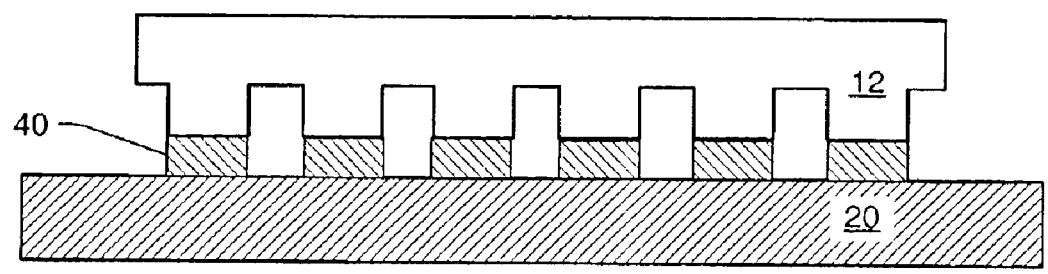

As depicted in FIGS. 17 and 18, in various embodiments, template 12 is formed such that a curable liquid placed on substrate 20 is inhibited from flowing beyond perimeter 412 of template 12. In the embodiment depicted in FIG. 17, height hi is measured from substrate 20 to shallow recessed surface 552. Shallow recessed surface 552 extends to the perimeter of template 12. Thus, the edge of the template forms the height $h_2$ and is effectively infinite in comparison to height $h_1$. In the embodiment depicted in FIG. 18, a deep recess is formed at the outer edge of template 12. Height $h_2$ is measured between substrate 20 and deep recessed surface 554. Height $h_1$ is again measured between substrate 20 and shallow recessed surface 552. In either embodiment, height $h_2$ is much larger than height $h_1$. If $h_1$ is small enough, the activating light curable liquid remains in the gap between template 12 and substrate 20 while a curing agent is applied. Deeply recessed portions are particularly useful for liquid confinement in step and repeat processes as described herein.

In an embodiment, template 12 and substrate 20 each have one or more alignment marks. Alignment marks may be used to align template 12 and substrate 20. For example, one or more optical imaging devices (e.g., microscopes, cameras, imaging arrays, etc.) are used to determine alignment of the alignment marks.

In some embodiments, an alignment mark on the template may be substantially transparent to activating light. Alternatively, the alignment mark may be substantially opaque to alignment mark detection light. As used herein, alignment mark detection light and light used for other measurement and analysis purposes is referred to as "analyzing light." In an embodiment, analyzing light includes, but is not limited to: visible light and/or infrared light. The alignment mark may be formed of a material different than the material of the body. For example, the alignment mark may be formed from $SiO_x$ where x is about 1.5. In another example, the alignment mark may be formed of molybdenum silicide. Alternately, the alignment mark may include a plurality of lines etched on a surface of the body. The lines are configured to substantially diffuse activating light, but produce an analyzable mark under analyzing light.

In various embodiments, one or more deep recesses as described above may project entirely through the body of the template to form openings in the template. An advantage of such openings is that they may effectively ensure that height $h_2$ is very large with respect to $h_1$ at each opening. Additionally, in some embodiments, pressurized gas or vacuum may be applied to the openings. Pressurized gas or vacuum may also be applied to one or more openings after curing the liquid. For example, pressurized gas may be applied after curing as part of a peel and pull process to assist in separating the template from the cured liquid.

Alternate System Embodiments

The above described imprint lithography system may be modified according to alternate embodiments discussed below. It should be understood that any of the described alternative embodiments may be combined, singly or in combination, with any other system described herein.

As described above, an imprint head includes a fine orientation system that allows for a "passive" orientation of the template with respect to the substrate. In another embodiment, fine orientation system may include actuators coupled to the flexure arms. The actuators may allow "active" control of the fine orientation system. During use an operator or a programmable controller monitors the orientation of the template with respect to the substrate. The operators or a programmable controller then alters the orientation of the template with respect to the substrate by operating the actuators. Movement of the actuators causes motion of the flexure arms to alter the orientation of the template. In this manner an "active" control of fine positioning of the template with respect to the substrate may be achieved. An active fine orientation system is further described in U.S. Ser. No. 09/920,341 filed Aug. 1, 2001 entitled "Methods for High-Precision Gap Orientation Sensing Between a Transparent Template and Substrate for Imprint Lithography" which is incorporated herein by reference.

Figure 21:
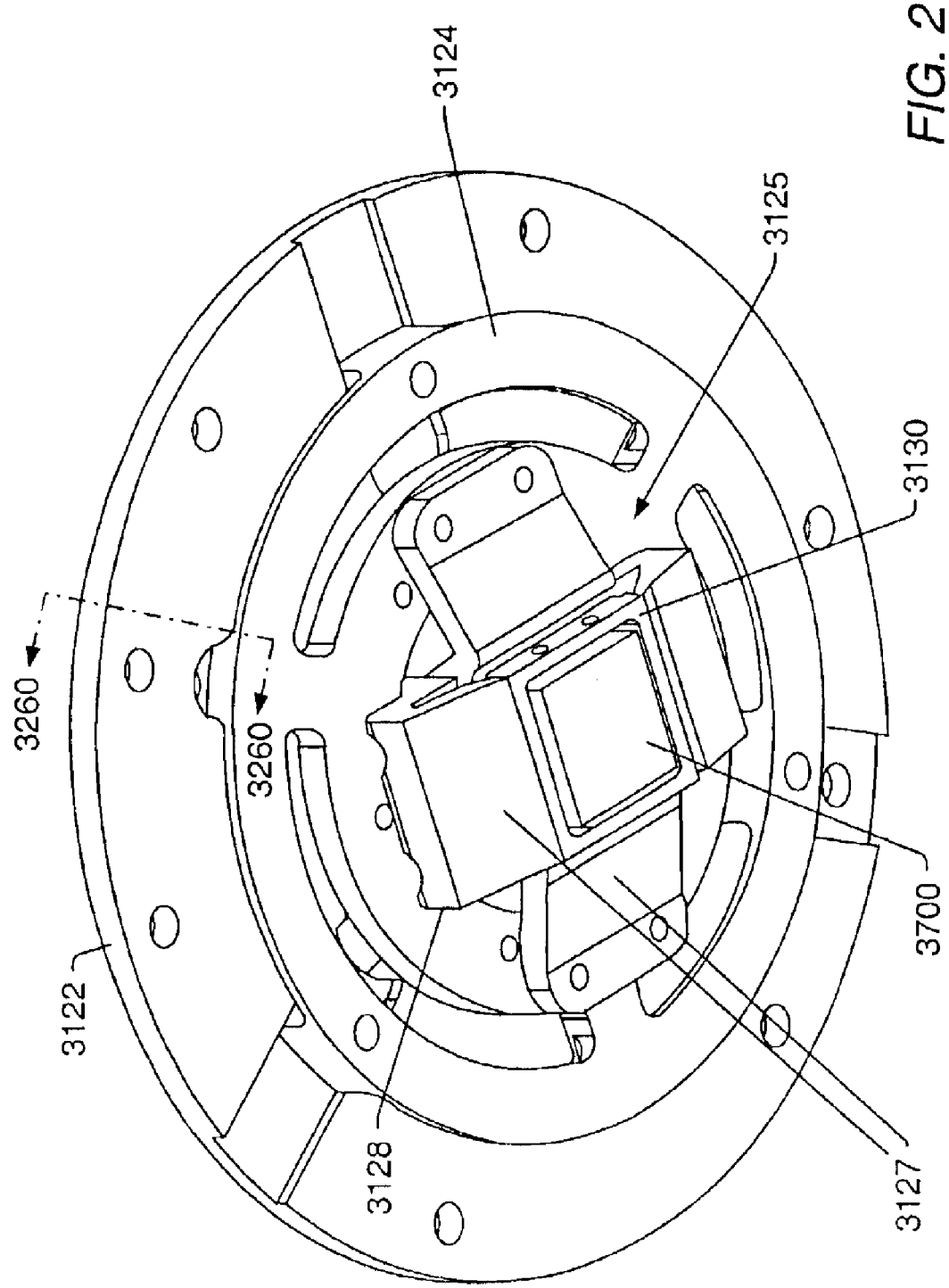
FIG. 21 depicts a projection view of a rigid template support system coupled to a pre-calibration system of an imprint head.

In an alternate embodiment, imprint head may include a pre-calibration system, as described above. Pre-calibration system includes a flexure ring 3124 as depicted in FIG. 21. In place of the fine orientation system as described above, a template support system 3125 is coupled to pre-calibration ring. In contrast to the fine orientation system, template support system 3125 is formed of substantially rigid and non-compliant members 3127. These members provide a substantially rigid support for a template 3700 disposed in template support 3130. In this embodiment, fine orientation may be achieved using motion stage instead of template support.

Figure 22:
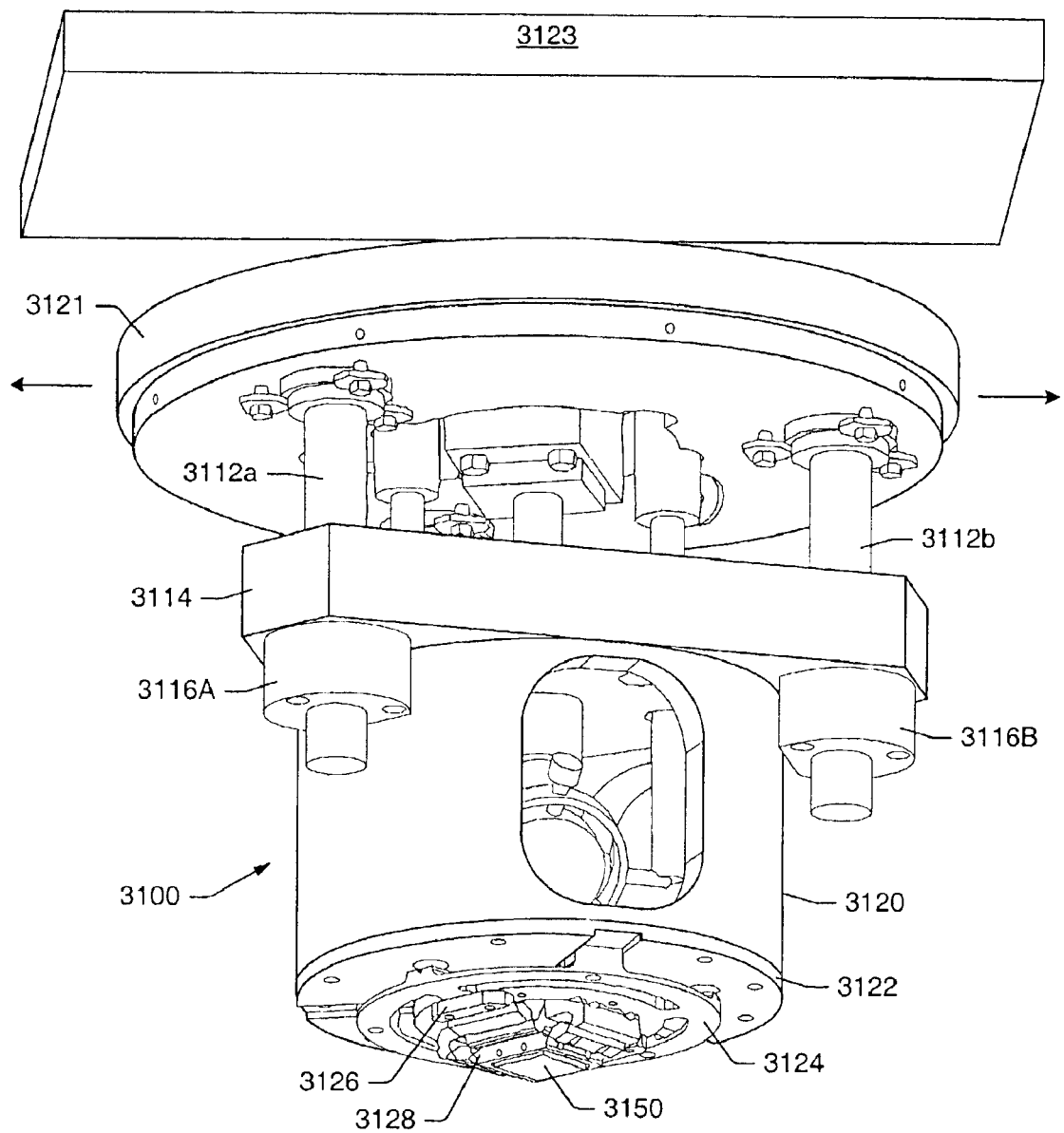
FIG. 22 depicts an imprint head coupled to an X-Y motion system.

In previous embodiments, imprint head 3100 is coupled to the body in a fixed position. In an alternate embodiment, imprint head 3100 may be mounted to a motion system that allows the imprint head to be moved along the X-Y plane, as depicted in FIG. 22. Imprint head 3100 is configured to support a patterned template as described in any of the embodiments herein. Imprint head 3100 is coupled to a motion system that includes an imprint head chuck 3121 and a imprint motion stage 3123. Imprint head 3100 is mounted to imprint head chuck 3121. Imprint head chuck interacts with imprint motion stage 3123 to move imprint head along an X-Y plane. Mechanical or electromagnetic motion systems may be used. Electromagnetic systems rely on the use of magnets to produce an X-Y planar motion the imprint chuck. Generally, an electromagnetic system incorporates permanent and electromagnetic magnets into the imprint motion stage 3123 and the imprint head chuck 3121. The attractive forces of these magnets is overcome by a cushion of air between imprint head chuck 3121 and imprint head motion stage 3123 such that an "air bearing" is produced. Imprint head chuck, and therefore the imprint head, is moved along an X-Y plane on a cushion of air. Electromagnetic X-Y motion stages are described in further detail in U.S. Pat. No. 6,389,702, entitled "Method and Apparatus for Motion Control," which is incorporated herein by reference. In a mechanical motion system, imprint head chuck is attached to a motion stage. The motion stage is then moved by use of various mechanical means to alter the position of the imprint head chuck, and thus the imprint head, along the X-Y plane. In this embodiment, imprint head may include a passive compliant fine orientation system, an actuated fine orientation system, or a rigid template support system, as described herein.

Figure 40:
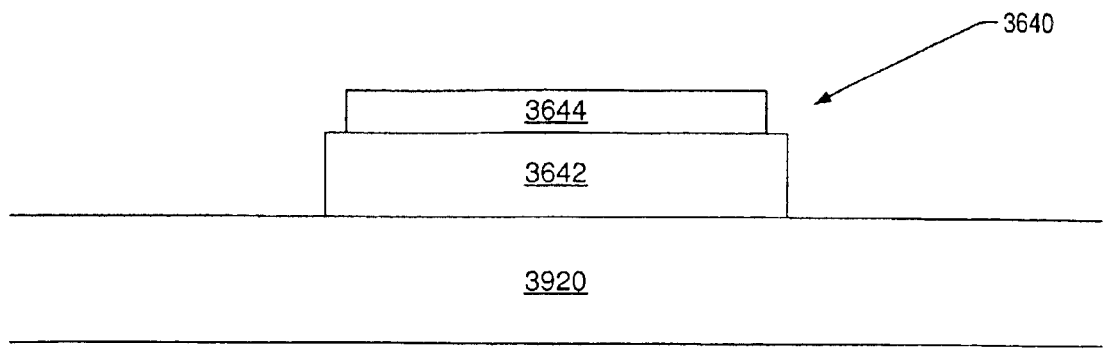
FIG. 40 depicts a schematic drawing of a substrate support.

With imprint head 3100 coupled to a moving support, the substrate may be mounted to a stationary support. Thus, in an alternate embodiment, imprint head 3100 is coupled to an X-Y axis motion stage as described herein. A substrate is mounted to a substantially stationary substrate support. A stationary substrate support is depicted in FIG. 40. Stationary substrate support 3640 includes a base 3642 and a substrate chuck 3644. Substrate chuck 3644 is configured to support a substrate during imprint lithography processes. Substrate chuck may employ any suitable means to retain a substrate to the substrate chuck. In one embodiment, substrate chuck 3644 may include a vacuum system which applies a vacuum to the substrate to couple the substrate to the substrate chuck. Substrate chuck 3644 is coupled to a base 3642. Base 3642 is coupled to support 3920 of an imprint lithography system (See FIG. 1). During use, stationary substrate support 3640 remains in a fixed position on support 3920 while the imprint head position is varied to access different portions of the substrate.

Coupling an imprint head to a motion stage can offer advantages over techniques in which the substrate is on a motion stage. Motion stages generally rely on an air bearing to allow substantially frictionless motion of the motion stage. Generally, motion stages are not designed to accommodate significant pressure applied along the Z-axis. When pressure is applied to a motion stage chuck along the Z-axis, the motion stage chuck position will change slightly in response to this pressure. During a step and repeat process, a template that has a smaller area than the area of the substrate is used to form multiple imprinted areas. The substrate motion stage is relatively large compared to the template, to accommodate the larger substrates. When a template contacts the substrate motion stage in a position that is off-center, the motion stage will tilt to accommodate the increased pressure. This tilt is compensated for by tilting the imprint head to ensure proper alignment. If, however, the imprint head is coupled to the motion stage, all of the forces along the Z-axis will be centers on the template, regardless of where on the substrate the imprinting is taking place. This leads to increased ease in alignment and may also increase the throughput of the system.

Figure 39:
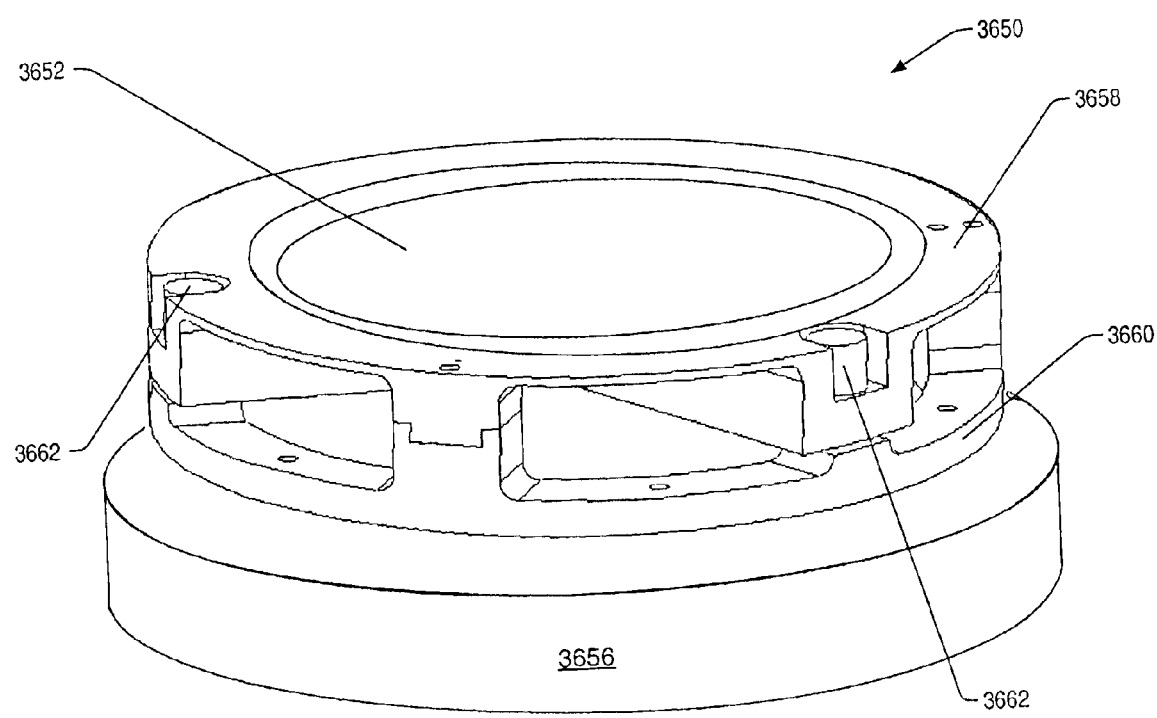
FIG. 39 depicts a motion stage having a substrate tilt module.

In an embodiment, a substrate tilt module may be formed in a substrate support as depicted in FIG. 39. Substrate support 3650 includes a substrate chuck 3652, coupled to a substrate tilt module 3654. Substrate tilt module 3654 is coupled to a base 3656. Base 3656, in one embodiment, is coupled to a motion stage which allows X-Y motion of the substrate support. Alternatively, base 3656 is coupled to a support (e.g., 3920) such that the substrate support is mounted to an imprint system in a fixed position.

Substrate chuck 3652 may employ any suitable means to retain a substrate to the substrate chuck. In one embodiment, substrate chuck 3654 may include a vacuum system which applies a vacuum to the substrate to couple the substrate to the substrate chuck. Substrate tilt module 3654 includes a flexure ring 3658 coupled to flexure ring support 3660. A plurality of actuators 3662 are coupled to flexure ring 3658 and flexure ring support 3660. Actuators 3662 are operated to alter the tilt of flexure ring 3658. Actuators, in one embodiment, use a differential gear mechanism that may be manually or automatically operated. In an alternate embodiment, actuators use an eccentric roller mechanism. An eccentric roller mechanism generally provides more vertical stiffness to the substrate support than a differential gear system. In one embodiment, substrate tilt module has a stiffness that will inhibit tilt of the substrate when the template applies a force of between about 1 lb. to about 10 lbs. to a liquid disposed on the substrate. Specifically, substrate tilt module is configured to allow no more than 5 micro radians of tilt when pressure up to about 10 lbs. are applied to the substrate through the liquid on the template.

During use sensors coupled to the substrate chuck may be used to determine the tilt of the substrate. The tilt of the substrate is adjusted by actuators 3662. In this manner tilt correction of the substrate may be achieved.

Figure 38:
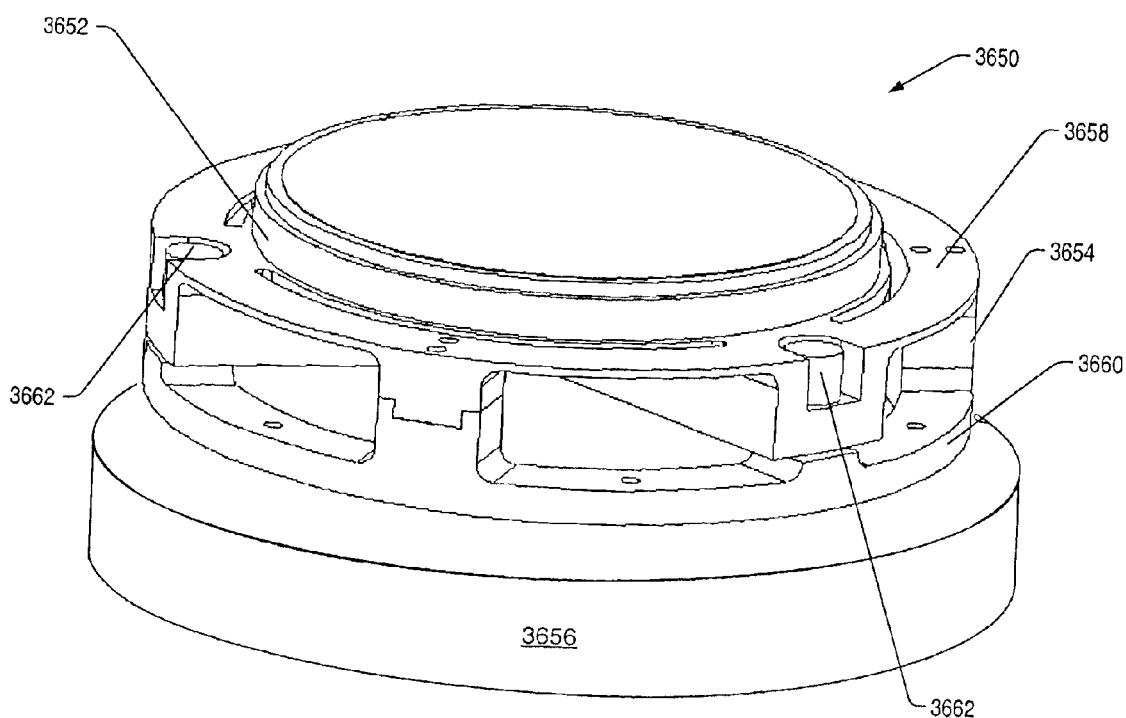
FIG. 38 depicts a motion stage that includes a fine orientation system.

Substrate tilt module may also include a fine orientation system. A substrate support that includes a fine orientation system is depicted in FIG. 38. To achieve fine orientation control, flexure ring 3658 includes a central recess in which substrate chuck 3652 is disposed. The depth of the central recess is such that an upper surface of a substrate disposed on substrate chuck 3652 is substantially even with an upper surface of flexure ring 3658. Fine orientation may be achieved using actuators 3662. Fine orientation is achieved by the use of actuators capable of controlled motion in the nanometer range. Alternatively, fine orientation may be achieved in a passive manner. Actuators may be substantially compliant. The compliance of the actuators may allow the substrate to self-correct for variations in tilt when a template is in contact with a liquid disposed on a substrate surface. By disposing the substrate in a position that is substantially even with the flexure ring, fine orientation may be achieved at the substrate-liquid interface during use. Compliance of actuators is thus transferred to the upper surface of the substrate to allow fine orientation of the substrate.

Figure 41:
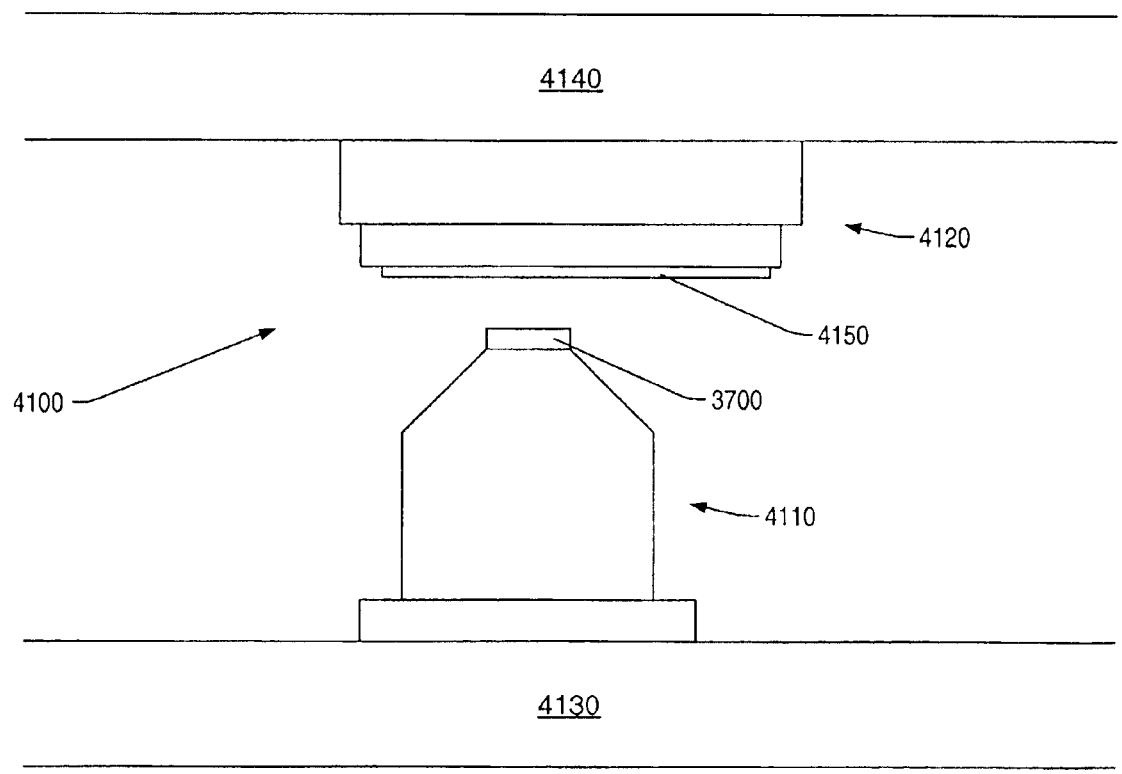
FIG. 41 depicts a schematic drawing of an imprint lithography system that includes an imprint head disposed below a substrate support.

The above described systems are generally configured to systems in which an activating light curable liquid is dispensed onto a substrate and the substrate and template are brought into proximity to each other. It should be understood, however, that the above-described systems may be modified to allow an activating light curable liquid to be applied to a template rather than the substrate. In such an embodiment, the template is placed below the substrate. FIG. 41 depicts a schematic drawing of an embodiment of a system 4100 that is configured such that the template is positioned below a substrate. System 4100 includes an imprint head 4110 and a substrate support 4120 positioned above imprint head 4110. Imprint head is configured to hold a template 3700. Imprint head may have a similar in design to any of the herein described imprint heads. For example, imprint head 4110 may include a fine orientation system as described herein. Imprint head is be coupled to imprint head support 4130. Imprint head may be coupled in a fixed position and remain substantially motionless during use. Alternatively, imprint head may be placed on a motion stage that allows X-Y planar motion of imprint head 4130 during use.

The substrate to be imprinted is mounted onto a substrate support 4120. Substrate support 4120 has a similar design to any of the herein described substrate supports. For example, substrate support 4120 may include a fine orientation system as described herein. Substrate support 4120 may be coupled to a support 4140 in a fixed position and remain substantially motionless during use. Alternatively, substrate support 4120 may be placed on a motion stage that allows X-Y planar motion of substrate support during use.

During use an activating light curable liquid is placed on a template 3700 disposed in imprint head. The template may be patterned or planar, depending on the type of operation to be performed. Patterned templates may be configured for use in positive, negative, or combinations of positive and negative imprint lithography systems as described herein.

Imprint Lithography Process
Negative Imprint Lithography Process

Figure 23A:
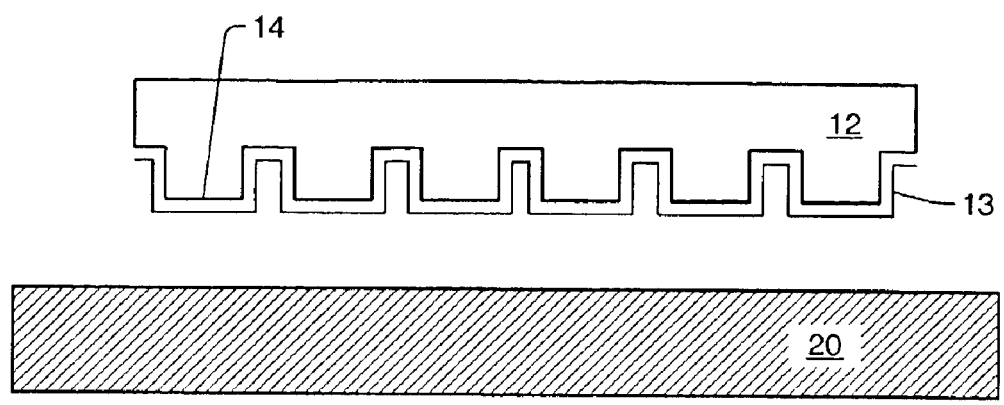
FIGS. 23A–23F depict cross-sectional views of a negative imprint lithography process.

A typical imprint lithography process is shown in FIGS. 23A–23F. As depicted in FIG. 23A, template 12 is positioned in a spaced relation to the substrate 20 such that a gap is formed between template 12 and substrate 20. Template 12 may include a surface that defines one or more desired features, which may be transferred to the substrate 20 during patterning. As used herein, a "feature size" generally refers to a width, length and/or depth of one of the desired features. In various embodiments, the desired features may be defined on the surface of template 12 as recesses and or a conductive pattern formed on a surface of the template. Surface 14 of template 12 may be treated with a thin layer 13 that lowers the template surface energy and assists in separation of template 12 from substrate 20. Surface treatment layers for templates are described herein.

Figure 23B:
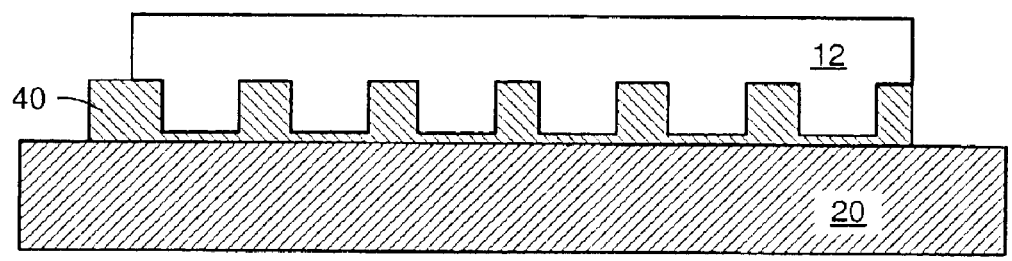

In an embodiment, substance 40 may be dispensed upon substrate 20 prior to moving template 12 into a desired position relative to substrate 20. Substance 40 may be a curable liquid that conforms to the shape of desired features of template 12. In an embodiment, substance 40 is a low viscosity liquid that at least partially fills the space of gap 31 without the use of high temperatures. Low viscosity liquids may also allow the gap between the template and the substrate to be closed without requiring high pressures. As used herein the term "low viscosity liquids" refer to liquids having a viscosity of less than about 30 centipoise measured at about 25° C. Further details regarding appropriate selections for substance 40 are discussed below. Template 12 may interact with curable liquid 40 to conform the liquid into a desire shape. For example, curable liquid 40 may conform to the shape of template 12 as depicted in FIG. 23B. The position of template 12 may be adjusted to create a desired gap distance between the template and substrate 20. The position of template 12 may also be adjusted to properly align the template with the substrate.

Figure 23C:
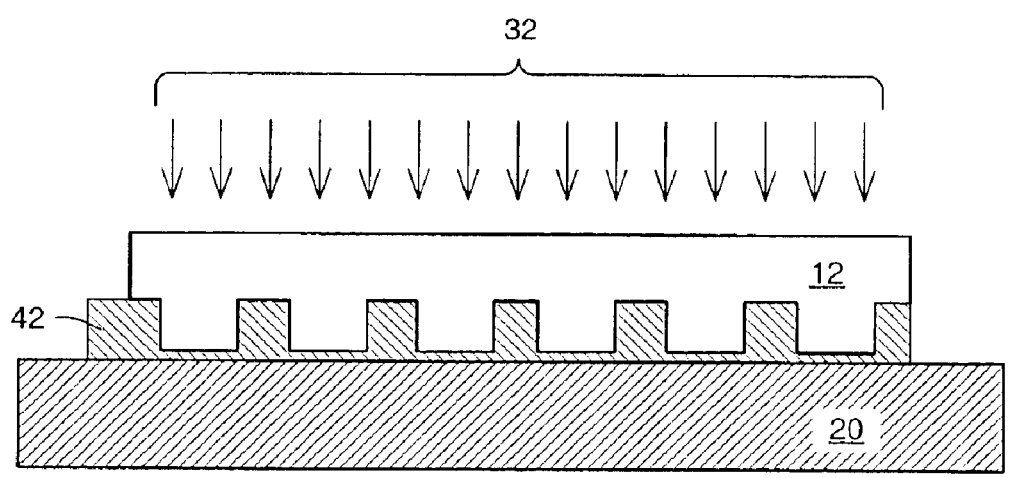
Figure 23D:
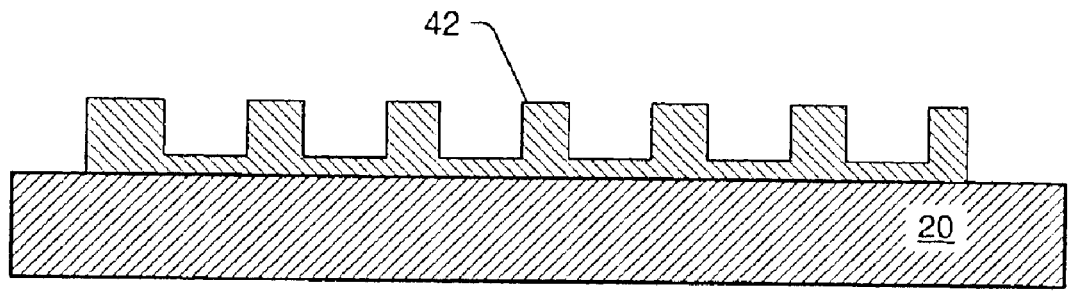

After template 12 is properly positioned, substance 40 is cured to form a masking layer 42 on the substrate. In an embodiment, substance 40 is cured using activating light 32 to form masking layer 42. Application of activating light through template 12 to cure the liquid is depicted in FIG. 23C. After the liquid is substantially cured, template 12 is removed from masking layer 42, leaving the cured masking layer on the surface of substrate 20, as depicted in FIG. 23D. Masking layer 42 has a pattern that is complementary to the pattern of template 12. Masking layer 42 may include a "base layer" (also called a "residual layer") between one or more desired features. The separation of template 12 from masking layer 42 is done so that desired features remain intact without shearing or tearing from the surface of substrate 20. Further details regarding separation of template 12 from substrate 20 following imprinting are discussed below.

Masking layer 42 may be used in a variety of ways. For example, in some embodiments, masking layer 42 may be a functional layer. In such embodiments, curable liquid 40 may be curable to form a conductive layer, a semiconductive layer, a dielectric layer and/or a layer having a desired mechanical or optical property. In another embodiment, masking layer 42 may be used to cover portions of substrate 20 during further processing of substrate 20. For example, masking layer 42 may be used during a material deposition process to inhibit deposition of the material on certain portions of the substrate. Similarly, masking layer 42 may be used as a mask for etching substrate 20. To simplify further discussion of masking layer 42, only its use as a mask for an etching process will be discussed in embodiments described below. However, it is recognized that masking layers in embodiments described herein may be used in a variety of processes as previously described.

Figure 23E:
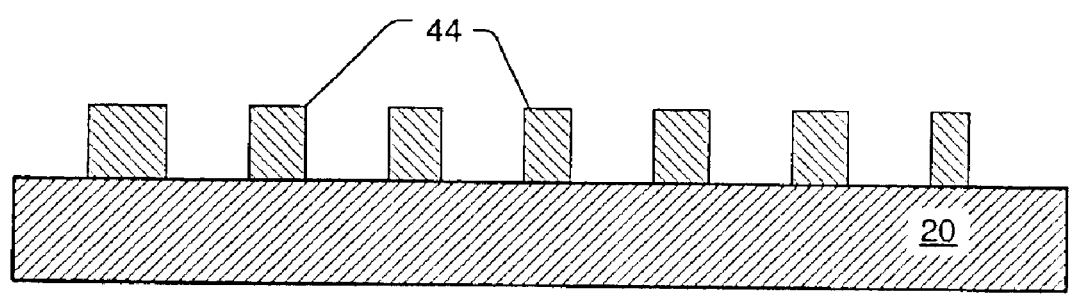
Figure 23F:
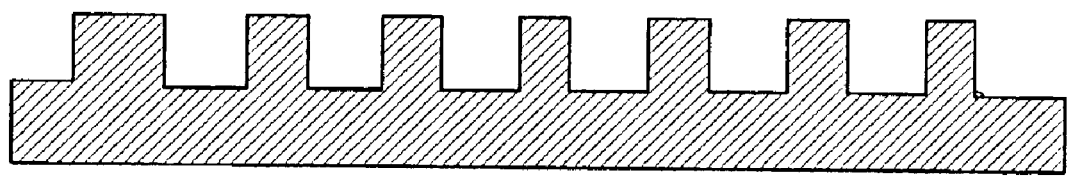

For use in an etch process, masking layer 42 may be etched using an etch process until portions of substrate 20 are exposed through masking layer 42, as depicted in FIG. 23E. That is, portions of the base layer may be etched away.

Portions 44 of masking layer 42 may remain on substrate 20 for use in inhibiting etching of portions of substrate 20. After etching of masking layer 42 is complete, substrate 20 may be etched using known etching processes. Portions of substrate 20 disposed under portions 44 of masking layer 42 may remain substantially unetched while the exposed portions of substrate 20 are etched. In this manner, a pattern corresponding to the pattern of template 12 may be transferred to substrate 20. The remaining portions 44 of masking layer 42 may be removed leaving a patterned substrate 20, depicted in FIG. 23F.

FIGS. 24A–24D illustrate an embodiment of an imprint lithography process using a transfer layer. A transfer layer 18 may be formed upon an upper surface of substrate 20. Transfer layer 18 may be formed from a material that has different etch characteristics than underlying substrate 20 and/or a masking layer formed from a curable liquid 40. That is, each layer (e.g., transfer layer 18, masking layer and/or substrate 20) may be etched at least somewhat selectively with respect to the other layers.

Figure 24A:
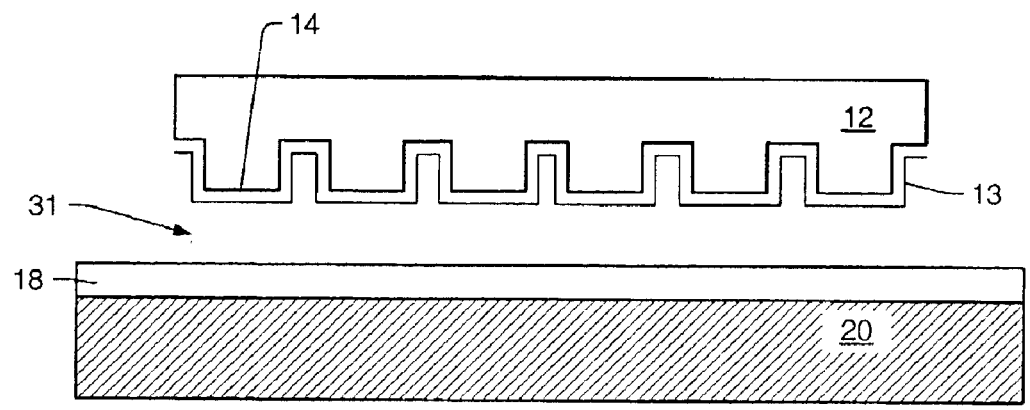
FIGS. 24A–24D depict cross-sectional views of a negative imprint lithography process with a transfer layer.
Figure 24B:
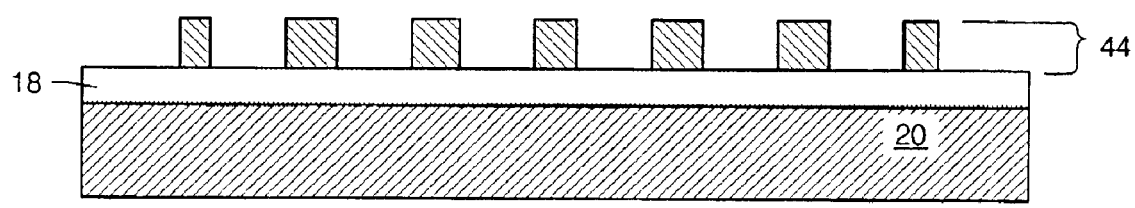

A masking layer 44 is formed on the surface of transfer layer 18 by depositing a curable liquid on the surface of transfer layer 18 and curing the masking layer as described with reference to FIGS. 23A–23C. Masking layer 42 may be used as a mask for etching transfer layer 18. Masking layer 42 is etched using an etch process until portions of transfer layer 18 are exposed through masking layer 42, as depicted in FIG. 24B. Portions 44 of masking layer 42 remain on transfer layer 18 and may be used to inhibit etching of portions of the transfer layer. After etching of masking layer 42 is complete, transfer layer 18 may be etched using known etching processes. Portions of transfer layer 18 disposed under portions 44 of masking layer 42 may remain substantially unetched while the exposed portions of transfer layer 18 are etched. In this manner, the pattern of masking layer 42 is replicated in transfer layer 18.

Figure 24C:
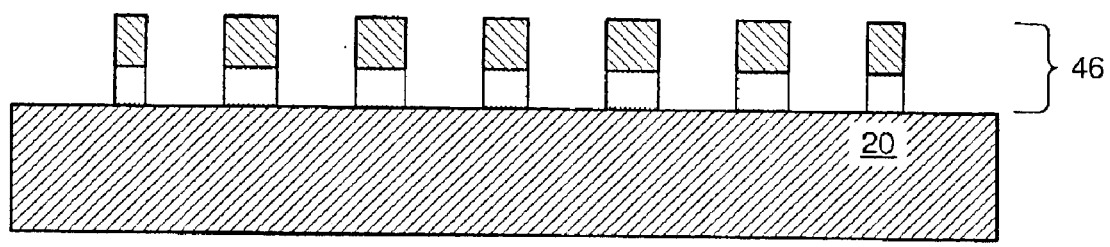
Figure 24D:
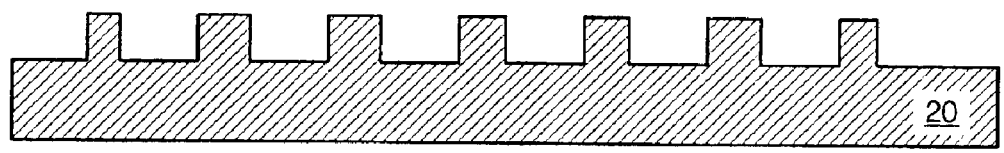

In FIG. 24C, portions 44 and etched portions of transfer layer 18 together form a masking stack 46 that may be used to inhibit etching of portions of the underlying substrate 20. Etching of substrate 20 may be performed using a known etch process (e.g., a plasma etching process, a reactive ion etching process, etc.). As depicted in FIG. 24D, the masking stack may inhibit etching of the underlying portions of substrate 20. Etching of the exposed portions of substrate 20 may be continued until a predetermined depth is reached. An advantage of using a masking stack as a mask for etching of substrate 20 is that the combined stack of layers may create a high aspect ratio mask (i.e., a mask that has a greater height than width). A high aspect ratio masking layer may be desirable during the etching process to inhibit undercutting of the mask portions.

The processes depicted in FIGS. 23A–23F and FIGS. 24A–24D are examples of negative imprint lithography processes. As used herein a "negative imprint lithography" process generally refers to a process in which the curable liquid is substantially conformed to the shape of the template before curing. That is, a negative image of the template is formed in the cured liquid. As depicted in these figures, the non-recessed portions of the template become the recessed portions of the mask layer. The template, therefore, is designed to have a pattern that represents a negative image of the pattern to be imparted to the mask layer.

Positive Imprint Lithography

As used herein a "positive imprint lithography" process generally refers to a process in which the pattern formed in the mask layer is a mirror image of the pattern of the template. As will be further described below, the non-recessed portions of the template become the non-recessed portions of the mask layer.

Figure 25A:
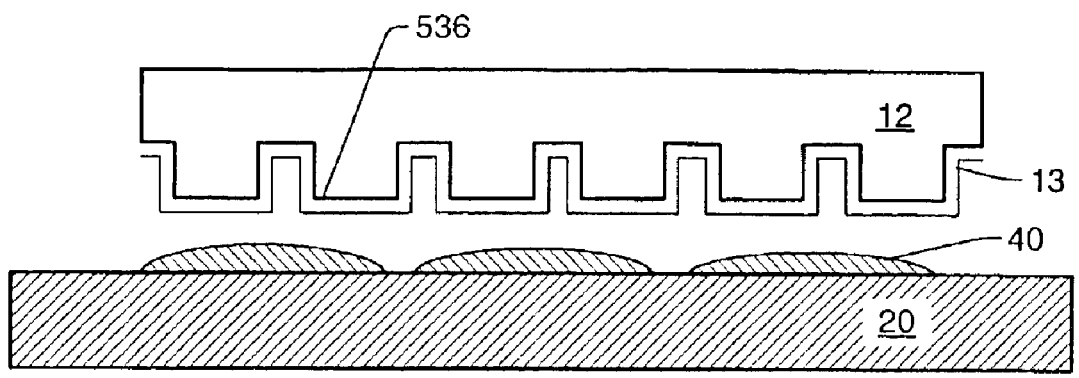
FIGS. 25A–25D depict cross-sectional views of a positive imprint lithography process.

A typical positive imprint lithography process is shown in FIGS. 25A–25D. As depicted in FIG. 25A, template 12 is positioned in a spaced relation to the substrate 20 such that a gap is formed between template 12 and substrate 20. Surface of template 12 may be treated with a thin surface treatment layer 13 that lowers the template surface energy and assists in separation of template 12 from the cured masking layer.

Figure 25B:
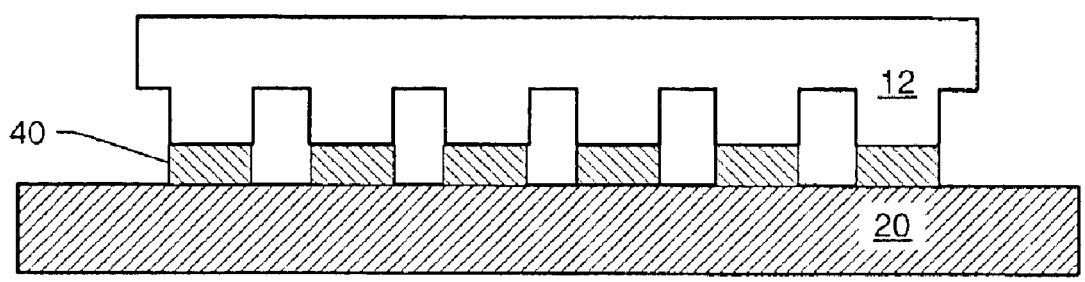
Figure 25C:
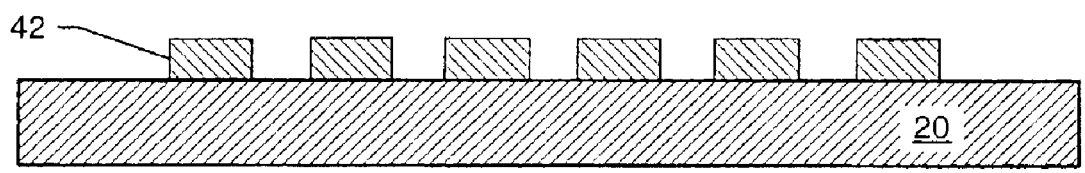
Figure 25D:
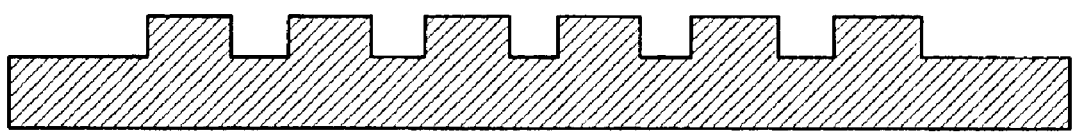

A curable liquid 40 is disposed on the surface of substrate 20. Template 12 is brought into contact with curable liquid 40. As depicted in FIG. 25B, the curable liquid fills the gap between the lower surface of the template and the substrate. In contrast to a negative imprint lithography process, curable liquid 40 is substantially absent from regions of the substrate approximately below at least a portion of the recesses of the template. Thus, curable liquid 40 is maintained as a discontinuous film on the substrate that is defined by the location of at least a portion of the recesses of template 12. After template 12 is properly positioned, curable liquid 40 is cured to form a masking layer 42 on the substrate. Template 12 is removed from masking layer 42, leaving the cured masking layer on the surface of substrate 20, as depicted in FIG. 25C. Masking layer 42 has a pattern that is complementary to the pattern of template 12. Masking layer 42 may be used to inhibit etching of portions of substrate 20. After formation of masking layer 42 is complete, substrate 20 may be etched using known etching processes. Portions of substrate 20 disposed under masking layer 42 may remain substantially unetched while the exposed portions of substrate 20 are etched, as depicted in FIG. 25D. In this manner, the pattern of template 12 may be replicated in substrate 20. The remaining portions 44 of masking layer 42 may be removed to create a patterned substrate 20.

Figure 26A:
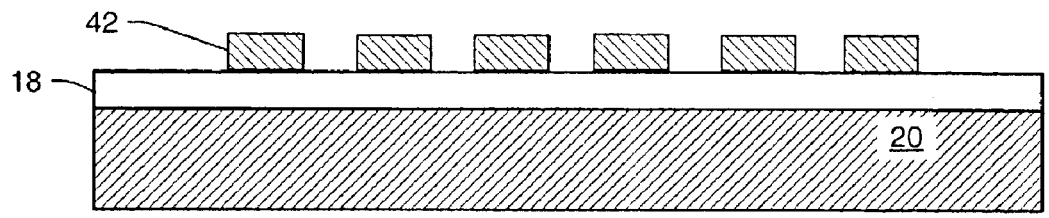
FIGS. 26A–26C depict cross-sectional views of a positive imprint lithography process with a transfer layer.
Figure 26B:
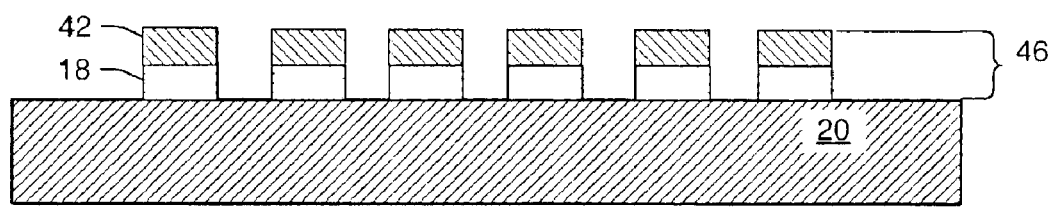
Figure 26C:
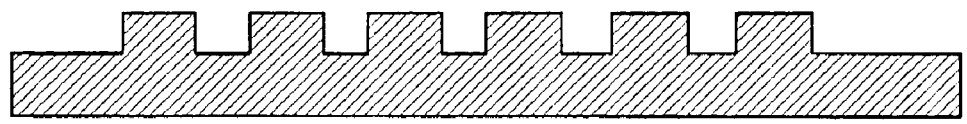

FIGS. 26A–26C illustrate an embodiment of a positive imprint lithography process using a transfer layer. A transfer layer 18 may be formed upon an upper surface of a substrate 20. Transfer layer 18 is formed from a material that has different etch characteristics than the underlying transfer layer 18 and/or substrate 20. A masking layer 42 is formed on the surface of transfer layer 18 by depositing a curable liquid on the surface of transfer layer 18 and curing the masking layer as described with reference to FIGS. 25A–25C.

Masking layer 42 may be used as a mask for etching transfer layer 18. Masking layer 42 may inhibit etching of portions of transfer layer 18. Transfer layer 18 may be etched using known etching processes. Portions of transfer layer 18, disposed under masking layer 42 may remain substantially unetched while the exposed portions of transfer layer 18 are etched. In this manner, the pattern of masking layer 42 may be replicated in transfer layer 18.

In FIG. 26B, masking layer 42 and etched portions of transfer layer 18 together form a masking stack 46 that may be used to inhibit etching of portions of the underlying substrate 20. Etching of substrate 20 may be performed using known etching processes (e.g., a plasma etching process, a reactive ion etching process, etc.). As depicted in FIG. 26C, the masking stack may inhibit etching of the underlying portions of substrate 20. Etching of the exposed portions of substrate 20 may be continued until a predetermined depth is reached.

Positive/Negative Imprint Lithography

Figure 27A:
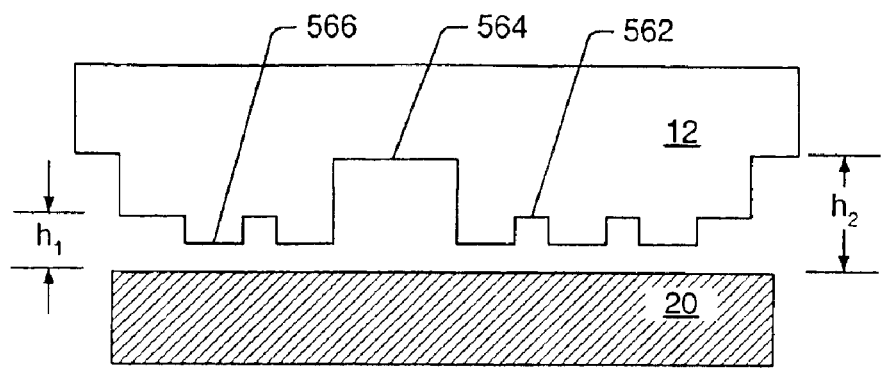
FIGS. 27A–27D depict cross-sectional views of a combined positive and negative imprint lithography process.

In an embodiment, a process may combine positive and negative imprint lithography. A template for a combined positive and negative imprint lithography process may include recesses suitable for positive lithography and recesses suitable for negative lithography. For example, an embodiment of a template for combined positive and negative imprint lithography is depicted in FIG. 27A. Template 12, as depicted in FIG. 27A, includes a lower surface 566, at least one first recess 562, and at least one second recess 564. First recess 562 is configured to create a discontinuous portion of curable liquid 40 when the template contacts the curable liquid. A height of first recess ($h_2$) is substantially greater than a height of second recess ($h_1$).

A typical combined imprint lithography process is shown in FIGS. 27A–27D. As depicted in FIG. 27A, template 12 is positioned in a spaced relation to the substrate 20 such that a gap is formed between template 12 and substrate 20. At least the lower surface 566 of template 12 may be treated with a thin surface treatment layer (not shown) that lowers the template surface energy and assists in separation of template 12 from the cured masking layer. Additionally, surfaces of first recesses 562 and/or second recesses 564 may be treated with the thin surface treatment layer.

Figure 27B:
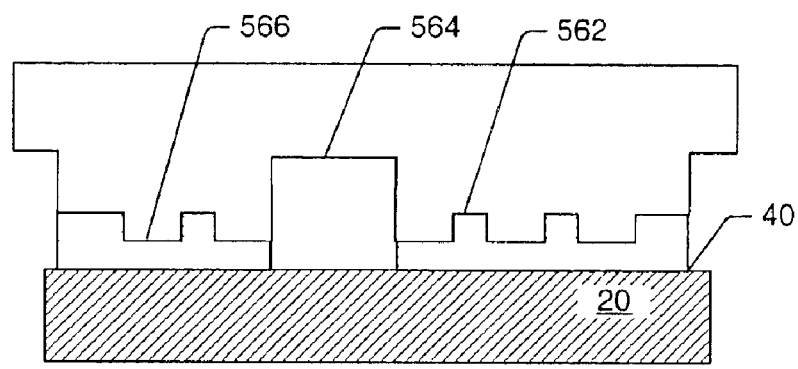
Figure 27C:
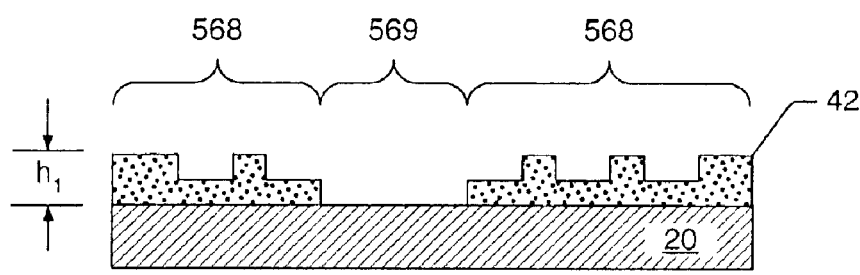

A curable liquid 40 is disposed on the surface of substrate 20. Template 12 is brought into contact with curable liquid 40. As depicted in FIG. 27B, the curable liquid fills the gap between the lower surface of the template 566 and substrate 20. Curable liquid 40 also fills first recesses 562. However, curable liquid 40 is substantially absent from regions of the substrate approximately below second recesses 564. Thus, curable liquid 40 is maintained as a discontinuous film on the substrate that includes surface topography corresponding to the pattern formed by first recesses 562. After template 12 is properly positioned, curable liquid 40 is cured to form a masking layer 42 on the substrate. Template 12 is removed from masking layer 42, leaving the cured masking layer on the surface of substrate 20, as depicted in FIG. 27C. Mask layer 42 may include a region 568 that resembles a mask layer formed by negative imprint lithography. In addition, mask layer 42 may include a region 569 that does not include any masking material.

Figure 27D:

In one embodiment, mask layer 42 is composed of a material that has the same or a similar etch rate as the underlying substrate. An etch process is be applied to masking layer 42 to remove the masking layer and substrate at substantially the same etch rate. In this manner the multilayer pattern of the template may be transferred to the substrate, as depicted in FIG. 27D. This process may also be performed using a transfer layer as described in other embodiments.

A combination of positive and negative lithography is also useful for patterning multiple regions of a template. For example, a substrate may include a plurality of regions that require patterning. As depicted in FIG. 27C, a template with multiple depth recesses includes two patterning regions 568 with an intervening "channel" region 569. Channel region 569 inhibits flow of a liquid beyond the patterning area of the template.

Step and Repeat

As used herein, a "step and repeat" process refers to using a template smaller than the substrate to form a plurality of patterned regions on the substrate. A step and repeat imprint process includes depositing a light curable liquid on a portion of a substrate, aligning a pattern in the cured liquid to previous patterns on the substrate, impressing a template into the liquid, curing the liquid, and separating the template from the cured liquid. Separating the template from the substrate may leave an image of the topography of the template in the cured liquid. Since the template is smaller than the total surface area of the substrate, only a portion of the substrate includes the patterned cured liquid. The "repeat" portion of the process includes depositing a light curable liquid on a different portion of the substrate. A patterned template is then aligned with the substrate and contacted with the curable liquid. The curable liquid is cured using activating light to form a second area of cured liquid. This process may be continually repeated until most of the substrate is patterned. Step and repeat processes may be used with positive, negative, or positive/negative imprint processes. Step and repeat processes may be performed with any embodiments of equipment described herein.

Step and repeat imprint lithography processes offer a number of advantages over other techniques. Step and repeat processes described herein are based on imprint lithography that uses low viscosity light curable liquids and rigid, transparent templates. The templates are transparent to liquid activating light and alignment mark detection light thus offering the potential for layer-to-layer alignment. For production-scale imprint lithography of multi-level devices, it is advantageous to possess very high-resolution layer-to-layer alignment (e.g., as low as $\frac{1}{3}^{rd}$ of the minimum feature size ("MFS")).

There are various sources of distortion errors in making of the templates. Step and repeat processes are used so that only a portion of a substrate is processed during a given step. The size of the field processed during each step should be small enough to possess pattern distortions of less than $\frac{1}{3}^{rd}$ the MFS. This necessitates step and repeat patterning in high-resolution imprint lithography. This is also the reason why most optical lithography tools are step and repeat systems. Also, as discussed before, a need for low CD variations and defect inspection/repair also favors processing of small fields.

In order to keep process costs low, it is important for lithography equipment to possess sufficiently high throughput. Throughput requirements put a stringent limit on the patterning time allowed per field. Low viscosity liquids that are light curable are attractive from a throughput point of view. These liquids move much faster to properly fill the gap between the template and the substrate and the lithography capability is pattern independent. The resulting low pressure, room temperature processing is suitable for high throughput, while retaining the benefits of layer-to-layer alignment.

While prior inventions have addressed patterning of low viscosity light curable liquids, they have not addressed this for a step and repeat process. In photolithography as well as in hot embossing, a film is spin coated and hard baked onto the substrate prior to its patterning. If such an approach is used with low viscosity liquids, there are three major problems. Low viscosity liquids are difficult to spin coat since they tend to de-wet and cannot retain the form of a continuous film. Also, in a step and repeat process, the liquid undergoes evaporation thereby causing varying amounts of liquid to be left behind on the substrate as the template steps and repeats over the substrate. Finally, a blanket light exposure tends to disperse beyond the specific field being patterned. This tends to cause partial curing of the subsequent field, thereby affecting the fluid properties of the liquid prior to imprinting. An approach that dispenses liquid suitable for a single field onto the substrate, one field at a time, may solve the above three problems. However, it is important to accurately confine the liquid to that particular field to avoid loss of usable area on the substrate.

In general, lithography is one of many unit processes used in the production of devices. The cost of all these processes, particularly in multi-layer devices, makes it highly desirable to place patterned regions as close as possible to each other without interfering with subsequent patterns. This effectively maximizes the usable area and hence the usage of the substrate. Also, imprint lithography may be used in a "mix-and-match" mode with other kinds of lithography (such as optical lithography) wherein different levels of the same device are made from different lithography technologies. It is advantageous to make the imprint lithography process compatible with other lithography techniques. A "kerf" region is the region that separates two adjacent fields on a substrate. In state-of-the-art optical lithography tools this kerf region may be as small as 50–100 microns. The size of the kerf is typically limited by the size of the blades used to separate the patterned regions. This small kerf region is expected to get smaller as the dicing blades that dice the individual chips get thinner. In order to accommodate this stringent kerf size requirement, the location of any excess liquid that is expelled from the patterned area should be well confined and repeatable. As such, the individual components, including the template, substrate, liquid and any other materials that affect the physical properties of the system, including but not limited to surface energy, interfacial energies, Hamacker constants, Van der Waals' forces, viscosity, density, opacity, etc., are engineered as described herein to properly accommodate a repeatable process.

Formation of Discontinuous Films

As discussed previously, discontinuous films are formed using an appropriately patterned template. For example, a template with high aspect ratio recesses that define a border region can inhibit the flow of a liquid beyond the border area. The inhibition of the liquid within a border area is influenced by a number of factors. As discussed above template design plays a role in the confinement of a liquid. Additionally, the process by which the template is contacted with the liquid also influences the confinement of the liquid.

FIGS. 19 A–C depict a cross-sectional view of a process wherein discontinuous films are formed on a surface. In one embodiment, a curable liquid 40 is dispensed onto a substrate 20 as a pattern of lines or droplets, as depicted in FIG. 19A. Curable liquid 40, therefore, does not cover an entire area of substrate 20 to be imprinted. As the lower surface 536 of template 12 contacts liquid 40, the force of the template on the liquid causes the liquid to spread over the surface of substrate 20, as depicted in FIG. 19B. Generally, the more force that is applied by the template to the liquid, the further the liquid will spread over the substrate. Thus, if a sufficient amount of force is applied, the liquid may be forced beyond a perimeter of the template, as depicted in FIG. 19C. By controlling the forces applied to the liquid by the template the liquid is confined within the predetermined borders of the template, as depicted in FIG. 19D.

The amount of force applied to the liquid is related to the amount of liquid dispensed on the substrate and the distance the template is from the substrate during curing. For a negative imprint lithography process the amount of fluid dispensed onto the substrate should be less than or equal to a volume defined by: the volume of liquid required to substantially fill the recesses of the patterned template, the area of the substrate to be patterned, and the desired thickness of the cured layer. If the amount of cured liquid exceeds this volume, the liquid will be displaced from the perimeter of the template when the template is brought to the appropriate distance from the substrate. For a positive imprint lithography process the amount of liquid dispensed onto the substrate should be less than the volume defined by: the desired thickness of the cured layer (i.e., the distance between the non-recessed portions of the template and the substrate and the surface area of the portion of the substrate to be patterned.

For an imprint lithography processes that uses a template that includes a border, the distance between the non-recessed surface of the template and the substrate is set between the minimum film thickness and the maximum film thickness, as previously described. Setting the height between these values allows the appropriate capillary forces to contain the liquid within the border defined areas of the template. Additionally, the thickness of the layer should be approximately comparable to the height of the patterned features. If the cured layer is too thick, the features formed in the cured layer may be eroded before the features can be transferred to the underlying substrate. It is therefore desirable to control the volume as described above to fall to allow the appropriate film thickness to be used.

The force applied by the template to the liquid is also influenced by the rate at which the template is brought into contact with the liquid. Generally, the faster the template is brought into contact the more force is applied to the liquid. Thus, some measure of control of the spread of liquid on the surface of the substrate may be achieved by controlling the rate at which the template is brought into contact with the liquid.

All of these features are considered when positioning the template with respect to the substrate for an imprint lithography process. By controlling these variables in a predetermined manner, the flow of liquid may be controlled to stay confined within a predetermine area.

Alignment Techniques

Overlay alignment schemes include measurement of alignment errors followed by compensation of these errors to achieve accurate alignment of a patterned template and a desired imprint location on a substrate. Correct placement of the template with respect to the substrate is important for achieving proper alignment of the patterned layer with any previously formed layers on the substrate. Placement error, as used herein, generally refers to X-Y positioning errors between a template and substrate (that is, translation along the X and/or Y-axis). Placement errors, in one embodiment, are determined and corrected for by using a through the template optical device, as depicted in FIG. 14.

Figure 28:
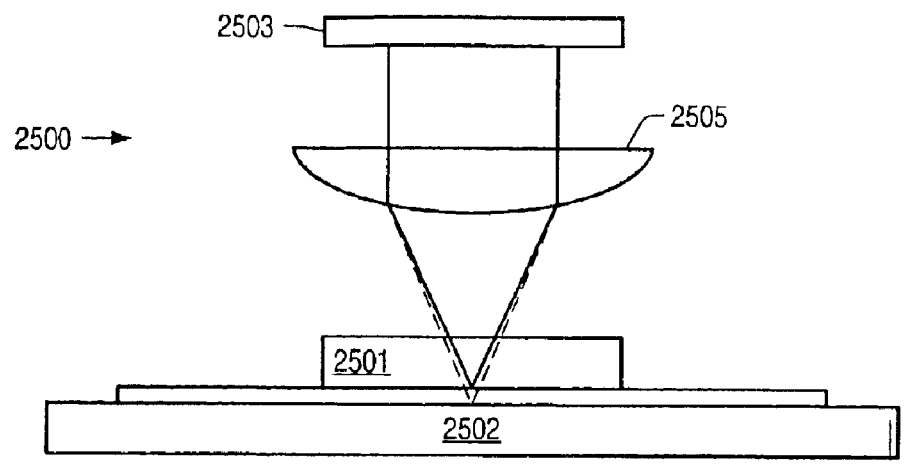
FIG. 28 depicts a schematic of an optical alignment measuring device positioned over a template and substrate.
Figure 29:
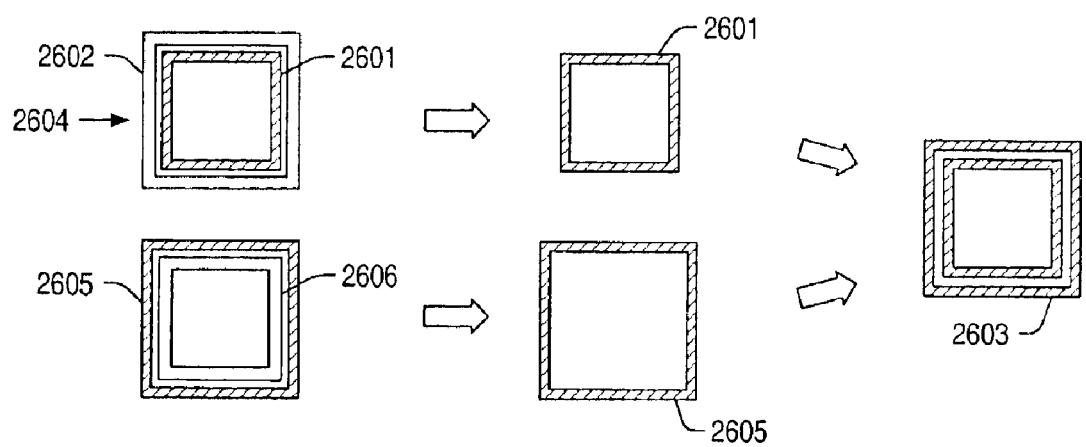
FIG. 29 depicts a scheme for determining the alignment of a template with respect to a substrate using alignment marks by sequentially viewing and refocusing.

FIG. 28 illustrates a schematic diagram of an optical system 3820 of through the template optical imaging system 3800 (See also FIG. 14). Optical system 3820 is configured to focus two alignment marks from different planes onto a single focal plane. Optical system 3820 may use the change of focal length resulting from light with distinct wavelengths to determine the alignment of the template with an underlying substrate. Optical system 3820 may include an optical imaging device 3810, an illumination source (not shown), and a focusing device 3805. Light with distinct wavelengths may be generated either by using individual light sources or by using a single broad band light source and inserting optical band-pass filters between the imaging plane and the alignment marks. Depending on the gap between the template 3700 and substrate 2500, different wavelengths are selected to adjust the focal lengths. Under each wavelength of light used, each overlay mark may produce two images on the imaging plane as depicted in FIG. 29. A first image 2601, using a specific wavelength of light, is a clearly focused image. A second image 2602, using the same wavelength of light, is an out-of-focus image. In order to eliminate each out-of-focus image, several methods may be used.

In a first method, under illumination with a first wavelength of light, two images may be received by optical imaging device 3810. Images are depicted in FIG. 29 and generally referenced by numeral 2604. While images are depicted as squares, it should be understood that any other shape may be used, including crosses. Image 2602 corresponds to an overlay alignment mark on the substrate. Image 2601 corresponds to an overlay alignment mark on the template. When image 2602 is focused, image 2601 is out of focus. In an embodiment, an image processing technique may be used to erase geometric data corresponding to pixels associated with image 2602. Thus, the out of focus image of the substrate mark may be eliminated, leaving only image 2601. Using the same procedure and a second wavelength of light, image 2605 and 2606 may be formed on optical imaging device 3810. The out of focus image 2606 is then eliminated, leaving only image 2605. The two remaining focused images 2601 and 2605 are then combined onto a single imaging plane 2603 for making overlay error measurements.

Figure 30:
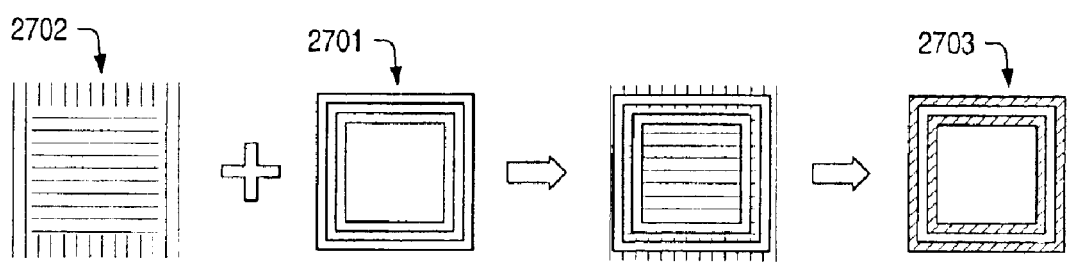
FIG. 30 depicts a scheme for determining the alignment of a template with respect to a substrate using alignment marks and polarized filters.

A second method may utilize two coplanar polarizing arrays, as depicted in FIG. 30, and polarized illumination sources. FIG. 30 illustrates overlay marks 2701 and orthogonally polarized arrays 2702. Polarizing arrays 2702 are formed on the template surface or placed above the surface. Under two polarized illumination sources, only focused images 2703 (each corresponding to a distinct wavelength and polarization) may appear on the imaging plane. Thus, out of focus images are filtered out by polarizing arrays 2702. An advantage of this method may be that it may not require an image processing technique to eliminate out-focused images.

Moire pattern based overlay measurement has been used for optical lithography processes. For imprint lithography processes, where two layers of Moire patterns are not on the same plane but still overlapped in the imaging array, acquiring two individual focused images may be difficult to achieve. However, carefully controlling the gap between the template and substrate within the depth of focus of the optical measurement tool and without direct contact between the template and substrate may allow two layers of Moire patterns to be simultaneously acquired with minimal focusing problems. It is believed that other standard overlay schemes based on the Moire patterns may be directly implemented to imprint lithography process.

Another concern with overlay alignment for imprint lithography processes that use UV curable liquid materials may be the visibility of the alignment marks. For the overlay placement error measurement, two overlay marks, one on the template and the other on substrate are used. However, since it is desirable for the template to be transparent to a curing agent, the template overlay marks, in some embodiments, are not opaque lines. Rather, the template overlay marks are topographical features of the template surface. In some embodiment, the marks are made of the same material as the template. In addition, UV curable liquids may have a refractive index that is similar to the refractive index of the template materials (e.g., quartz). Therefore, when the UV curable liquid fills the gap between the template and the substrate, template overlay marks may become very difficult to recognize. If the template overlay marks are made with an opaque material (e.g., chromium), the UV curable liquid below the overlay marks may not be properly exposed to the UV light.

Figure 31:
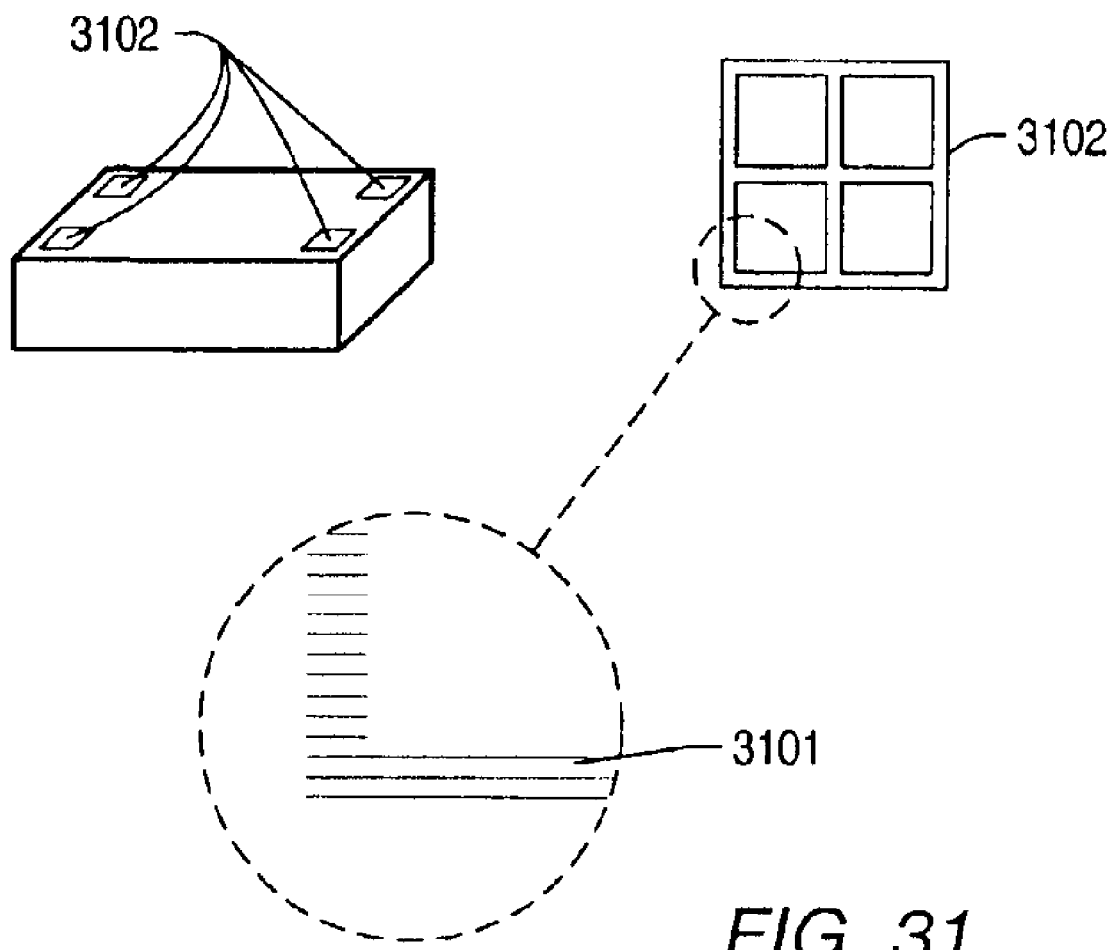
FIG. 31 depicts a top view of an alignment mark that is formed from polarizing lines.

In an embodiment, overlay marks are used on the template that are seen by the optical imaging system 3800 but are opaque to the curing light (e.g., UV light). An embodiment of this approach is illustrated in FIG. 31. In FIG. 31, instead of completely opaque lines, overlay marks 3102 on the template may be formed of fine polarizing lines 3101. For example, suitable fine polarizing lines have a width about ½ to ¼ of the wavelength of activating light used as the curing agent. The line width of polarizing lines 3101 should be small enough so that activating light passing between two lines is diffracted sufficiently to cause curing of all the liquid below the lines. In such an embodiment, the activating light may be polarized according to the polarization of overlay marks 3102. Polarizing the activating light provides a relatively uniform exposure to all the template regions including regions having overlay marks 3102. Light used to locate overlay marks 3102 on the template may be broadband light or a specific wavelength that may not cure the liquid material. This light need not be polarized. Polarized lines 3101 are substantially opaque to the measuring light, thus making the overlay marks visible using established overlay error measuring tools. Fine polarized overlay marks are fabricated on the template using existing techniques, such as electron beam lithography.

In another embodiment, overlay marks are formed of a different material than the template. For example, a material selected to form the template overlay marks may be substantially opaque to visible light, but transparent to activating light used as the curing agent (e.g., UV light). For example, SiOx where X is less than 2 may be used as such a material. In particular, structures formed of SiOx where X is about 1.5 are substantially opaque to visible light, but transparent to UV curing light.

Liquid Dispensing Patterns

In all embodiments of an imprint lithography process, a liquid is dispensed onto a substrate. While the following description is directed to dispensing liquids on substrate, it should be understood that the same liquid dispensing techniques are also used when dispensing liquids onto a template. Liquid dispensing is a carefully controlled process. In general, liquid dispensing is controlled such that a predetermined amount of liquid is dispensed in the proper location on the substrate. Additionally, the volume of liquid is also controlled. The combination of the proper volume of liquid and the proper location of the liquid is controlled by using the liquid dispensing systems described herein. Step and repeat processes, in particular, use a combination of liquid volume control and liquid placement to confine patterning to a specified field.

Figure 32A:
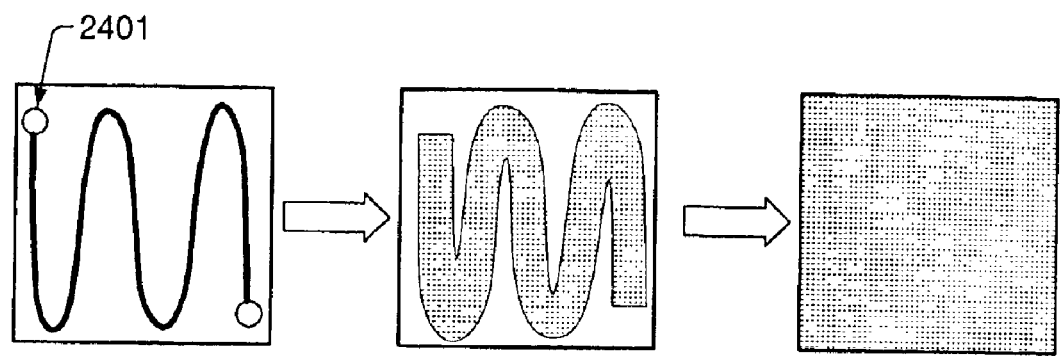
FIGS. 32A–32C depict top views of patterns of curable liquid applied to a substrate.
Figure 32B:
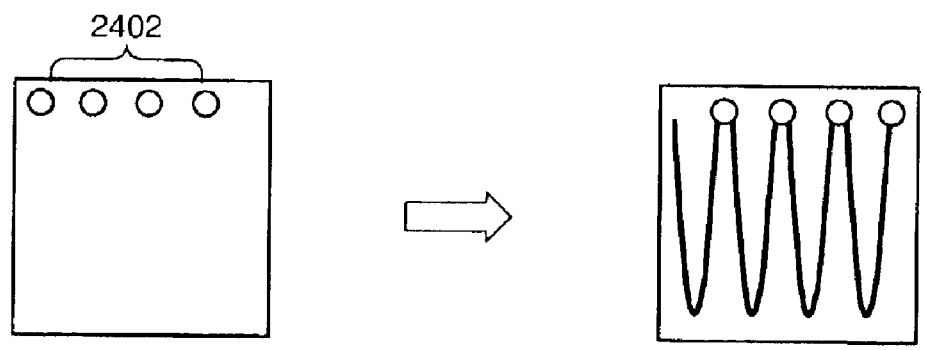
Figure 32C:
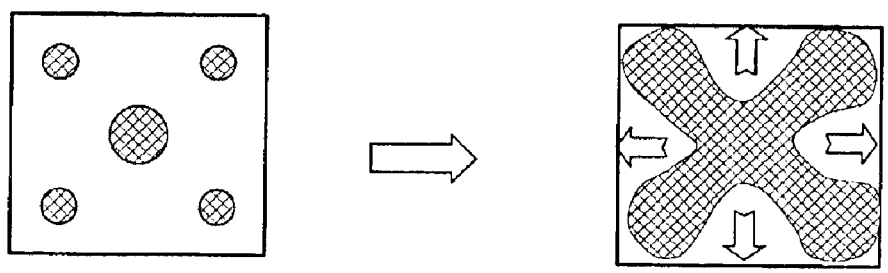

A variety of liquid dispensing patterns are used. Patterns may be in the form a continuous lines or patterns of droplets of liquid. In some embodiments, relative motion between a displacement based liquid dispenser tip and an imprinting member is used to form a pattern with substantially continuous lines on a portion of the imprinting member. Balancing rates of dispensing and relative motion is used to control the size of the cross section of the line and the shape of the line. During the dispensing process, the dispenser tips are fixed near (e.g., on the order of tens of microns) to the substrate. Two examples of continuous patterns are depicted in FIGS. 32A and 32B. The pattern depicted in FIGS. 32A and 32B is a sinusoidal pattern; however, other patterns are possible. As depicted in FIGS. 32A and 32B continuous line pattern may be drawn using either a single dispenser tip 2401 or multiple dispenser tips 2402. Alternate, a pattern of droplets may be used, as depicted in FIG. 32C. In one embodiment, a pattern of droplets that has a central droplet that has a greater volume than surrounding droplets is used. When the template contacts the droplets, the liquid spreads to fill the patterning area of the template as indicated in the FIG. 32C.

Dispensing rate, $V_d$, and relative lateral velocity of an imprinting member, $v_s$, may be related as follows:

$$v_d = V_d/t_d \text{ (dispensing volume/dispensing period)}, \quad (1)$$

$$v_s = L/t_d \text{ (line length/dispensing period)}, \quad (2)$$

$$V_d = a\,L \text{ (where, 'a' is the cross section area of line pattern)}, \quad (3)$$

Therefore, $$v_d = a\,v_s. \quad (4)$$

The width of the initial line pattern may normally depend on the tip size of a dispenser. The dispenser tip may be fixed. In an embodiment, a liquid dispensing controller is used to control the volume of liquid dispensed ($V_d$) and the time taken to dispense the liquid ($t_d$). If $V_d$ and $t_d$ are fixed, increasing the length of the line leads to lower height of the cross section of the line patterned. Increasing pattern length may be achieved by increasing the spatial frequency of the periodic patterns. Lower height of the pattern may lead to a decrease in the amount of liquid to be displaced during imprint processes. By using multiple tips connected to the same dispensing line, line patterns with long lengths may be formed faster as compared to the case of a single dispenser tip. Alternatively a plurality of closely spaced drops is used to form a line with an accurate volume.

Separation of Template

After curing of the liquid is completed, the template is separated from the cured liquid. Since the template and substrate are almost perfectly parallel, the assembly of the template, imprinted layer, and substrate leads to a substantially uniform contact between the template and the cured liquid. Such a system may require a large separation force to separate the template from the cured liquid. In the case of a flexible template or substrate, the separation, in one embodiment, is performed using a "peeling process." However, use of a flexible template or substrate may be undesirable for high-resolution overlay alignment. In the case of a quartz template and a silicon substrate, a peeling process may be difficult to implement. In one embodiment, a "peel and pull" process is performed to separate the template from an imprinted layer. An embodiment of a peel and pull process is illustrated in FIGS. 33A, 33B, and 33C.

Figure 33A:
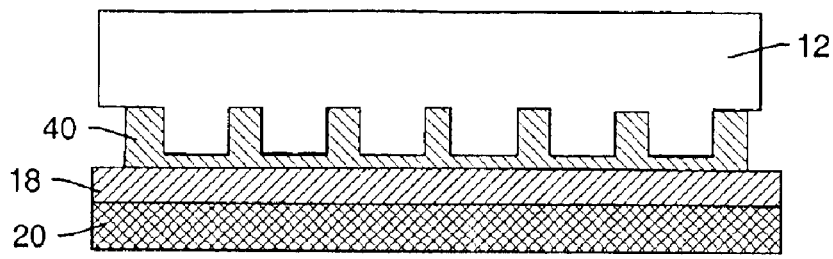
FIGS. 33A–33C depict a scheme for removing a template from a substrate after curing.
Figure 33B:
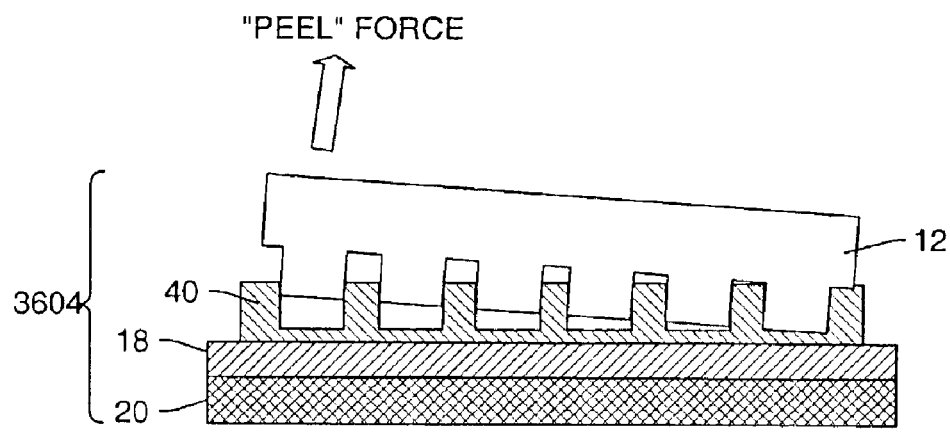
Figure 33C:
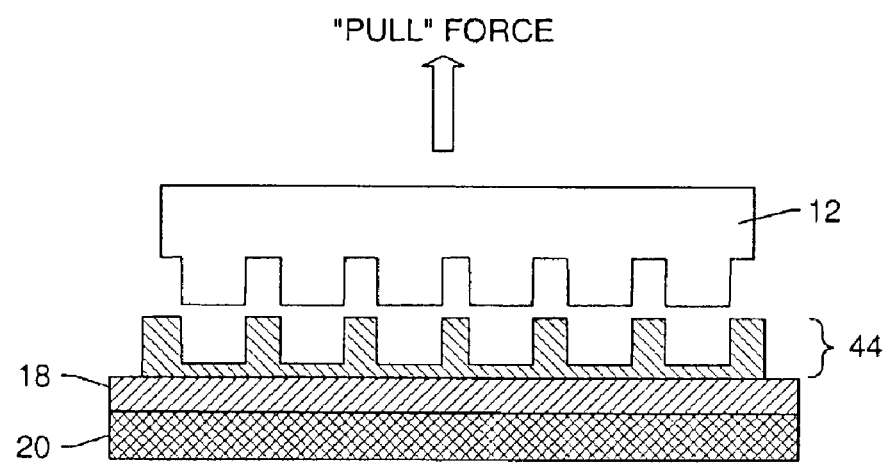
Figure 35A:
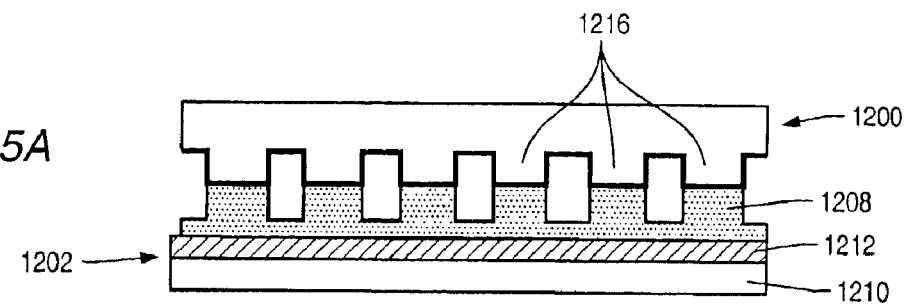
FIGS. 35A–35D depict a first embodiment of a process for forming nanoscale structures using contact with a template.
Figure 35B:
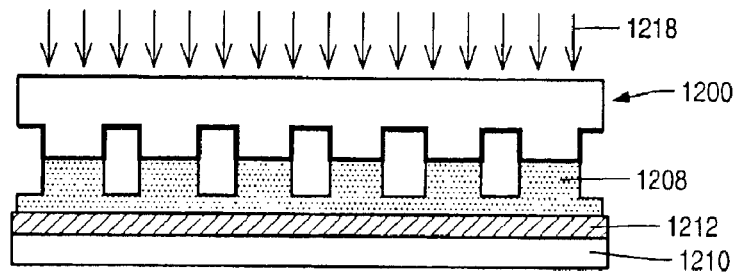
Figure 35C:
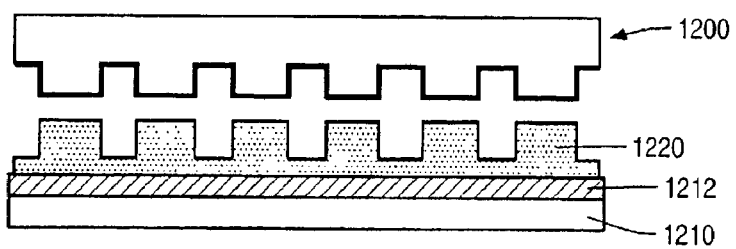
Figure 35D:

FIG. 33A depicts a template 12 embedded in a cured layer 40 after curing. After curing of the substance 40, either the template 12 or substrate 20 may be tilted to intentionally induce an angle 3604 between the template 12 and substrate 20, as depicted in FIG. 35B. A pre-calibration stage, either coupled to the template or the substrate may be used to induce a tilt between the template and the cured layer 40. The relative lateral motion between the template 12 and substrate 20 may be insignificant during the tilting motion if the tilting axis is located close to the template-substrate interface. Once angle 3604 between template 12 and substrate 20 is large enough, template 12 may be separated from the substrate 20 using only Z-axis motion (i.e., vertical motion). This peel and pull method may result in desired features 44 being left intact on a transfer layer 18 and substrate 20 without undesirable shearing.

Electrostatic Curing Process

In addition to the above-described embodiments, embodiments described herein include forming patterned structures by using electric fields. Cured layers formed using electric fields to induce a pattern in the cured layer may be used for single imprinting or step and repeat processes.

Figure 34:
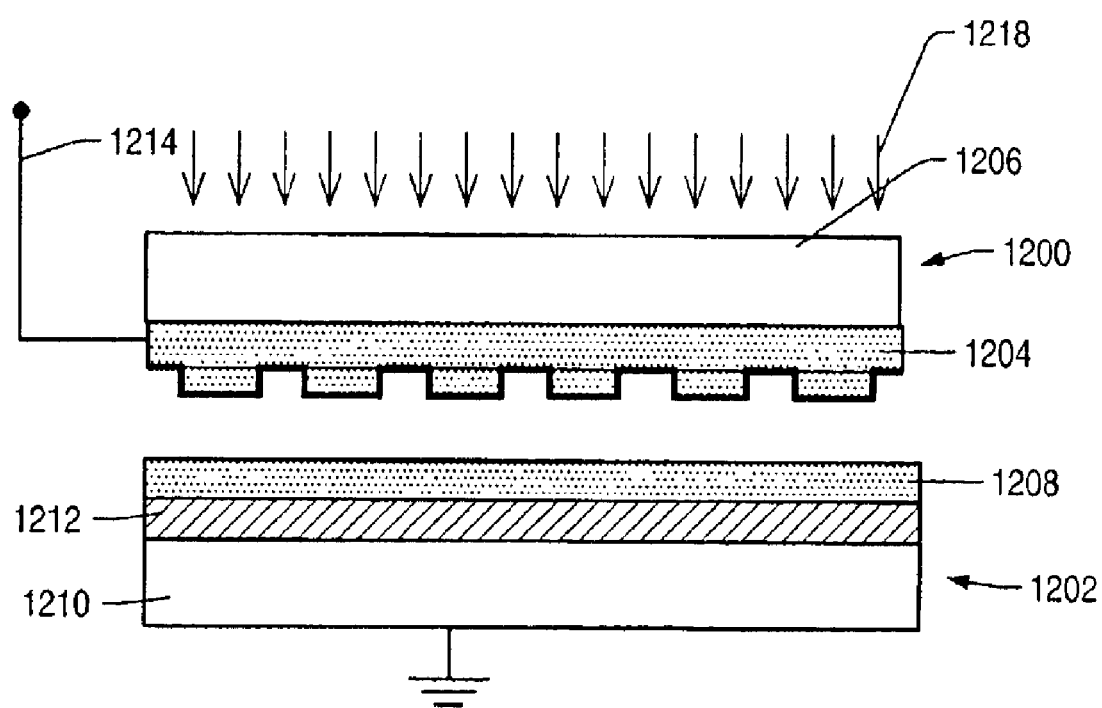
FIG. 34 depicts an embodiment of a template positioned over a substrate for electric field based lithography.

FIG. 34 depicts an embodiment of template 1200 and substrate 1202. Template 1200, in one embodiment, is formed from a material that is transparent to activating light to allow curing of the polymerizable composition by exposure to activating light. Forming template 1200 from a transparent material also allows the use of established optical techniques to measure the gap between template 1200 and substrate 1202 and to measure overlay marks to perform overlay alignment and magnification correction during formation of the structures. Template 1200 is also thermally and mechanically stable to provide nano-resolution patterning capability. Template 1200 includes an electrically conducting material and/or layer 1204 to allow electric fields to be generated at template-substrate interface.

In one embodiment, a blank of fused silica (e.g., quartz) is used as the material for base 1206 of template 1200. Indium Tin Oxide (ITO) is deposited onto base 1206. ITO is transparent to visible and UV light and is a conducting material. ITO may be patterned using highresolution electron beam lithography. A low-surface energy coating, as previously described, may be coated onto the template to improve the release characteristics between the template and the polymerized composition. Substrate 1202 may include standard wafer materials such as Si, GaAs, SiGeC and InP. A UV curable liquid and/or a thermally curable liquid may be used as polymerizable composition 1208. In an embodiment, polymerizable composition 1208 may be spin coated onto the wafer 1210. In another embodiment, a predetermined volume of polymerizable composition 1208 may be dispensed onto the substrate in a predetermined pattern, as described herein. In some embodiments, transfer layer 1212 may be placed between wafer 1210 and polymerizable composition 1208. Transfer layer 1212 material properties and thickness may be chosen to allow for the creation of high-aspect ratio structures from low-aspect ratio structures created in the cured liquid material. Connecting ITO to a voltage source 1214 may generate an electric field between template 1200 and substrate 1202.

Figure 36A:
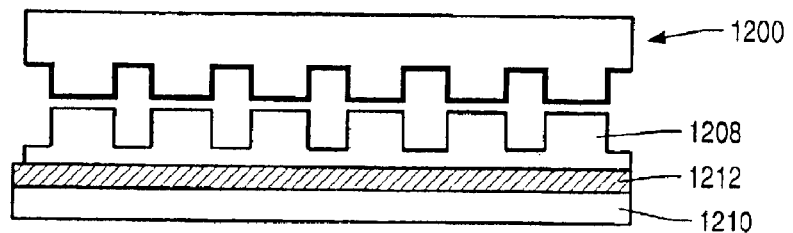
FIGS. 36A–36C depict a first embodiment of a process for forming nanoscale structures without contacting a template.
Figure 36B:
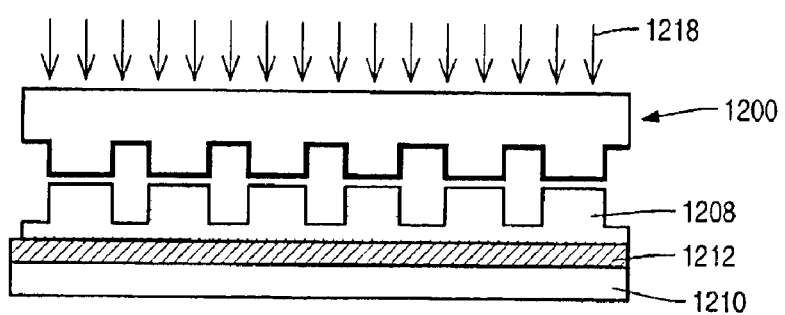
Figure 36C:

In FIGS. 35 A–D and FIGS. 36 A–C, two embodiments of the above-described process are illustrated. In each embodiment, a desired uniform gap may be maintained between the template and the substrate. An electric field of the desired magnitude may be applied resulting in the attraction of polymerizable composition 1208 towards the raised portions 1216 of template 1200. In FIGS. 35 A–D, the gap and field magnitudes are such that polymerizable composition 1208 makes direct contact and adheres to template 1200. A curing agent (e.g., activating light 1218 and/or heat) may be used to cure the liquid. Once desired structures have been formed, template 1200 may be separated from substrate 1202 by methods described herein.

In FIGS. 36 A–C, the gap and field magnitudes may be chosen such that polymerizable composition 1208 achieves a topography that is essentially the same as that of template 1200. This topography may be achieved without making direct contact with the template. A curing agent (e.g. activating light 1218) may be used to cure the liquid. In the embodiment of FIGS. 35 A–D and FIGS. 36 A–C, a subsequent etch process may be used to remove the cured material 1220. A further etch may also be used if transfer layer 1212 is present between cured material 1220 and wafer 1210 as shown in FIGS. 35 A–D and FIGS. 36 A–C.

Figure 37A:
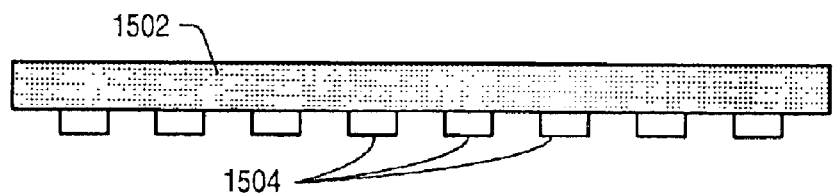
FIGS. 37A–37B depict a template that includes a continuous patterned conductive layer disposed on a nonconductive base.
Figure 37B:
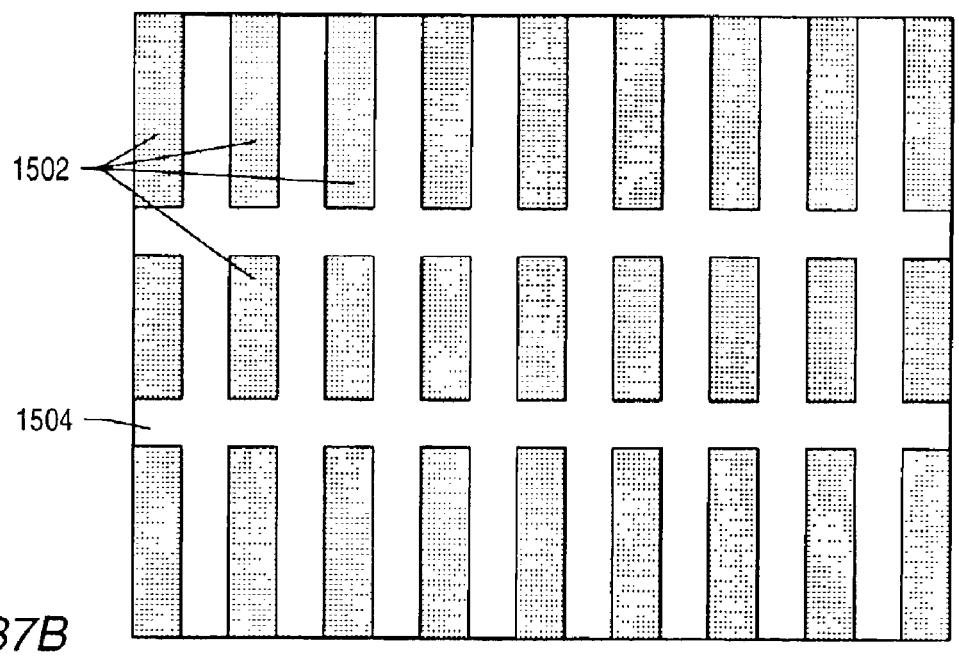

In another embodiment, FIG. 37A depicts an electrically conductive template that includes a continuous layer of electrically conductive portions 1504 coupled to a non-conductive base 1502. As shown in FIG. 37B the non-conductive portions 1502 of the template are isolated from each other by the conductive portions 1504. The template may be used to in a "positive" imprint process as described above.

In an embodiment, an "adjustable" template may be used to form a pattern on a substrate. The term "adjustable" template, in the context of this embodiment, generally refers to a template that includes electrically conductive portions that are independently controlled. Controlling a conductive portion of the template refers to turning on, turning off, and/or adjusting an electric field of the conductive portion. This concept is illustrated in FIG. 38. Template 1700 includes electrically conductive portions 1702 and non-conductive material 1704. Non-conductive material 1704 insulates conductive portions 1702 from each other. Template 1700 is substantially transparent to some or all types of activating light. In an embodiment, template 1700 is formed from materials that are thermally stable. Conductive portions 1702 may be formed from, for example, ITO. Non-conductive material 1704 may be formed from, for example, silicon dioxide. Conductive portions 1702 form a pattern complementary to a pattern to be produced on a masking layer. The pattern of conductive portions 1702 is formed in non-conducting material 1704 using methods known to those skilled in the art. Conductive portions 1702 are be electrically connected 1706 to power source 1708, either independently or together. In an embodiment where the conductive portions 1702 are independently connected to power source 1708, there may be a control device 1710 to independently adjust the electric field generated by one or more of conductive portions 1702. In an embodiment, electrical connectors 1712 run through non-conductive material 1704 from another side to connect to conductive portions 1702. In an alternate embodiment, conductive portions 1702 extend through non-conductive material 1704 such that electrical connectors 1712 are not required.

Such embodiments may create lithographic patterned structures quickly (in a time of less than about 1 second). The structures generally have sizes of tens of nanometers. In one embodiment, curing a polymerizable composition in the presence of electric fields creates a patterned layer on a substrate. The pattern is created by placing a template with specific nanometer-scale topography at a controlled distance (e.g., within nanometers) from the surface of a thin layer of the curable liquid on a substrate. If all or a portion of the desired structures are regularly repeating patterns (such as an array of dots), the pattern on the template may be considerably larger than the size of the desired repeating structures.

The replication of the pattern on the template may be achieved by applying an electric field between the template and the substrate. Because the liquid and air (or vacuum) have different dielectric constants and the electric field varies locally due to the presence of the topography of the template, an electrostatic force may be generated that attracts regions of the liquid toward the template. Surface tension or capillary pressures tend to stabilize the film. At high electric field strengths, the polymerizable composition may be made to attach to the template and dewet from the substrate at certain points. However, the attachment of the liquid film will occur provided the ratio of electrostatic forces are comparable to the capillary forces, which is measured by the dimensionless number $\Lambda$. The magnitude of the electrostatic force is approximately $\epsilon E^2 d^2$, where E is the permittivity of vacuum, E is the magnitude of the electric field, and d is the feature size. The magnitude of the capillary forces is approximately $\gamma d$, where $\gamma$ is the liquid-gas surface tension. The ratio of these two forces is $\Lambda = \epsilon E^2 d/\gamma$. In order to deform the interface and cause it to attach to the upper surface, the electric field must be such that L is approximately unity. The precise value depends on the details of the topography of the plates and the ratio of liquid-gas permittivities and heights, but this number will be O(1). Thus, the electric field is approximately given by $E \sim (\gamma/\epsilon d)^{1/2}$. This polymerizable composition may be hardened in place by polymerization of the composition. The template may be treated with a low energy self-assembled monolayer film (e.g., a fluorinated surfactant) to aid in detachment of the template the polymerized composition.

An example of the above approximations is given below. For d=100 and $\gamma$=30 mJ/m and $\epsilon$=8.85×10–12 C²/J-m, E=1.8×10⁸ V/m, which corresponds to a potential difference between the plates of modest 18 V if the plate spacing is 100 and 180 V is the plate spacing is 1000 nm. Note that the feature size $d \sim \gamma/\epsilon E^2$, which means that the size of the feature decreases with the square of the electric field. Thus, 50 nm features would require voltages on the order of 25 or 250 volts for 100 and 1000 nm plate spacings.

It may be possible to control the electric field, the design of the topography of the template and the proximity of the template to the liquid surface so as to create a pattern in the polymerizable composition that does not come into contact with the surface of the template. This technique may eliminate the need for mechanical separation of the template from the polymerized composition. This technique may also eliminate a potential source of defects in the pattern. In the absence of contact, however, the liquid may not form sharp, high-resolution structures that are as well defined as in the case of contact. This may be addressed by first creating structures in the polymerizable composition that are partially defined at a given electric field. Subsequently, the gap may be increased between the template and substrate while simultaneously increasing the magnitude of the electric field to "draw-out" the liquid to form clearly defined structures without requiring contact.

The polymerizable composition may be deposited on top of a transfer layer as previously described. Such a bi-layer process allows low aspect ratio, high-resolution structures formed using electrical fields to be followed by an etch process to yield high-aspect ratio, high-resolution structures. Such a bi-layer process may also be used to perform a "metal lift-off process" to deposit a metal on the substrate such that the metal is left behind after lift-off in the trench areas of the originally created structures. Using a low viscosity polymerizable composition, pattern formation using electric fields may be fast (e.g., less than about 1 sec.), and the structure may be rapidly cured. Avoiding temperature variations in the substrate and the polymerizable composition may also avoid undesirable pattern distortion that makes nano-resolution layer-to-layer alignment impractical. In addition, as mentioned above, it is possible to quickly form a pattern without contact with the template, thus eliminating defects associated with imprint methods that require direct contact.

In this patent, certain U.S. patents, and U.S. patent applications have been incorporated by reference. The text of such U.S. patents, and U.S. patent applications is, however, only incorporated by reference to the extent that no conflict exists between such text and the other statements and drawings set forth herein. In the event of such conflict, then any such conflicting text in such incorporated by reference U.S. patents, and U.S. patent applications is specifically not incorporated by reference in this patent.

While this invention has been described with references to various illustrative embodiments, the description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A system for forming a pattern on a substrate comprising:
   a body;
   a patterned template, wherein the patterned template is substantially transparent to an activating light;
   a motion stage coupled to the body, wherein the motion stage is configured to support a substrate, and wherein the motion stage is configured to move the substrate along a plane substantially parallel to the patterned template;
   an imprint head coupled to the body, wherein the imprint head is configured to selectively hold the patterned template proximate to the substrate, wherein the imprint head comprises a fine orientation system, wherein the fine orientation system is configured to allow motion of the patterned template with respect to the substrate to achieve a substantially parallel orientation of the patterned template with respect to the substrate;
   a force detector coupled to the imprint head, wherein the force detector is configured to determine a resistive force applied to the template;
   a liquid dispenser coupled to the body, wherein the liquid dispenser is configured to dispense an activating light curable liquid onto at least a portion of the substrate, with said resistive force resulting from contact of the template with the liquid; and
   an activating light source optically coupled to the patterned template, wherein the activating light source is configured to direct the activating light through the patterned template.

2. The system of claim 1, wherein the fine orientation system is configured to allow motion of the patterned template to a substantially parallel orientation with respect to the substrate when the template contacts a liquid disposed on the substrate.

3. The system of claim 1, wherein the fine orientation system comprises one or more passive compliant members.

4. The system of claim 1, wherein the fine orientation system comprises: a first flexure member, wherein the first flexure member is configured to pivot about a first orientation axis; a second flexure member coupled to the first flexure member, wherein the second flexure member is configured to pivot about a second orientation axis; and a support coupled to the second flexure member, wherein the support is configured to hold the patterned template; wherein the second flexure member is coupled to the first flexure member such that the patterned template, when disposed in the support, moves about a pivot point intersected by the first and second orientation axes.

5. The system of claim 4, wherein the first flexure member comprises first and second arms, wherein the first arm comprises a first set of flexure joints which are configured to provide pivotal motion of the first flexure member about the first orientation axis, and wherein the second arm comprises a second set of flexure joints which are configured to provide pivotal motion of the first flexure member about the first orientation axis, and wherein the second flexure member comprises third and fourth arms, wherein the third arm comprises a third set of flexure joints which are configured to provide pivotal motion of the second flexure member about the second orientation axis, and wherein the fourth arm comprises a fourth set of flexure joints which are configured to provide pivotal motion of the second flexure member about the second orientation axis.

6. The system of claim 4, wherein the first flexure member comprises a first opening, the second flexure member comprises a second opening, and the support comprises a third opening, wherein each of the first, second and third openings are configured to allow the activating light to be directed onto the template, wherein the first, second and third openings are substantially aligned when the first flexure member is coupled to the second flexure member.

7. The system of claim 4, further comprising a precalibration stage coupled to the fine orientation system, wherein the precalibration stage is configured to move the fine orientation system toward and away from the substrate.

8. The system of claim 1, further comprising a support structure coupled to the imprint head and to the motion stage, wherein the support structure comprises a material having a linear thermal expansion coefficient of less than about 20 ppm/° C. at about 25° C.

9. The system of claim 1, further comprising a support structure coupled to the imprint head and to the motion stage, wherein the support structure comprises a material having a linear thermal expansion coefficient of less than about 10 ppm/° C. at about 25° C.

10. The system of claim 1, further comprising a support structure coupled to the imprint head and to the motion stage, wherein the support structure comprises a material having a linear thermal expansion coefficient of less than about 1 ppm/° C. at about 25° C.

11. The system of claim 1, wherein the motion stage comprises an air-bearing stage.

12. The system of claim 1, further comprising an encoder system coupled to the motion stage, wherein the linear encoder system is configured to determine the displacement of the motion stage with respect to a reference point on the body.

13. The system of claim 12, wherein the encoder system comprises a glass scale linear encoder system.

14. The system of claim 1, further comprising an encoder system coupled to the motion stage, wherein the linear encoder system is configured to determine the displacement of the motion stage toward the template with respect to a reference point on the body.

15. The system of claim 1, further comprising an enclosure around at least the imprint head and the motion stage, and a temperature control system, wherein the temperature control system is configured to inhibit temperature variation of greater than about 1° C. within the enclosure.

16. The system of claim 1, further comprising an enclosure around at least the imprint head and the motion stage, and a temperature control system, wherein the temperature control system is configured to inhibit temperature variations of greater than about 0.1° C. within the enclosure.

17. The system of claim 1, wherein at least a portion of the first surface of the patterned template comprises a surface treatment layer.

18. The system of claim 1, wherein the patterned template further comprises a surface treatment layer on at least a portion of the first surface, and wherein the surface treatment layer comprises a reaction product of an alkylsilane, a fluoroalkylsilane or a fluoroalkyltrichlorosilane with water.

19. The system of claim 1, wherein the patterned template further comprises a surface treatment layer on at least a portion of the first surface, and wherein the surface treatment layer comprises a reaction product of tridecafluoro-1,1,2,2-tetrahydrooctyl trichlorosilane with water.

20. The system of claim 1, wherein the patterned template further comprises a surface treatment layer on at least a portion of the lower surface, and wherein the surface treatment layer reduces the surface free energy of the lower surface measured at 25° C. to less than about 40 dynes/cm.

21. The system of claim 1, wherein at least a portion of the template comprises silicon, silicon dioxide, silicon germanium carbon, gallium nitride, silicon germanium, sapphire, gallium arsenide, epitaxial silicon, poly-silicon, gate oxide, quartz, indium tin oxide, an oxide of silicon or a combination thereof.

22. The system of claim 1, wherein the liquid dispenser is coupled to the imprint head.

23. The system of claim 1, further comprising an air gauge coupled to the imprint head, wherein the air gauge is configured to determine a distance between the substrate and the template.

24. The system of claim 1, further comprising an air gauge coupled to the motion stage, wherein the air gauge is configured to determine a distance between the substrate and the template.

25. The system of claim 1, wherein the imprint head is configured to move the template toward the substrate.

26. The system of claim 1, wherein the imprint head is configured to move the patterned template toward the substrate.

27. The system of claim 1, wherein the motion stage is configured to move the substrate toward the patterned template.

28. The system of claim 1, wherein the motion stage is positioned below the imprint head.

29. The system of claim 1, wherein the motion stage is positioned above the imprint head.

30. The system of claim 1, wherein the activating light source is positioned with respect to the body such that the activating light source is thermally insulated from the body.

31. A system for forming a pattern on a substrate comprising:
 a body;
 a patterned template, wherein the patterned template is substantially transparent to an activating light, and wherein the patterned template comprises a first surface and a plurality of recesses formed in a patterning area of the template extending from the first surface toward a second surface of the template, where the recesses define a plurality of features in the first surface of the patterned template, and wherein the patterned template comprises a border formed about the perimeter of the patterning area, wherein a depth of the border is greater than a depth of the recesses;
 a motion stage coupled to the body, wherein the motion stage is configured to support a substrate, and wherein the motion stage is configured to move the substrate along a plane substantially parallel to the patterned template, and wherein the motion stage comprises a fine orientation system, wherein the fine orientation system is configured to allow motion of the substrate with respect to the patterned template to achieve a substantially parallel orientation of the substrate with respect to the patterned template;
 an imprint head coupled to the body, wherein the imprint head is configured to selectively position the patterned template proximate to the substrate;
 a force detector coupled to the motion stage, wherein the force detector is configured to determine a resistive force applied to the substrate;
 a liquid dispenser coupled to the body, wherein the liquid dispenser is configured to dispense an activating light curable liquid onto at least a portion of the substrate, with the resistive force being generated by contact of the template with the liquid; and
 an activating light source optically coupled to the patterned template, wherein the activating light source is configured to direct the activating light through the patterned template.

32. The system of claim 31, further comprising a support structure coupled to the imprint head and to the motion stage, wherein the support structure comprises a material having a linear thermal expansion coefficient of less than about 20 ppm/° C. at about 25° C.

33. The system of claim 31, further comprising an enclosure around at least the imprint head and the motion stage, and a temperature control system, wherein the temperature control system as configured to inhibit temperature variations of greater than about 1° C. within the enclosure.

34. The system of claim 31, wherein at least a portion of the first surface of the patterned template comprises a surface treatment layer.

35. A system for forming a pattern on a substrate comprising:
 a body;
 a patterned template, wherein the patterned template is substantially transparent to an activating light, and wherein the patterned template comprises a first surface and a plurality of recesses formed in a patterning area of the template extending from the first surface toward a second surface of the template, where the recesses define a plurality of features in the first surface of the patterned template, and wherein the patterned template comprises a border formed about the perimeter of the patterning area, wherein a depth of the border is greater than a depth of the recesses;
 an imprint head, wherein the imprint head is configured to hold the patterned template;
 a motion stage coupled to the body, wherein the motion stage is configured to support the imprint head, and wherein the motion stage is configured to move the imprint head along a plane substantially parallel to the substrate, wherein the imprint head comprises a fine orientation system, wherein the fine orientation system is configured to allow motion of the patterned template with respect to the substrate to achieve a substantially parallel orientation of the patterned template with respect to the substrate;
 a substrate support coupled to the body, wherein the substrate support is configured to selectively position the substrate proximate to the patterned template,
 a liquid dispenser coupled to the motion stage, wherein the liquid dispenser is configured to dispense an activating light curable liquid onto at least a portion of the substrate; and
 an activating light source optically coupled to the patterned template, wherein the activating light source is configured to direct the activating light through the patterned template.

36. The system of claim 33, further comprising a support structure coupled to the imprint head and to the motion stage, wherein the support structure comprises a material having a linear thermal expansion coefficient of less than about 20 ppm/° C. at about 25° C.

37. The system of claim 35, further comprising an enclosure around at least the imprint head and the motion stage, and a temperature control system, wherein the temperature control system is configure to inhibit temperature variations of greater than about 1° C. within the enclosure.

38. The system of claim 35, wherein at least a portion of the first surface of the patterned template comprises a surface treatment layer.

39. A system for forming a pattern on a substrate comprising:
- a body;
- a patterned template, wherein the patterned template is substantially transparent to an activating light, and wherein the patterned template comprises a first surface and a plurality of recesses formed in a patterning area of the template extending from the first surface toward a second surface of the template, where the recesses define a plurality of features in the first surface of the patterned template, and wherein the patterned template comprises a border formed about the perimeter of the patterning area, wherein a depth of the border is greater than a depth of the recesses;
- an imprint head, wherein the imprint head is configured to hold the patterned template;
- a motion stage coupled to the body, wherein the motion stage is configured to support the imprint head, and wherein the motion stage is configured to move the imprint head along a plane substantially parallel to the substrate;
- a substrate support coupled to the body, wherein the substrate support is configured to selectively position the substrate proximate to the patterned template, and wherein the substrate support comprises a fine orientation system, wherein the fine orientation system is configured to allow motion of the substrate with respect to the patterned template to achieve a substantially parallel orientation of the substrate with respect to the patterned template
- a liquid dispenser coupled to the motion stage, wherein the liquid dispenser is configured to dispense an activating light curable liquid onto at least a portion of the substrate; and
- an activating light source optically coupled to the patterned template, wherein the activating light source is configured to direct the activating light through the patterned template.

40. The system of claim 39, further comprising a support structure coupled to the imprint head and to the motion stage, wherein the support structure comprises a material having a linear thermal expansion coefficient of less than about 20 ppm ° C. at about 25° C.

41. The system of claim 39, further comprising an enclosure around at least the imprint head and the motion stage, and a temperature control system, wherein the temperature control system is configured to inhibit temperature variations of greater than about 1° C. within the enclosure.

42. The system of claim 39, wherein at least a portion of the first surface of the patterned template comprises a surface treatment layer.

43. A system for forming a pattern on a substrate comprising:
- a body;
- a patterned template, wherein the patterned template is substantially transparent to an activating light;
- a motion stage coupled to the body, wherein the motion stage is configured to support a substrate, and wherein the motion stage is configured to move the substrate along a plane substantially parallel to the patterned template, wherein the motion stage comprises:
  - a substrate chuck configured to support the substrate; and
  - a substrate tilt module coupled to the substrate chuck, wherein the substrate tilt module is configured to alter a tilt of the substrate when the substrate is coupled to the substrate chuck, and wherein the substrate chuck and substrate tilt module have a stiffness sufficient to inhibit the tilt of the substrate when the template applies a force to a liquid disposed on the substrate;
- an imprint head coupled to the body, wherein the imprint head is configured to selectively position the patterned template proximate to the substrate, wherein the imprint head comprises a fine orientation system, wherein the fine orientation system is configured to allow motion of the patterned template with respect to the substrate to achieve a substantially parallel orientation of the patterned template with respect to the substrate;
- a force detector coupled to the imprint head, wherein the force detector is configured to determine a resistive force applied to the template;
- a liquid dispenser coupled to the body, wherein the liquid dispenser is configured to dispense an activating light curable liquid onto at least a portion of the substrate, with the resistive force being generated by contact of the template with the liquid; and
- an activating light source optically coupled to the patterned template, wherein the activating light source is configured to direct the activating light through the patterned template.

44. The system of claim 43 wherein the substrate tilt module has a stiffness sufficient to inhibit tilt of the substrate when the template applies a force of between about 1 lb. to about 10 lbs. to a liquid disposed on the substrate.

45. The system of claim 43, wherein the substrate tilt module has a stiffness sufficient to allow inhibit tilt of the substrate when the template applies a force to a liquid disposed on the substrate, wherein the tilt of the substrate is less than about 5 micro radians when the template applies a force of between about 1 lb. to about 10 lb.

46. The system of claim 43, further comprising an air gauge coupled to the imprint head, where the air gauge is configured to determine the tilt of the substrate when the substrate is coupled to the motion stage.

47. The system of claim 43, further comprising a support structure coupled to the imprint head and to the motion stage, wherein the support structure comprises a material having a linear thermal expansion coefficient of less than about 20 ppm/° C. at about 25° C.

48. The system of claim 43, further comprising an enclosure around at least the imprint head and the motion stage, and a temperature control system, wherein the temperature control system is configure to inhibit temperature variations of greater than about 1° C. within the enclosure during use.

49. The system of claim 43, wherein at least a portion of the first surface of the patterned template comprises a surface treatment layer.

50. A system for forming a pattern on a substrate comprising:
- a body;
- a patterned template, wherein the patterned template is substantially transparent to an activating light;
- a motion stage coupled to the body, wherein the motion stage is configured to support a substrate, and wherein the motion stage is configured to move the substrate along a plane substantially parallel to the patterned template, and wherein the motion stage comprises:

a substrate chuck configured to support the substrate; and a substrate tilt module coupled to the substrate chuck, wherein the substrate tilt module is configured to alter a tilt of the substrate when the substrate is coupled to the substrate chuck, and wherein the substrate tilt module is configured to allow motion of the substrate with respect to the template to achieve a substantially parallel orientation of the substrate with respect to the patterned template, and wherein the substrate chuck and substrate tilt module have a stiffness sufficient to inhibit the tilt of the substrate when the template applies a force to a liquid disposed on the substrate;

an imprint head coupled to the body, wherein the imprint head is configured to selectively position the patterned template proximate to the substrate;

a force detector coupled to the imprint head, wherein the force detector is configured to determine a resistive force applied to the template;

a liquid dispenser coupled to the body, wherein the liquid dispenser is configured to dispense an activating light curable liquid onto at least a portion of the substrate, with the resistive force being generated by contact of the template with the liquid; and an activating light source optically coupled to the patterned template, wherein the activating light source is configured to direct the activating light through the patterned template.

51. The system of claim 50, further comprising a support structure coupled to the imprint head and to the motion stage, wherein the support structure comprises a material having a linear thermal expansion coefficient of less than about 20 ppm/° C. at about 25° C.

52. The system of claim 50, further comprising an enclosure around at least the imprint head and the motion stage, and a temperature control system, wherein the temperature control system is configured to inhibit temperature variations of greater than about 1° C. within the enclosure.

53. The system of claim 50, wherein at least a portion of the first surface of the patterned template comprises a surface treatment layer.

54. A system for forming a pattern on a substrate comprising:

a body;

a patterned template, wherein the patterned template is substantially transparent to an activating light;

an imprint head, wherein the imprint head is configured to hold the patterned template;

a motion stage coupled to the body, wherein the motion stage is configured to support the imprint head, and wherein the motion stage is configured to move the imprint head along a plane substantially parallel to the substrate, wherein the imprint head comprises a fine orientation system, wherein the fine orientation system is configured to allow motion of the patterned template with respect to the substrate to achieve a substantially parallel orientation of the patterned template with respect to the substrate;

a substrate support coupled to the body, wherein the substrate support is configured to selectively position the substrate proximate to the patterned template, and a substrate chuck configured to support the substrate; and wherein the substrate support comprises:

a substrate chuck, and a substrate tilt module coupled to the substrate chuck, wherein the substrate tilt module is configured to alter a tilt of the substrate when the substrate is coupled to the substrate chuck, and wherein the substrate chuck and substrate tilt module have a stiffness sufficient to inhibit the tilt of the substrate when the template applies a force to a liquid disposed on the substrate;

a liquid dispenser coupled to the motion stage, wherein the liquid, dispenser is configured to dispense an activating light curable liquid onto at least a portion of the substrate; and an activating light source optically coupled to the patterned template, wherein the activating light source is configured to direct the activating light through the patterned template.

55. The system of claim 54, further comprising a support structure coupled to the imprint head and to the motion stage, wherein the support structure comprises a material, having a linear thermal expansion coefficient of less than about 20 ppm/° C. at about 25° C.

56. The system of claim 54, further comprising an enclosure around at least the imprint head and the motion stage, and a temperature control system, wherein the temperature control system is configure to inhibit temperature variations of greater than about 1° C. within the enclosure.

57. The system of claim 54, wherein at least a portion of the first surface of the patterned template comprises a surface treatment layer.

58. A system for forming a pattern on a substrate comprising:

a body;

a patterned template, wherein the patterned template is substantially transparent to an activating light;

an imprint head, wherein the imprint head is configured to hold the patterned template;

a motion stage coupled to the body, wherein the motion stage is configured to support the imprint head, and wherein the motion stage is configured to move the imprint head along a plane substantially parallel to the substrate;

a substrate support coupled to the body, wherein the substrate support is configured to selectively position the substrate proximate to the patterned template, and a substrate chuck configured to support the substrate; and wherein the substrate support comprises:

a substrate chuck, and a substrate tilt module coupled to the substrate chuck, wherein the substrate tilt module is configured to alter a tilt of the substrate when the substrate is coupled to the substrate chuck, and wherein the substrate chuck and substrate tilt module have a stiffness sufficient to inhibit the tilt of the substrate when the template applies a force to a liquid disposed on the substrate;

a liquid dispenser coupled to the motion stage, wherein the liquid dispenser is configured to dispense an activating light curable liquid onto at least a portion of the substrate; and an activating light source optically coupled to the patterned template, wherein the activating light source is configured to direct the activating light through the patterned template.

59. The system of claim 58, further comprising a support structure coupled to the imprint head and to the motion stage, wherein the support structure comprises a material having a linear thermal expansion coefficient of less than about 20 ppm/° C. at about 25° C.

60. The system of claim 58, further comprising an enclosure around at least the imprint head and the motion stage, and a temperature control system, wherein the the temperature control system is configure to inhibit temperature variations of greater than about 1° C. within the enclosure.

61. The system of claim 58, wherein at least a portion of the first surface of the patterned template comprises a surface treatment layer.

62. A system for forming a pattern on a substrate, said system comprising:
   a body, with said substrate supported on said body;
   a template having a patterning area facing said substrate;
   a dispenser coupled to said body to dispense an activating light curable liquid onto said substrate; and
   a displacement system coupled to said body and said template to vary a distance between said template and said substrate and cause said liquid to concurrently contact said substrate and said template while inhibiting a quantity of said liquid to extend to areas outside of said patterning area.

63. The system as recited in claim 62 further including a light source to impinge actinic radiation upon said liquid.

64. The system as recited in claim 62 wherein said displacement system further includes a motion stage, disposed upon the body, to support the substrate and to provide relative movement between the substrate and the template along first and second transverse axes and an imprint head, to which the template is attached, to provide relative movement between the template and the substrate along a third axis that extends transversely to the first and second axes.

65. The system of claim 62 further including a fine orientation system connected to the template to allow pivotal movement of the template with respect to the substrate to maintain a substantially parallel orientation with respect to the substrate in response to a contact force.

66. The system as recited in claim 62 wherein said displacement system further includes a fine orientation system to allow motion of said substrate with respect to the template in response to a contact force.

67. The system as recited in claim 62 wherein said displacement system further includes a substrate chuck, disposed upon said body, to support the substrate and a substrate tilt module coupled to the substrate chuck, and a fine orientation system connected to the tilt module to allow the tilt module to vary the tilt of the substrate and maintain a substantially parallel orientation of the substrate and the template in response to a contact force.

68. The system of claim 62 wherein the template further includes first and second opposed sides with the patterning region and a first surface disposed on the first side, the patterning region including a pattern surface and a recess extending from the pattern surface toward the second side, ending in a terminus, with the first surface being spaced-apart from the second side a first distance, the terminus being spaced apart from the second side a second distance and the pattern surface being spaced-apart from the second side a third distance, with the first distance differing from both the second and third distances.

69. The system of claim 62 wherein said displacement system further includes a fine orientation system having a first flexure member, wherein the first flexure member is configured to pivot about a first orientation axis and a second flexure member coupled to the first flexure member, wherein the second flexure member is configured to pivot about a second orientation axis a support coupled to the second flexure member, with said template being coupled to said support.

70. The system of claim 62 wherein said displacement system further includes a precalibration stage coupled to the fine orientation system, wherein the precalibration stage.

71. The system of claim 62 further comprising an enclosure and a temperature control system, with said enclosure enclosing a region with said template and said substrate disposed in said region, surrounding around at least the imprint head and the body, and said temperature control system being configured to minimize temperature variations in said region.

72. The system of claim 62 further comprising an enclosure and a temperature control system, with said enclosure enclosing a region with said template and said substrate disposed in said region, surrounding around at least the imprint head and the body, and said temperature control system being configured to minimize temperature variations in said region of greater than about 1° C.

73. The system of claim 62 further comprising an air gauge coupled to said displacement system to determine a distance between said substrate and said patterning region.

74. The system as recited in claim 62 wherein said patterning area has a substantially smooth profile.

75. The system as recited in claim 62 wherein said patterning area includes a plurality of features.

76. The system as recited in claim 62 wherein said body comprises a material having a linear thermal expansion coefficient of less than about 20 ppm/° C.

77. The system as recited in claim 62 wherein said displacement system further includes an air-bearing stage to support said substrate.

78. The system as recited in claim 62 further including a linear encoder system coupled to the displacement system, with the linear encoder system configured to determine a displacement of said substrate with respect to a reference point on said body.

79. The system as recited in claim 78 wherein said encoder system comprises a glass scale linear encoder system.

80. The system as recited in claim 62 wherein said patterning area includes a surface treatment layer.

81. The system as recited in claim 62 wherein said patterning area includes a surface treatment layer comprising a reaction product of an alkylsilane, a fluoroalkylsilane, or a fluoroalkyltrichlorosilane with water.

82. The system as recited in claim 62 wherein said patterning area includes a surface treatment layer comprising a reaction product of tridecafluoro-1,1,2,2-tetrahydrooctyl trichlorosilane with water.

83. The system as recited in claim 62 wherein said pattering area includes a surface treatment layer providing said patterning region with a surface free energy measured at 25° C. to less than about 40 dynes/cm.

84. The system as recited in claim 1 said template is formed from a material selected from a set of materials consisting essentially of silicon, silicon dioxide, silicon germanium carbon, gallium nitride, silicon germanium, sapphire, gallium arsenide, epitaxial silicon, poly-silicon, gate oxide, quartz, indium tin oxide, and an oxide of silicon.

* * * * *

UNITED STATES PATENT AND TRADEMARK OFFICE
CERTIFICATE OF CORRECTION

PATENT NO.   : 6,900,881 B2
DATED        : May 31, 2005
INVENTOR(S)  : Sreenivasan et al.

It is certified that error appears in the above-identified patent and that said Letters Patent is hereby corrected as shown below:

Title page,
Item [74], *Attorney, Agent, or Firm*, delete paragraph [74], and replace with -- [74] *Attorney, Agent, or Firm,* Kenneth C. Brooks --

Column 6,
Line 14, delete "Voison" and replace with -- Voisin --

Column 17,
Line 65, delete "Voison" and replace with -- Voisin --

Column 18,
Line 12, delete "arsinide" and replace with -- arsenide --

Column 19,
Line 61, delete "hi" and replace with -- $h_1$ --

Column 20,
Line 11, delete "hi" and replace with -- $h_1$ --

Column 22,
Line 64, delete "pressure" and replace with -- pressures --

Column 29,
Line 12, delete "microms" and replace with -- microns --

Column 30,
Line 2, add a closing parenthesis after the first "substrate"

Column 34,
Line 16, delete "highresolution" and replace with -- high-resolution --

Column 35,
Line 60, delete "E is permittivity" and replace with -- $\varepsilon$ is permittivity --
Line 66, delete "such that L is" and replace with -- such that $\Lambda$ is --

Column 41,
Line 2, delete "configure" and replace with -- configured --

Column 42,
Line 38, delete "allow"

UNITED STATES PATENT AND TRADEMARK OFFICE
CERTIFICATE OF CORRECTION

PATENT NO. : 6,900,881 B2
DATED : May 31, 2005
INVENTOR(S) : Sreenivasan et al.

It is certified that error appears in the above-identified patent and that said Letters Patent is hereby corrected as shown below:

Column 44,
Line 23, delete "configure" and replace with -- configured --

Column 46,
Line 3, delete "axis a support" and replace with -- axis and a support --
Line 56, delete "pattering" and replace with -- patterning --

Signed and Sealed this

Nineteenth Day of July, 2005

JON W. DUDAS
*Director of the United States Patent and Trademark Office*